US012640837B2

(12) United States Patent
Liu et al.

(10) Patent No.: US 12,640,837 B2
(45) Date of Patent: May 26, 2026

(54) MULTIPLE COMPOSITION DISTRIBUTION MATCHING BASED ON ARITHMETIC CODING AND GEOMETRY-SPECIFIC PARAMETERS

(71) Applicant: QUALCOMM Incorporated, San Diego, CA (US)

(72) Inventors: Wei Liu, Beijing (CN); Thomas Joseph Richardson, South Orange, NJ (US); Liangming Wu, Beijing (CN); Changlong Xu, Beijing (CN); Ori Shental, Marlboro, NJ (US); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 308 days.

(21) Appl. No.: 18/684,216

(22) PCT Filed: Mar. 2, 2022

(86) PCT No.: PCT/CN2022/078770
§ 371 (c)(1),
(2) Date: Feb. 16, 2024

(87) PCT Pub. No.: WO2023/065585
PCT Pub. Date: Apr. 27, 2023

(65) Prior Publication Data
US 2024/0250773 A1      Jul. 25, 2024

(30) Foreign Application Priority Data

Oct. 21, 2021    (WO) ................ PCT/CN2021/125207

(51) Int. Cl.
*H04L 1/00*      (2006.01)
*H03M 7/40*      (2006.01)

(52) U.S. Cl.
CPC ............ *H04L 1/0033* (2013.01); *H03M 7/40* (2013.01)

(58) Field of Classification Search
CPC ... H04L 1/0033; H04L 1/0035; H04L 1/0034; H04L 1/0039; H04L 1/007; H04L 1/0086; H03M 7/40; H03M 7/4006; H03M 7/3079
See application file for complete search history.

(56) References Cited

U.S. PATENT DOCUMENTS

| | | | |
|---|---|---|---|
| 11,695,523 B2 * | 7/2023 | Yoshida | ............ H04L 25/03866 370/329 |
| 2019/0149388 A1 * | 5/2019 | Torbatian | ........... H04B 10/0779 375/298 |

(Continued)

FOREIGN PATENT DOCUMENTS

| | | | | |
|---|---|---|---|---|
| CN | 109474346 A | * | 3/2019 | ............ H04B 10/50 |
| CN | 111628789 A | | 9/2020 | |

(Continued)

OTHER PUBLICATIONS

Marcin P., et al., "Arithmetic Coding Based Multi-Composition Codes for Bit-Level Distribution Matching", IEEE, Wireless Communications and Networking Conference (WCNC), Apr. 15, 2019, pp. 1-6, XP033651977, 6 Pages, Sections I, III.-V, Abstract, Figures 1,3. (Year: 2019).*

(Continued)

*Primary Examiner* — Ayaz R Sheikh
*Assistant Examiner* — Louis Samara
(74) *Attorney, Agent, or Firm* — QUALCOMM Incorporated

(57) ABSTRACT

Various aspects of the present disclosure generally relate to wireless communication. In some aspects, a transmitting node may determine a set of geometry-specific parameters based at least in part on a symbol sequence length n and a (Continued)

300 ➝ target distribution. The transmitting node may determine a sequence of K bits based at least in part on a plurality of information bits and a bit sequence length K. The transmitting node may map, based at least in part on a composition selected from a plurality of compositions, the sequence of K bits to a sequence of n symbols using arithmetic coding based at least in part on the set of geometry-specific parameters. The transmitting node may transmit the sequence of n symbols to a receiving node. Numerous other aspects are described.

30 Claims, 21 Drawing Sheets

(56) References Cited

U.S. PATENT DOCUMENTS

| | | | | |
|---|---|---|---|---|
| 2020/0162193 | A1* | 5/2020 | Handte | H04W 52/54 |
| 2021/0281450 | A1* | 9/2021 | Binkai | H04L 25/4917 |
| 2021/0336704 | A1* | 10/2021 | Qu | H04B 10/5561 |
| 2022/0006532 | A1* | 1/2022 | Elzanaty | H04B 10/503 |
| 2024/0137253 | A1* | 4/2024 | Wu | H04L 27/0012 |

FOREIGN PATENT DOCUMENTS

| | | | | | |
|---|---|---|---|---|---|
| CN | 111670543 | A | | 9/2020 | |
| CN | 113497936 | A | | 10/2021 | |
| CN | 111670543 | B | * | 10/2023 | H03M 7/6041 |
| WO | WO-2019197043 | A1 | * | 10/2019 | H03M 7/3068 |
| WO | WO-2021105548 | A1 | * | 6/2021 | H04L 1/0057 |
| WO | WO-2023065202 | A1 | * | 4/2023 | H03M 7/40 |

OTHER PUBLICATIONS

Pikus M., et al., "Bit-Level 1-15 Probabilistically Shaped Coded Modulation", IEEE Communications Letters, vol. 21, No. 9, XP055528044, Sep. 1, 2017, US, ISSN: 1089-7798, pp. 1929-1932. (Year: 2017).*

Yoshida Tsuyoshi, "Hierarchical Distribution Matching for Probabilistic Shaped Coded Modulation", IEEE, Dec. 26, 2018 (Year: 2018).*

R. Böhnke, O. İşcan and W. Xu, "Multi-Level Distribution Matching," in IEEE Communications Letters, vol. 24, No. 9, pp. 2015-2019, Sep. 2020, doi: 10.1109/LCOMM.2020.2993929. (Year: 2020).*

Marcin Pikus, "Finite-Precision Implementation of Arithmetic Coding Based Distribution Matchers", Huawei Technologies Duesseldorf GmbH, Munich Research Center, Jul. 28, 2019 (Year: 2019).*

International Search Report and Written Opinion—PCT/CN2022/078770—ISA/EPO—Jun. 28, 2022.

International Search Report and Written Opinion—PCT/CN2021/125207—ISA/EPO—Jun. 23, 2022.

Pikus M., et al., "Arithmetic Coding Based Multi-Composition Codes for Bit-Level Distribution Matching", 2019 IEEE Wireless Communications and Networking Conference (WCNC), Apr. 18, 2019 (Apr. 18, 2019), 6 Pages, The Whole Document.

Huawei et al., "Signal Shaping for QAM Constellations", R1-1705061, 3GPP TSG RAN WG1 Meeting # 88bis, 3rd Generation Partnership Project, Mobile Competence Centre, 650, Route Des Lucioles, F-06921 Sophia-antipolis Cedex, France , vol. RAN WG1, No. Spokane, USA, Apr. 3-7, 2017, 11 Pages.

Marcin P., et al., "Arithmetic Coding Based Multi-Composition Codes for Bit-Level Distribution Matching", IEEE, Wireless Communcations and Networking Conference (WCNC), Apr. 15, 2019, pp. 1-6, XP033651977, 6 Pages, Sections 1, III.-V, Abstract, Figures 1,3.

Pikus M., et al., "Bit-Level 1-15 Probabilistically Shaped Coded Modulation", IEEE Communications Letters, vol. 21, No. 9, XP055528044, Sep. 1, 2017, US, ISSN: 1089-7798, pp. 1929-1932.

Supplementary European Search Report—EP22882210—Search Authority—The Hague—Jul. 14, 2025.

* cited by examiner

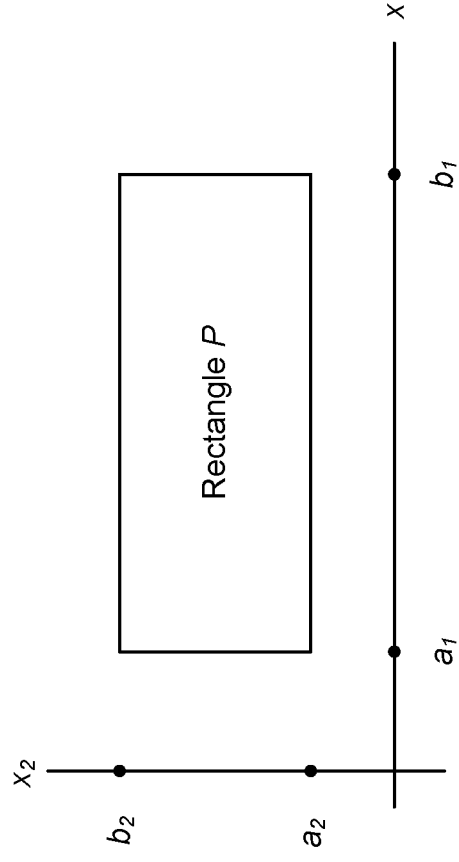
400
FIG. 4

Fixed-to-Fixed Distribution Matching Using Generalized Rectanges

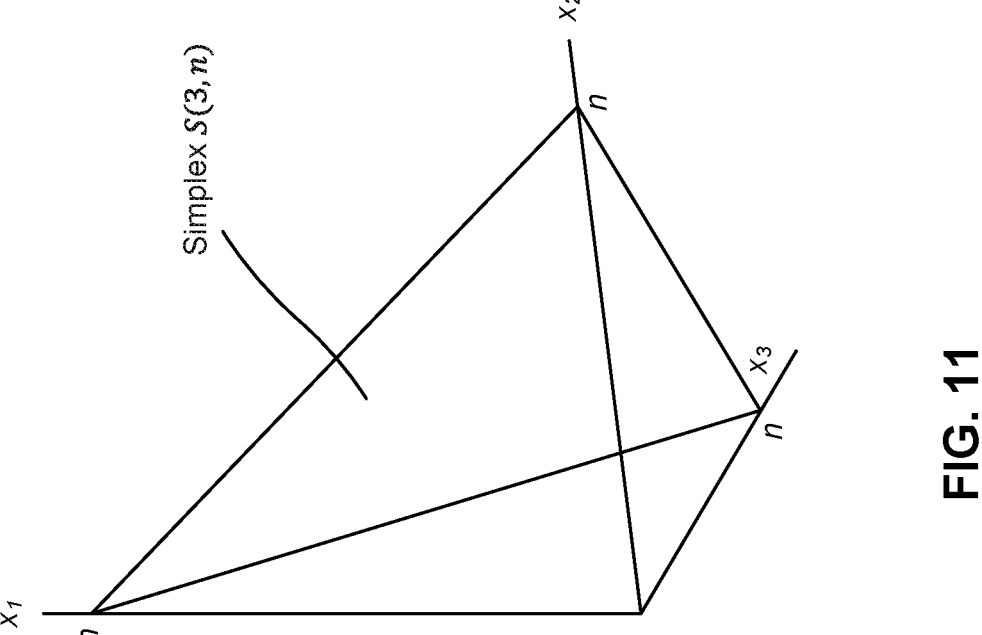
FIG. 11

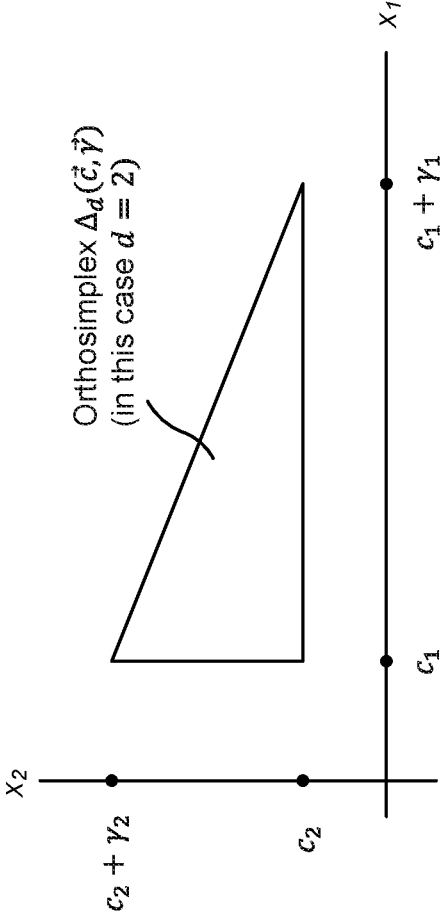
FIG. 12
1200

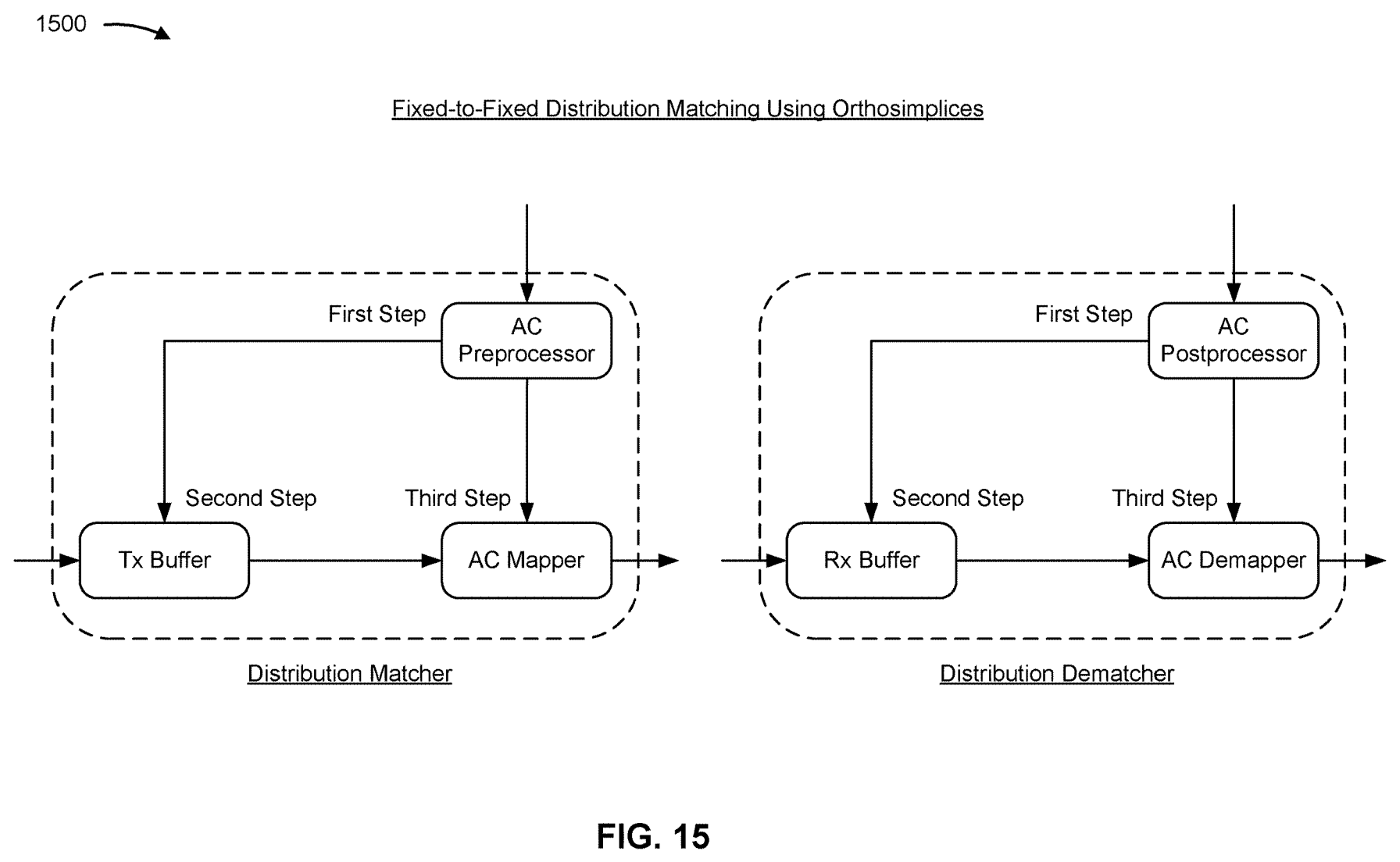

1500

Fixed-to-Fixed Distribution Matching Using Orthosimplices

First Step

AC Preprocessor

Second Step

Third Step

Tx Buffer

AC Mapper

Distribution Matcher

First Step

AC Postprocessor

Second Step

Third Step

Rx Buffer

AC Demapper

Distribution Dematcher

FIG. 15

1600
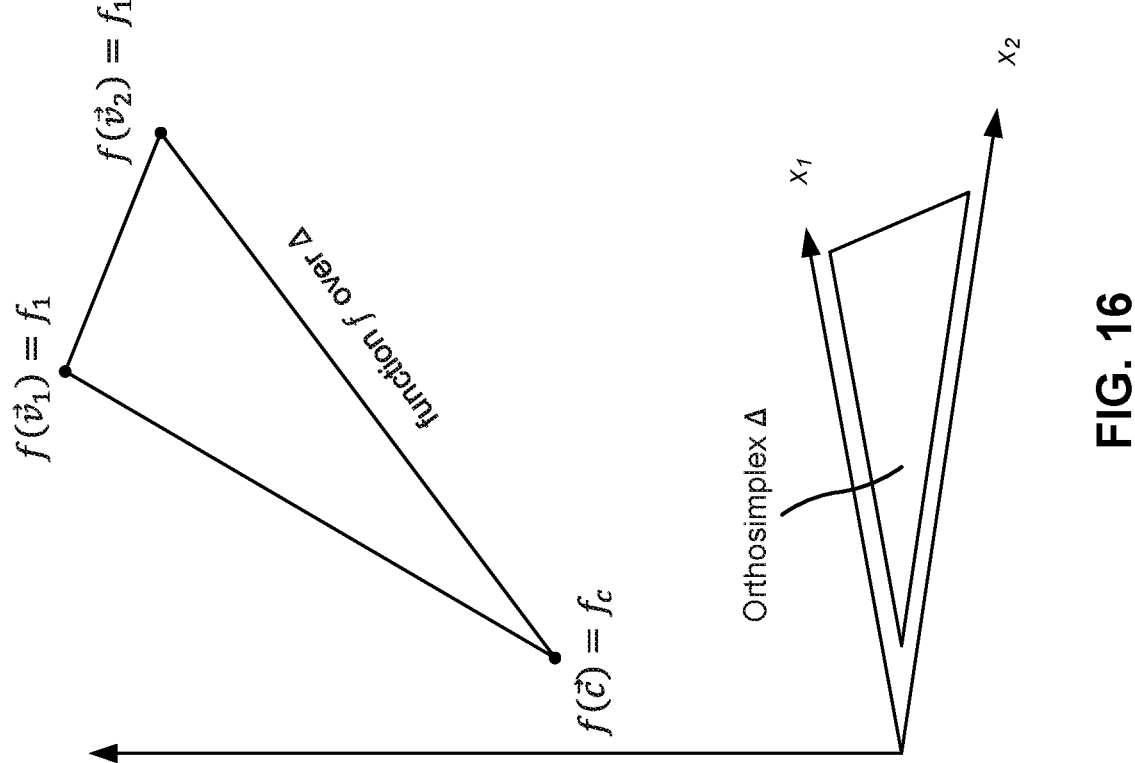
FIG. 16

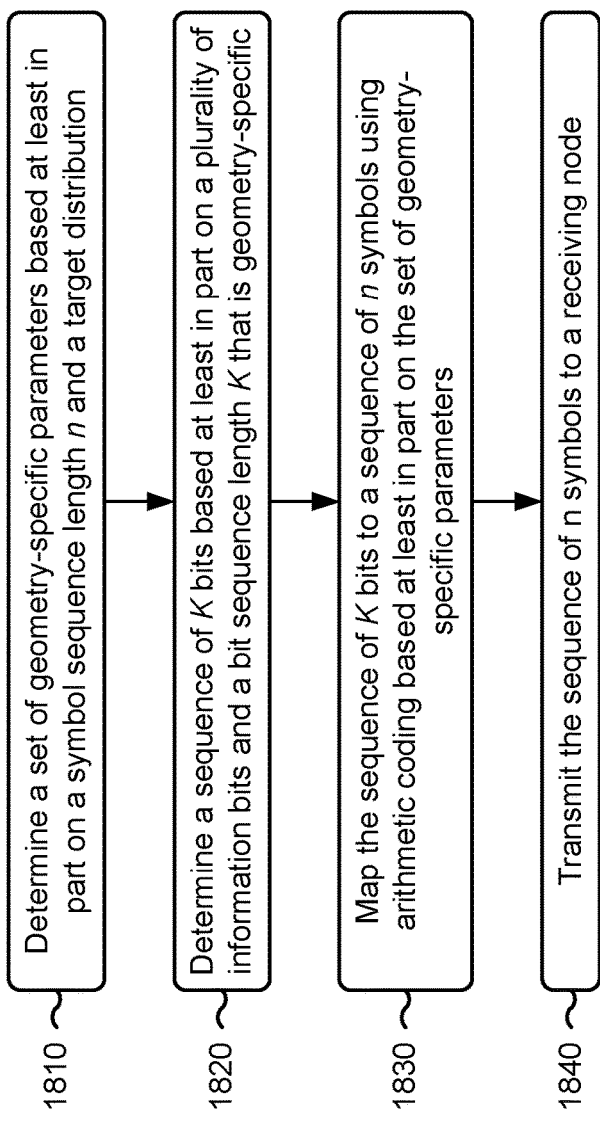

1810   Determine a set of geometry-specific parameters based at least in part on a symbol sequence length *n* and a target distribution 1820   Determine a sequence of *K* bits based at least in part on a plurality of information bits and a bit sequence length *K* that is geometry-specific 1830   Map the sequence of *K* bits to a sequence of *n* symbols using arithmetic coding based at least in part on the set of geometry-specific parameters 1840   Transmit the sequence of n symbols to a receiving node

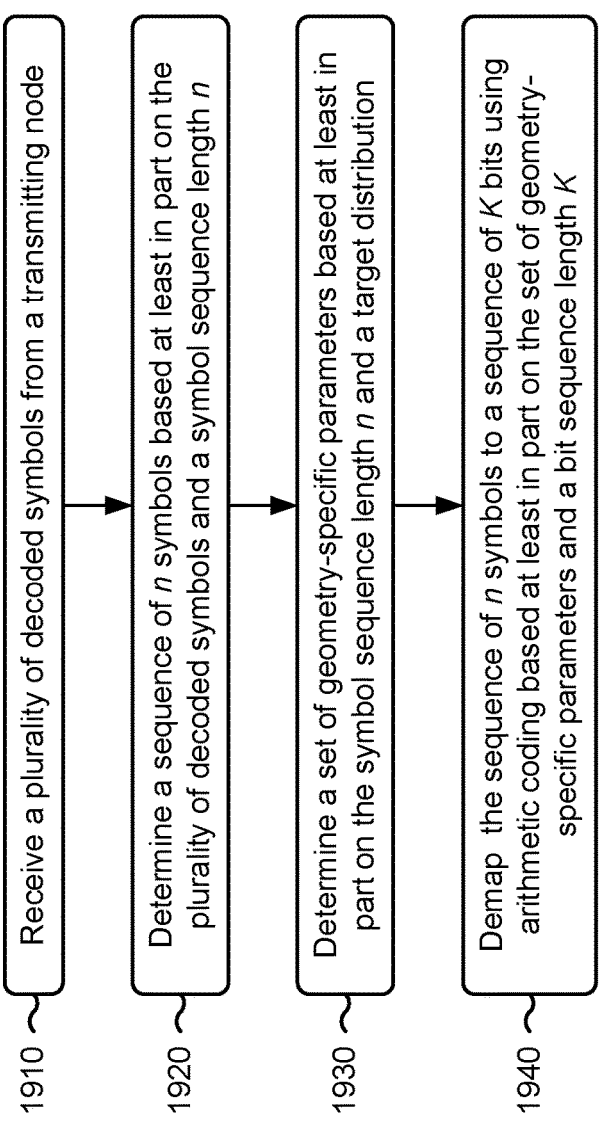

1900

1910 Receive a plurality of decoded symbols from a transmitting node

1920 Determine a sequence of $n$ symbols based at least in part on the plurality of decoded symbols and a symbol sequence length $n$ 1930 Determine a set of geometry-specific parameters based at least in part on the symbol sequence length $n$ and a target distribution 1940 Demap the sequence of $n$ symbols to a sequence of $K$ bits using arithmetic coding based at least in part on the set of geometry-specific parameters and a bit sequence length $K$

FIG. 19

MULTIPLE COMPOSITION DISTRIBUTION MATCHING BASED ON ARITHMETIC CODING AND GEOMETRY-SPECIFIC PARAMETERS

CROSS-REFERENCE TO RELATED APPLICATION

This Patent Application is a 371 national stage of PCT Application No. PCT/CN2022/078770 filed on Mar. 2, 2022, entitled "MULTIPLE COMPOSITION DISTRIBUTION MATCHING BASED ON ARITHMETIC CODING AND GEOMETRY-SPECIFIC PARAMETERS," which claims priority to International Patent Application No. PCT/CN2021/125207, filed on Oct. 21, 2021, entitled "MULTIPLE COMPOSITION DISTRIBUTION MATCHING BASED ON ARITHMETIC CODING AND GEOMETRY-SPECIFIC PARAMETERS," and assigned to the assignee hereof. The disclosures of the prior Applications are considered part of and are incorporated by reference into this Patent Application.

FIELD OF THE DISCLOSURE

Aspects of the present disclosure generally relate to wireless communication and to techniques and apparatuses for communications using multiple composition distribution matching based at least in part on arithmetic coding (AC) and geometry-specific parameters.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more base stations that support communication for a user equipment (UE) or multiple UEs. A UE may communicate with a base station via downlink communications and uplink communications. "Downlink" (or "DL") refers to a communication link from the base station to the UE, and "uplink" (or "UL") refers to a communication link from the UE to the base station.

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some implementations, an apparatus for wireless communication at a transmitting node includes a memory; and one or more processors, coupled to the memory, configured to: determine a set of geometry-specific parameters based at least in part on a symbol sequence length n and a target distribution; determine a sequence of K bits based at least in part on a plurality of information bits and a bit sequence length K that is geometry-specific; map the sequence of K bits to a sequence of n symbols using arithmetic coding based at least in part on the set of geometry-specific parameters, wherein, to map the sequence of K bits to a sequence of n symbols, are configured to: determine a plurality of compositions associated with a continuous region of a geometry; select, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and encode, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected; and transmit the sequence of n symbols to a receiving node.

In some implementations, an apparatus for wireless communication at a receiving node includes a memory; and one or more processors, coupled to the memory, configured to: receive a plurality of decoded symbols from a transmitting node; determine a sequence of n symbols based at least in part on the plurality of decoded symbols and a symbol sequence length n; determine a set of geometry-specific parameters based at least in part on the symbol sequence length n and a target distribution; and demap the sequence of n symbols to a sequence of K bits using arithmetic coding based at least in part on the set of geometry-specific parameters and a bit sequence length K, wherein the one or more processors, to demap the sequence of n symbols to the sequence of K bits, are configured to: determine a plurality of compositions associated with a continuous region of a geometry; select a composition, from the plurality of compositions, of the sequence of n symbols; and decode, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits.

In some implementations, a method of wireless communication performed by a transmitting node includes determining a set of geometry-specific parameters based at least in part on a symbol sequence length n and a target distribution; determining a sequence of K bits based at least in part on a plurality of information bits and a bit sequence length K that is geometry-specific; mapping the sequence of K bits to a sequence of n symbols using arithmetic coding based at least in part on the set of geometry-specific parameters, wherein mapping the sequence of K bits to a sequence of n symbols further comprises determining a plurality of compositions associated with a continuous region of a geometry; selecting, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and encoding, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected; and transmitting the sequence of n symbols to a receiving node.

In some implementations, a method of wireless communication performed by a receiving node includes receiving a plurality of decoded symbols from a transmitting node; determining a sequence of n symbols based at least in part on the plurality of decoded symbols and a symbol sequence length n; determining a set of geometry-specific parameters based at least in part on the symbol sequence length n and a target distribution; and demapping the sequence of n symbols to a sequence of K bits using arithmetic coding based at least in part on the set of geometry-specific parameters and a bit sequence length K, wherein demapping the sequence of n symbols to the sequence of K bits further comprises determining a plurality of compositions associated with a continuous region of a geometry; selecting a composition, from the plurality of compositions, of the sequence of n symbols; and decoding, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits.

In some implementations, a non-transitory computer-readable medium storing a set of instructions for wireless communication includes one or more instructions that, when executed by one or more processors of a transmitting node, cause the transmitting node to: determine a set of geometry-specific parameters based at least in part on a symbol sequence length n and a target distribution; determine a sequence of K bits based at least in part on a plurality of information bits and a bit sequence length K that is geometry-specific; map the sequence of K bits to a sequence of n symbols using arithmetic coding based at least in part on the set of geometry-specific parameters, wherein the one or more processors, to map the sequence of K bits to a sequence of n symbols, are configured to: determine a plurality of compositions associated with a continuous region of a geometry; select, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and encode, based at least in part on the composition selected from the plurality of compositions, the sequence of Kbits into the sequence of n symbols using arithmetic coding based at least in part on the set of geometry-specific parameters, wherein the composition of the sequence of n symbols corresponds to the composition selected; and transmit the sequence of n symbols to a receiving node.

In some implementations, a non-transitory computer-readable medium storing a set of instructions for wireless communication includes one or more instructions that, when executed by one or more processors of a receiving node, cause the receiving node to: receive a plurality of decoded symbols from a transmitting node; determine a sequence of n symbols based at least in part on the plurality of decoded symbols and a symbol sequence length n; determine a set of geometry-specific parameters based at least in part on the symbol sequence length n and a target distribution; and demap the sequence of n symbols to a sequence of K bits using arithmetic coding based at least in part on the set of geometry-specific parameters and a bit sequence length K, wherein the one or more processors, to demap the sequence of n symbols to the sequence of K bits, are configured to: determine a plurality of compositions associated with a continuous region of a geometry; select a composition, from the plurality of compositions, of the sequence of n symbols; and decode, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits.

In some implementations, a transmitting apparatus for wireless communication includes means for determining a set of geometry-specific parameters based at least in part on a symbol sequence length n and a target distribution; means for determining a sequence of K bits based at least in part on a plurality of information bits and a bit sequence length K that is geometry-specific; means for mapping the sequence of K bits to a sequence of n symbols using arithmetic coding based at least in part on the set of geometry-specific parameters, wherein the means for mapping the sequence of K bits to a sequence of n symbols further comprises means for determining a plurality of compositions associated with a continuous region of a geometry; means for selecting, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and means for encoding, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected; and means for transmitting the sequence of n symbols to a receiving node.

In some implementations, a receiving apparatus for wireless communication includes means for receiving a plurality of decoded symbols from a transmitting node; means for determining a sequence of n symbols based at least in part on the plurality of decoded symbols and a symbol sequence length n; means for determining a set of geometry-specific parameters based at least in part on the symbol sequence length n and a target distribution; and means for demapping the sequence of n symbols to a sequence of K bits using arithmetic coding based at least in part on the set of geometry-specific parameters and a bit sequence length K, wherein the means for demapping the sequence of n symbols to the sequence of K bits further comprises means for determining a plurality of compositions associated with a continuous region of a geometry; means for selecting a composition, from the plurality of compositions, of the sequence of n symbols; and means for decoding, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

Figure 1:
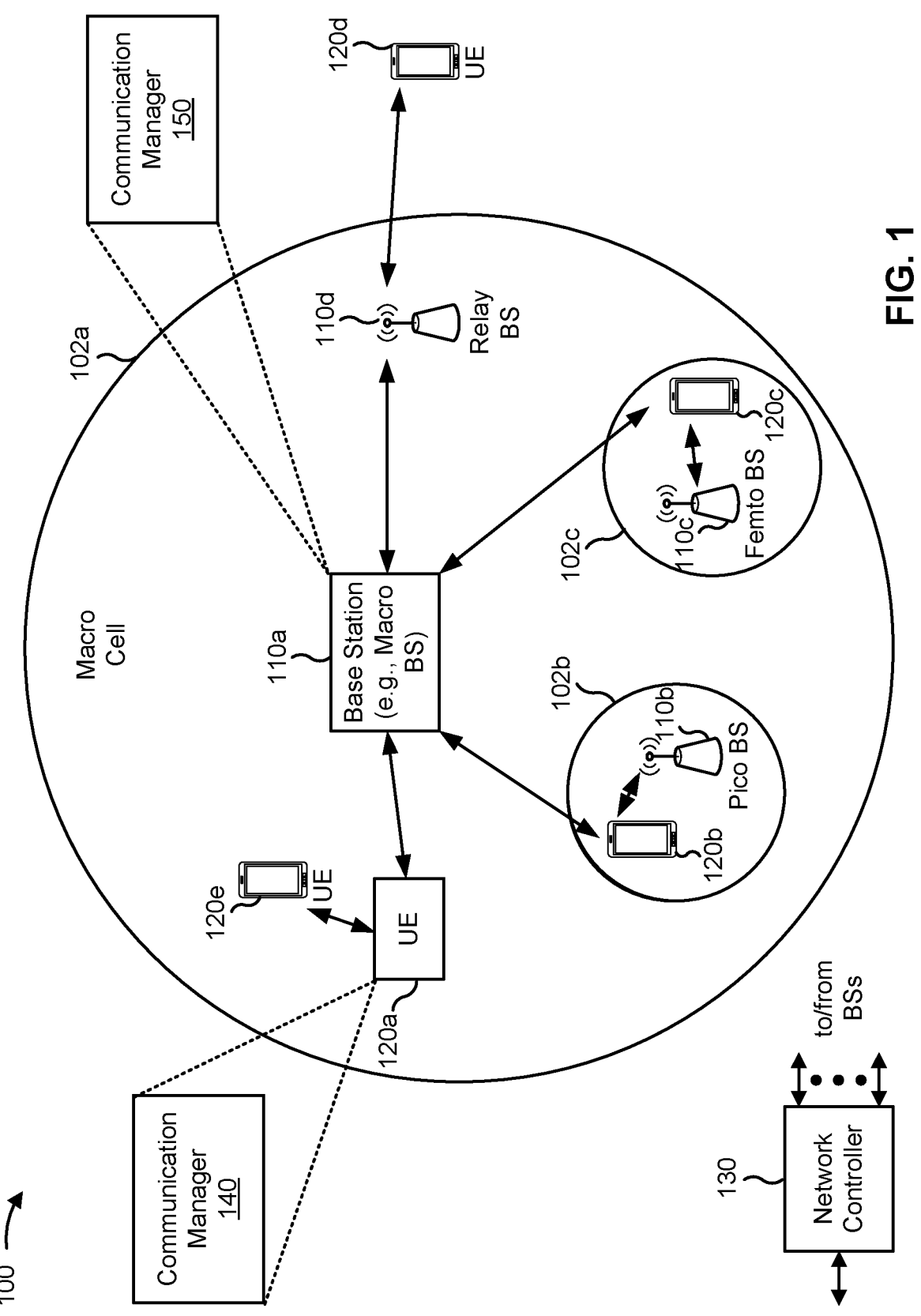

FIG. 1 is a diagram illustrating an example of a wireless network, in accordance with the present disclosure.

Figure 2:
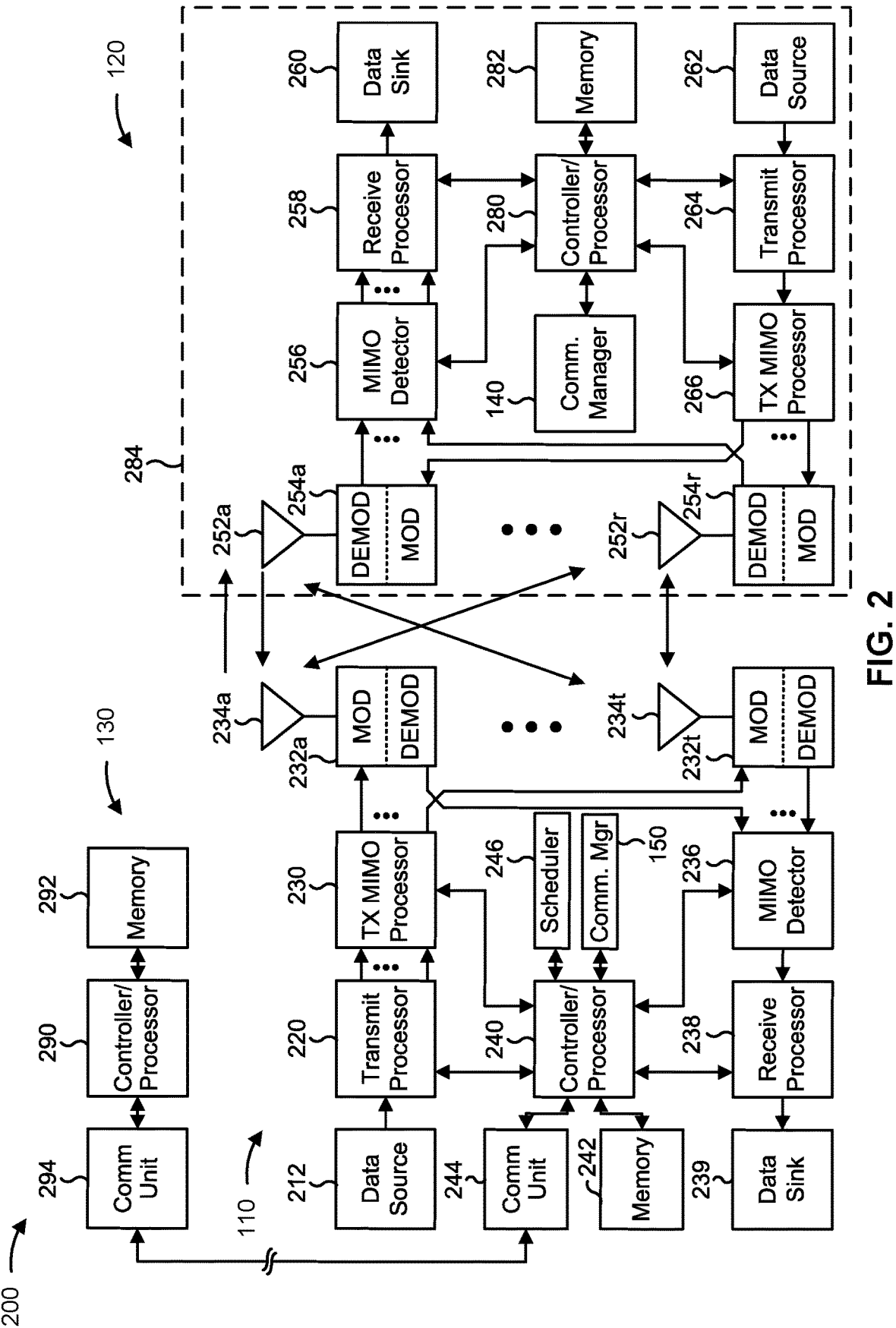

FIG. 2 is a diagram illustrating an example of a base station in communication with a user equipment (UE) in a wireless network, in accordance with the present disclosure.

Figure 3:
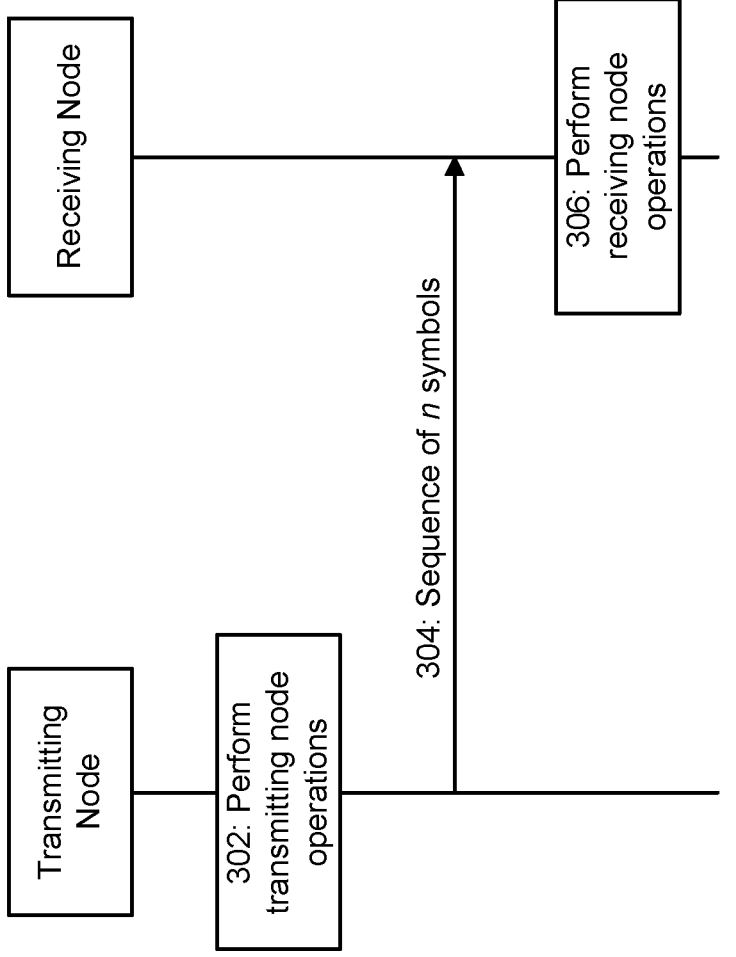

FIG. 3 is a diagram illustrating an example associated with arithmetic coding (AC) and geometry-specific parameters, in accordance with the present disclosure.

FIG. 4 is a diagram illustrating an example associated with a generalized rectangle-shape region, in accordance with the present disclosure.

Figure 5:
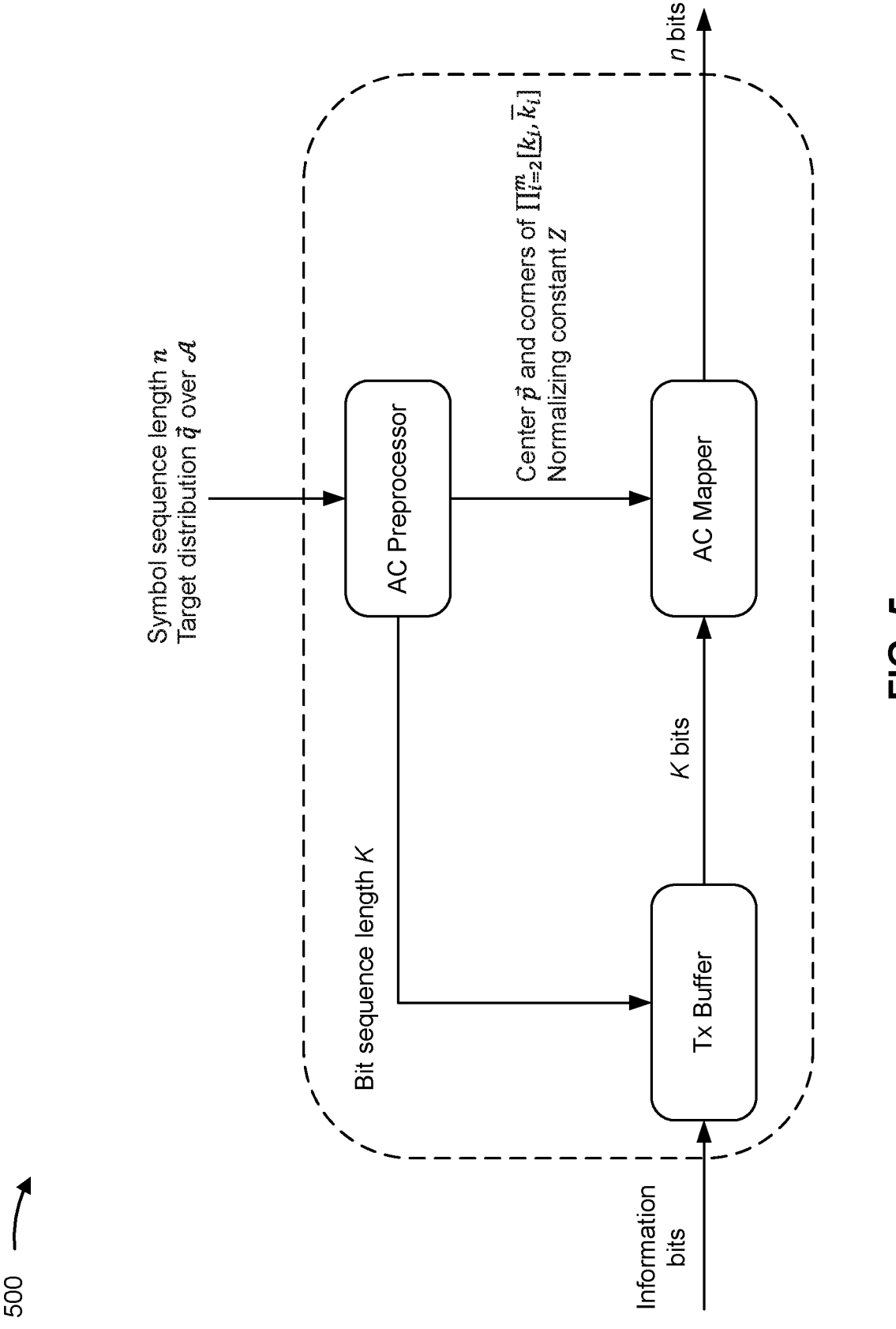

FIG. 5 is a diagram illustrating an example associated with a distribution matcher used in a fixed-to-fixed distribution matching (DM) scheme based at least in part on generalized rectangles, in accordance with the present disclosure.

Figure 6:
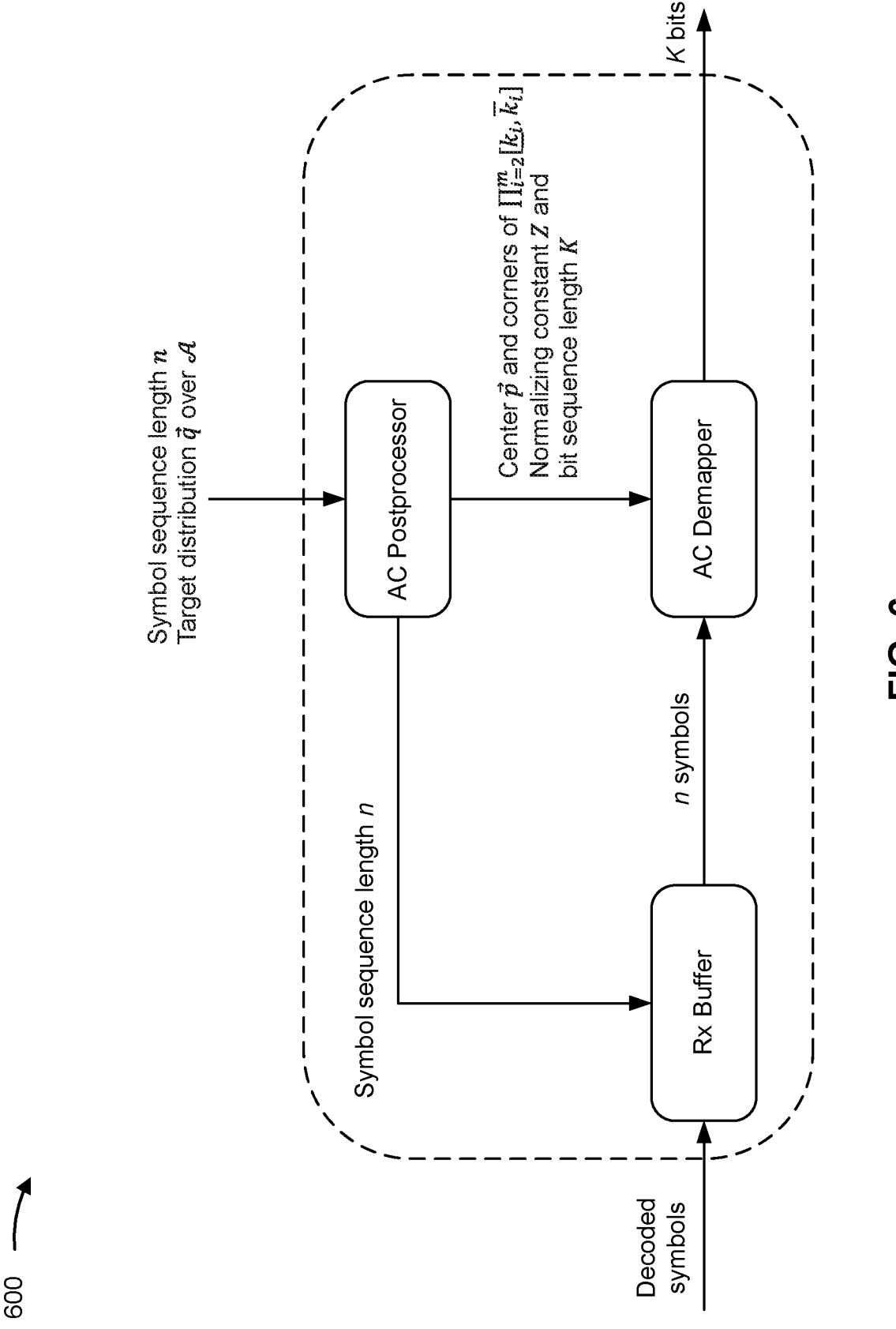

FIG. 6 is a diagram illustrating an example associated with a distribution dematcher used in a fixed-to-fixed DM scheme based at least in part on generalized rectangles, in accordance with the present disclosure.

Figure 7:
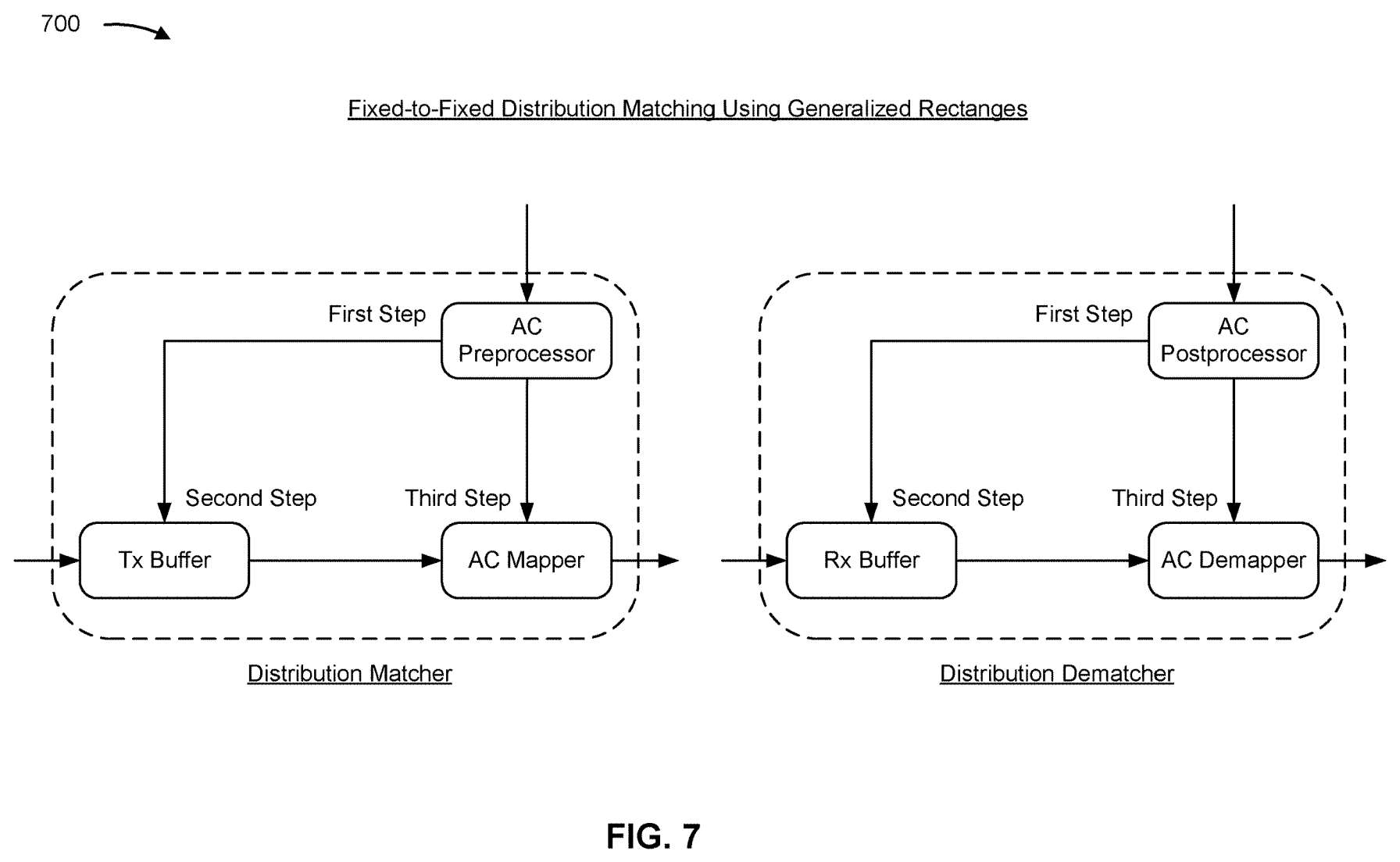

FIG. 7 is a diagram illustrating an example associated with a distribution matcher and a distribution dematcher used in a fixed-to-fixed DM scheme based at least in part on generalized rectangles, in accordance with the present disclosure.

Figure 8:
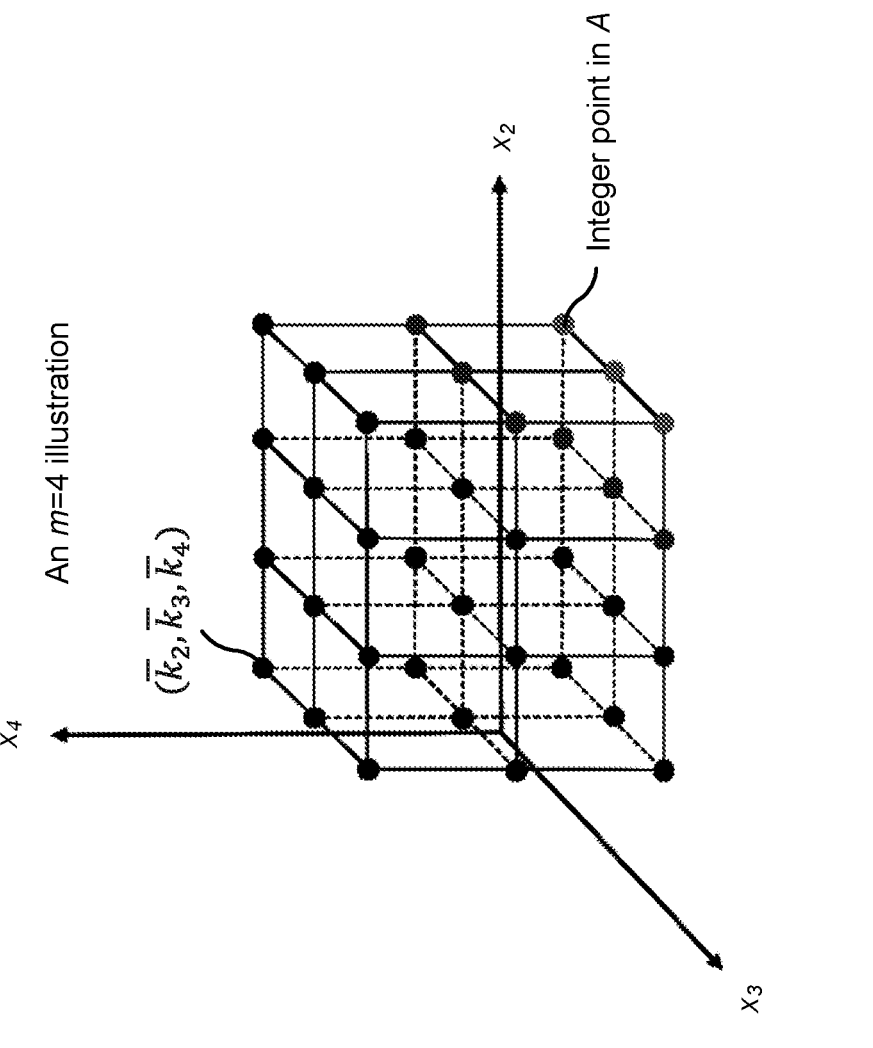
Figure 9:
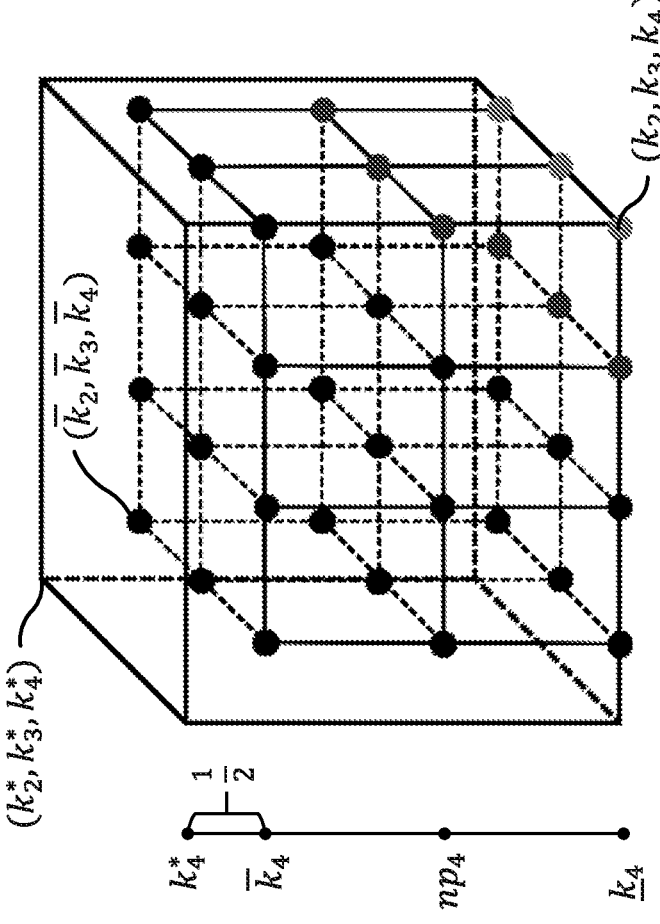
Figure 10:
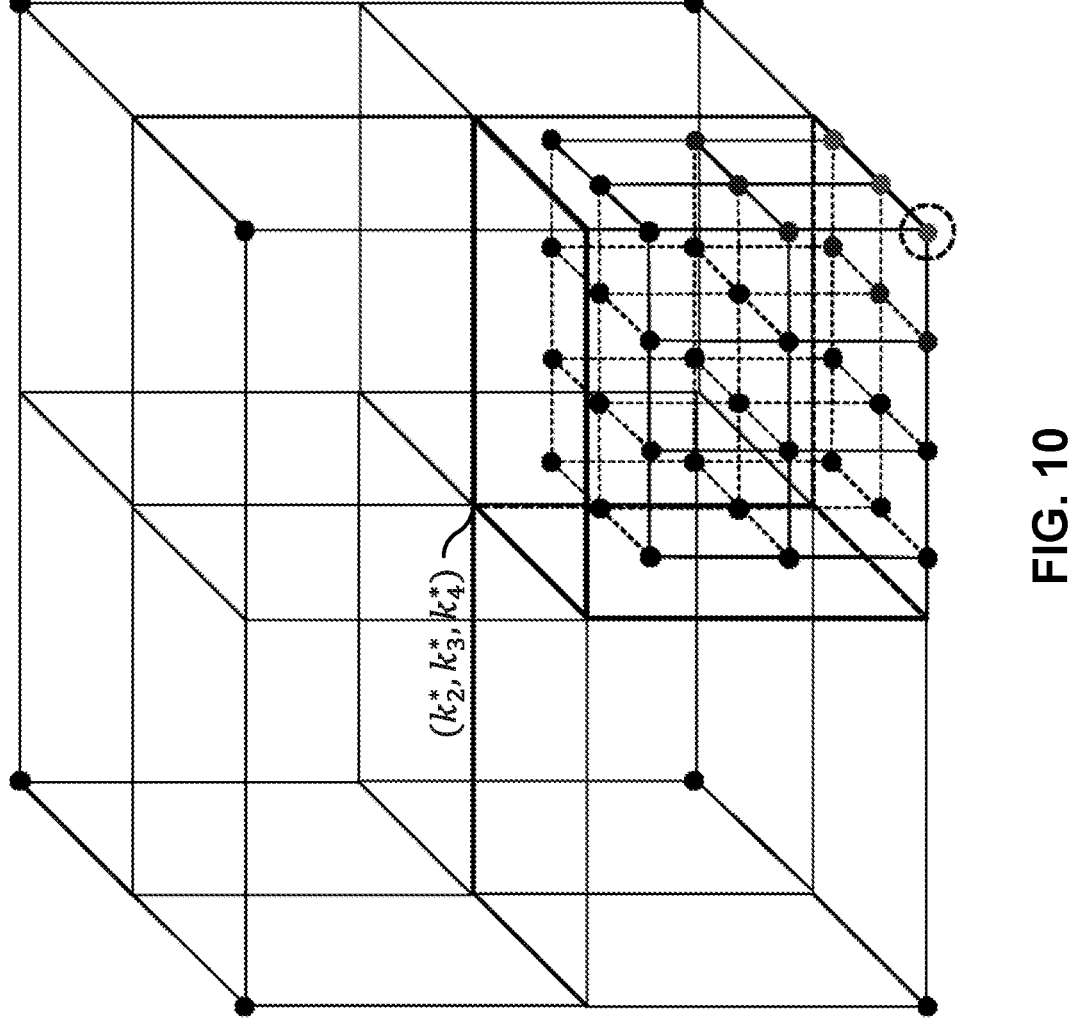

FIGS. 8-10 are diagrams illustrating examples associated with performing operations associated with generalized rectangles, in accordance with the present disclosure.

FIG. 11 is a diagram illustrating an example associated with a simplex, in accordance with the present disclosure.

FIG. 12 is a diagram illustrating an example associated with an orthosimplex, in accordance with the present disclosure.

Figure 13:
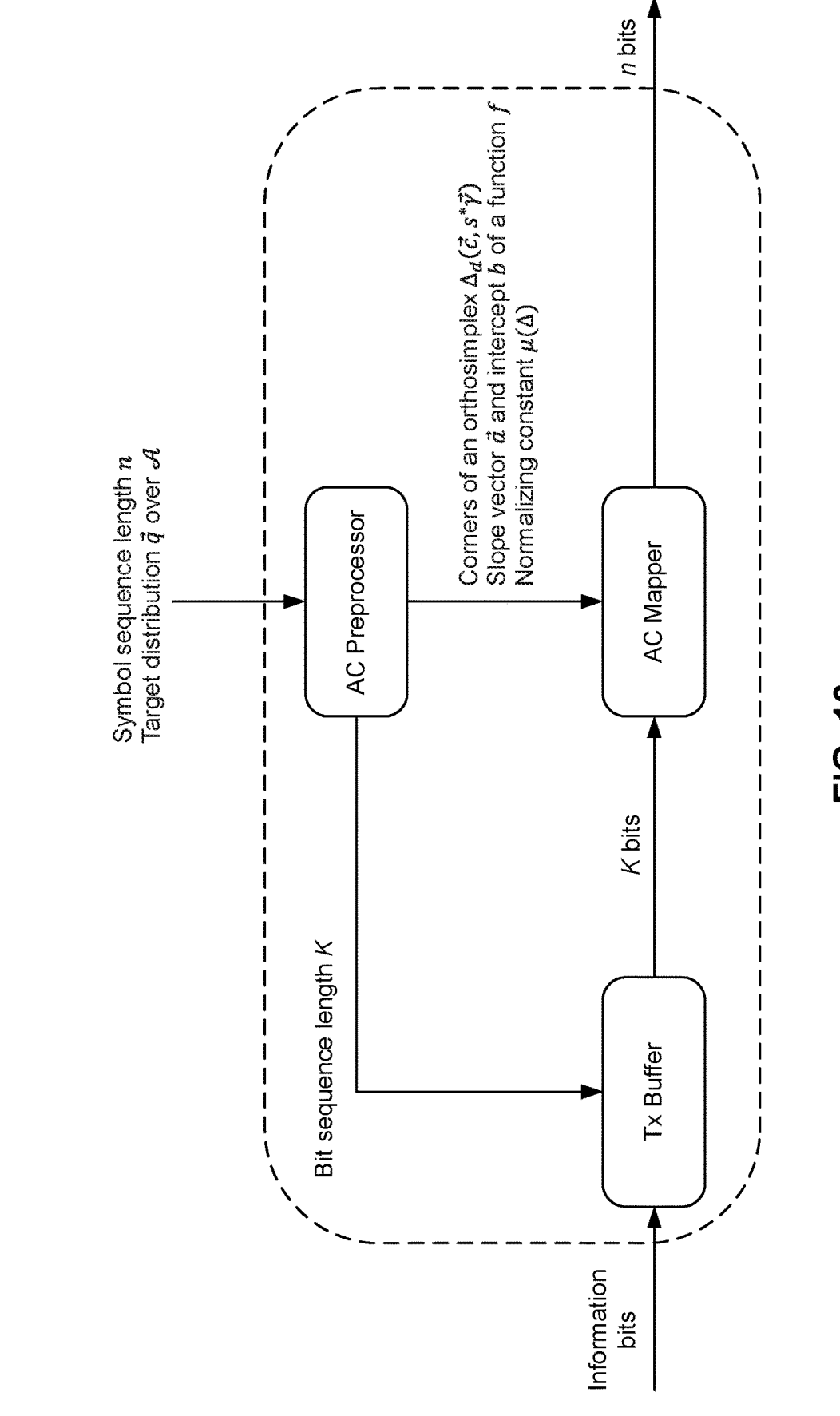

FIG. 13 is a diagram illustrating an example associated with a distribution matcher used in a fixed-to-fixed DM scheme based at least in part on orthosimplices, in accordance with the present disclosure.

Figure 14:
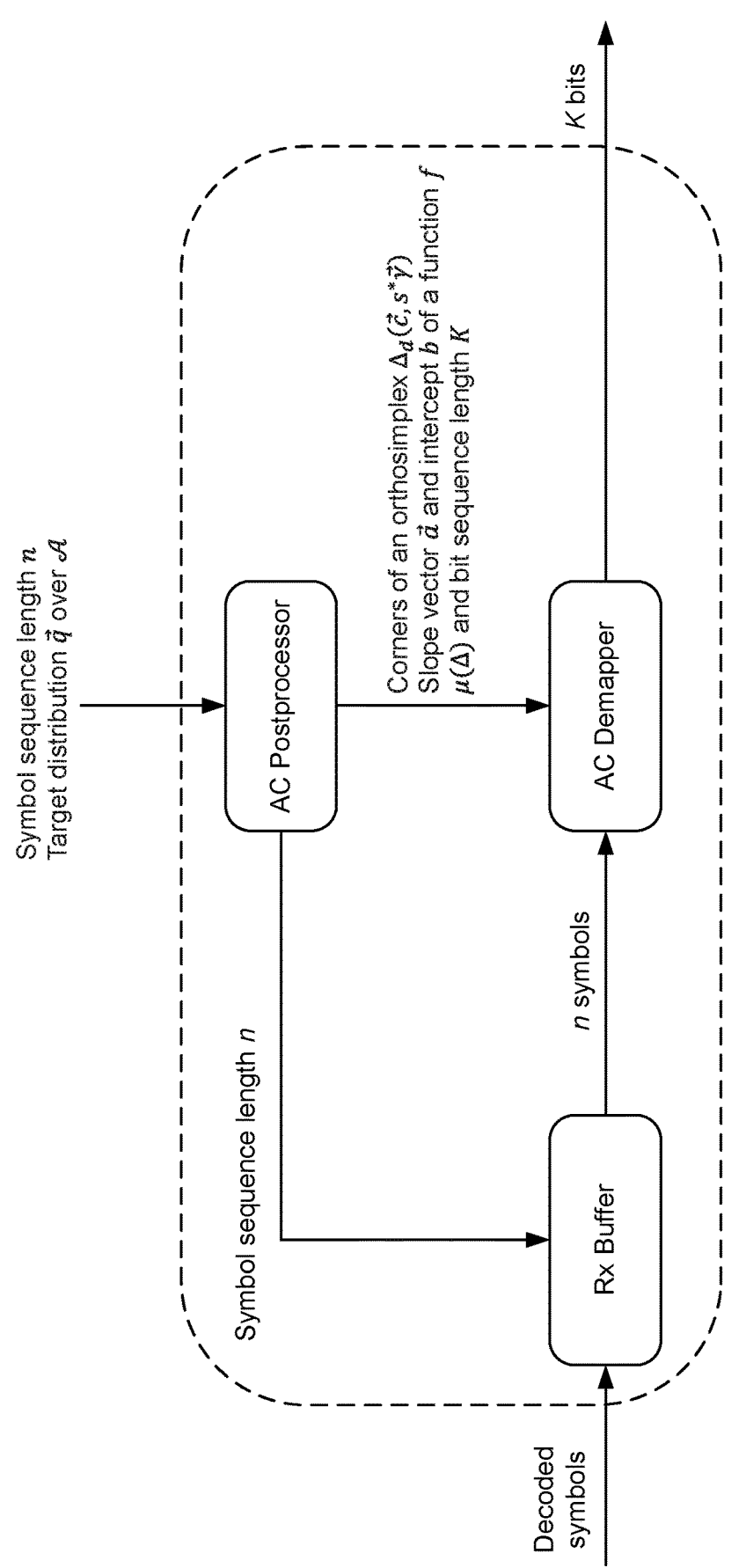

FIG. 14 is a diagram illustrating an example associated with a distribution dematcher used in a fixed-to-fixed DM scheme based at least in part on orthosimplices, in accordance with the present disclosure.

FIG. 15 is a diagram illustrating an example associated with a distribution matcher and a distribution dematcher used in a fixed-to-fixed DM scheme based at least in part on orthosimplices, in accordance with the present disclosure.

Figure 17:
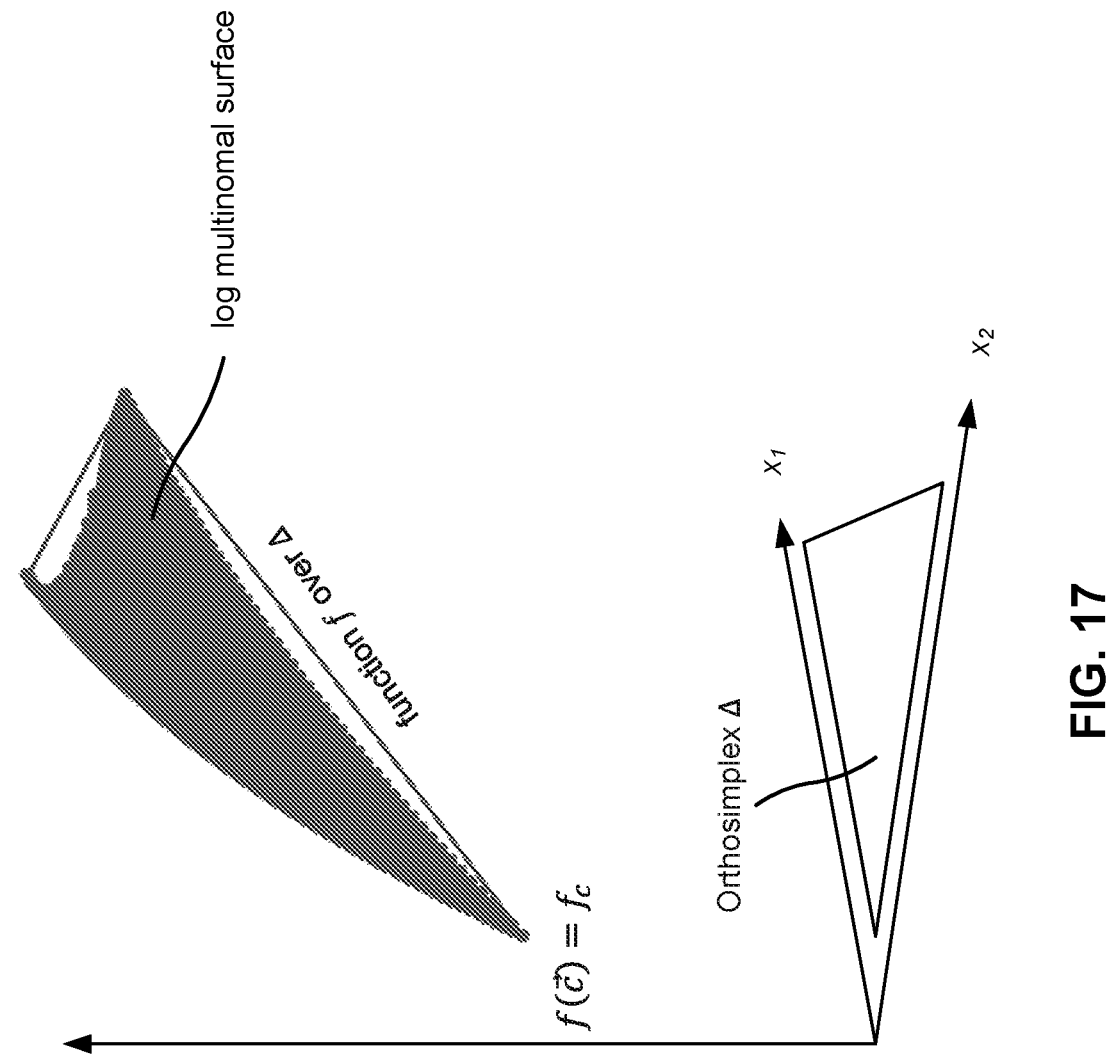

FIGS. 16-17 are diagrams illustrating examples associated with performing operations associated with orthosimplices, in accordance with the present disclosure.

FIGS. 18-19 are diagrams illustrating example processes associated communications using distribution matching based at least in part on AC and geometry-specific parameters, in accordance with the present disclosure.

Figure 20:
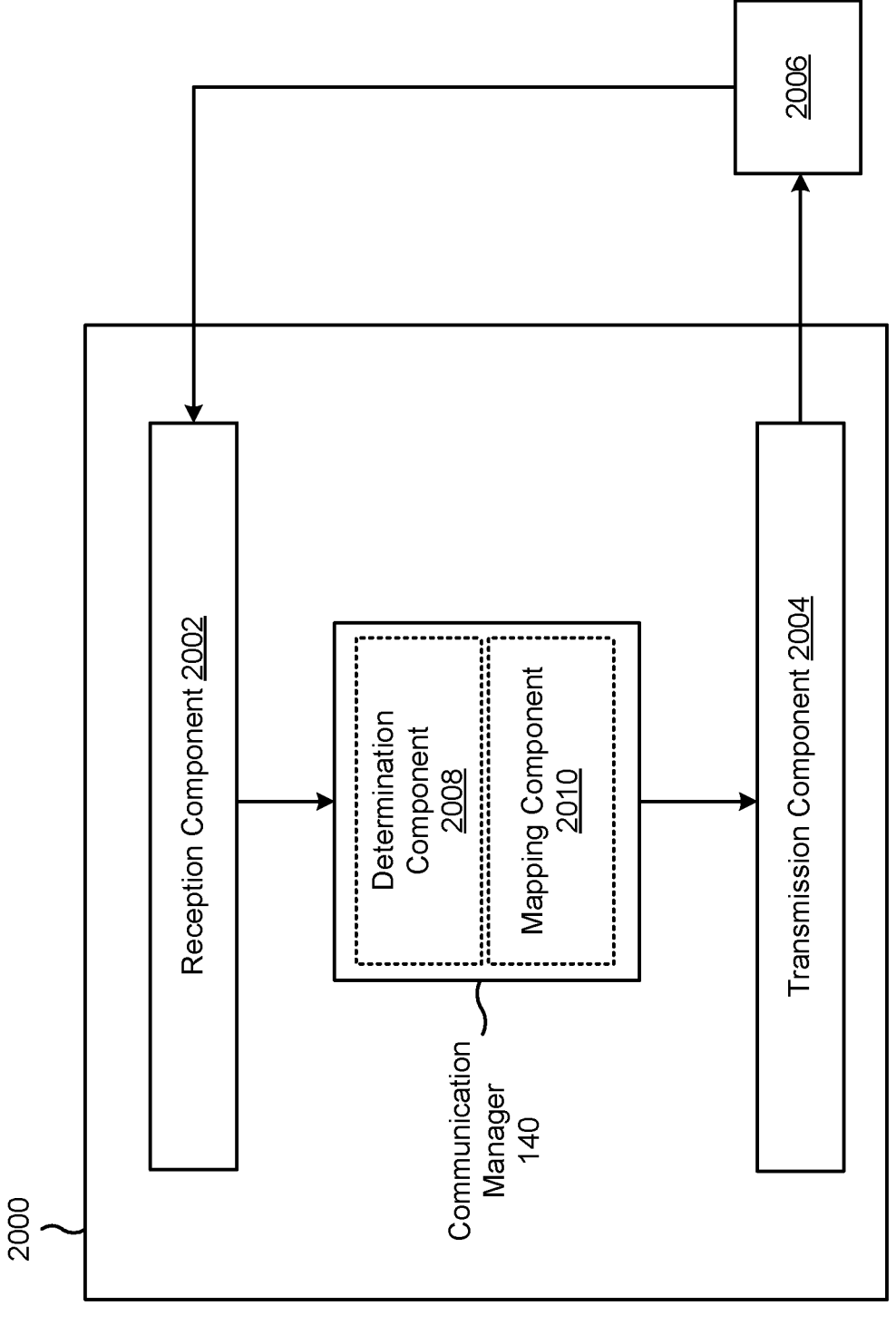
Figure 21:
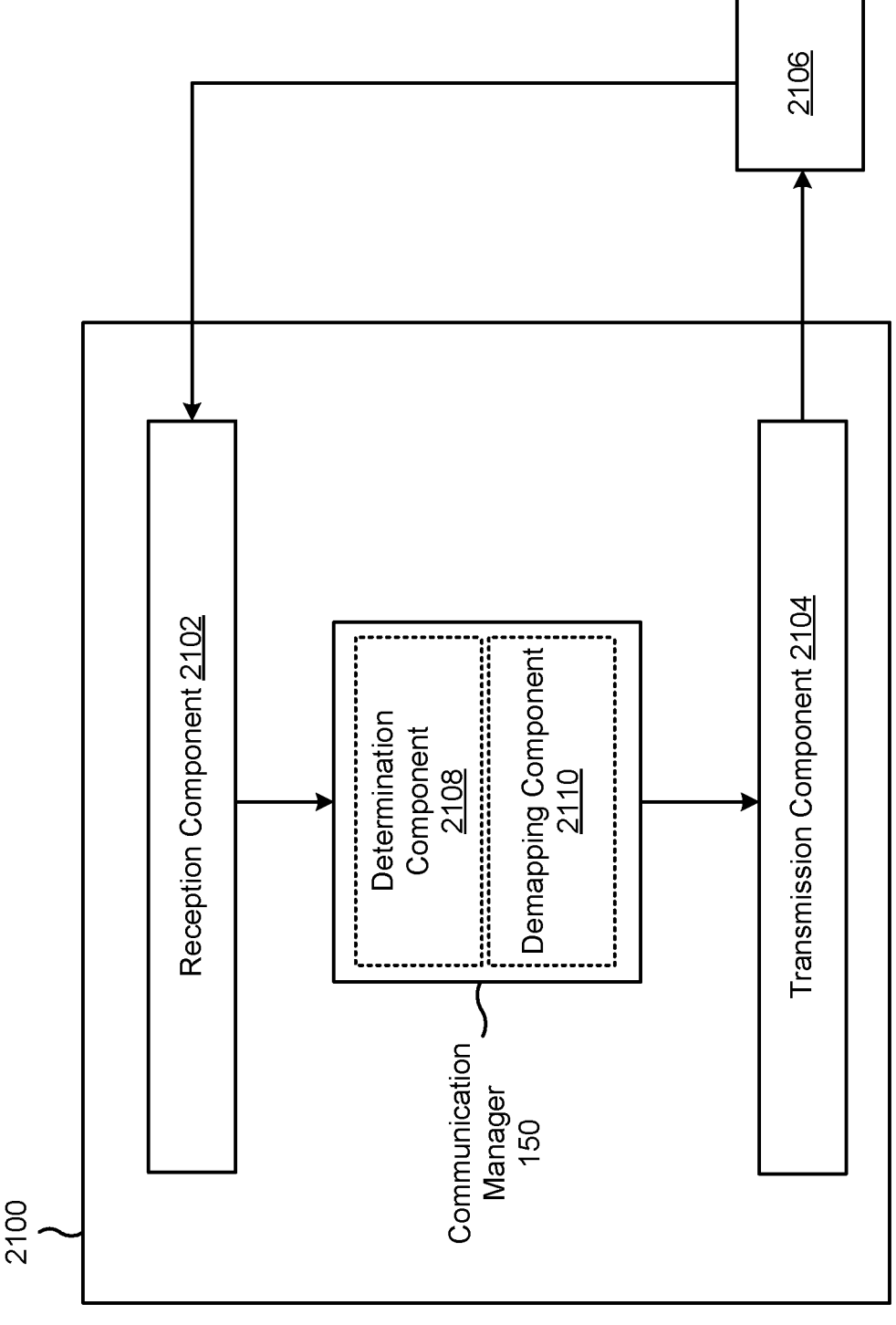

FIGS. 20-21 are diagrams of example apparatuses for wireless communication, in accordance with the present disclosure.

DETAILED DESCRIPTION

Various aspects of the disclosure are described more fully hereinafter with reference to the accompanying drawings.

This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more base stations 110 (shown as a BS 110a, a BS 110b, a BS 110c, and a BS 110d), a user equipment (UE) 120 or multiple UEs 120 (shown as a UE 120a, a UE 120b, a UE 120c, a UE 120d, and a UE 120e), and/or other network entities. A base station 110 is an entity that communicates with UEs 120. A base station 110 (sometimes referred to as a BS) may include, for example, an NR base station, an LTE base station, a Node B, an eNB (e.g., in 4G), a gNB (e.g., in 5G), an access point, and/or a transmission reception point (TRP). Each base station 110 may provide communication coverage for a particular geographic area. In the Third Generation Partnership Project (3GPP), the term "cell" can refer to a coverage area of a base station 110 and/or a base station subsystem serving this coverage area, depending on the context in which the term is used.

A base station 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscription. A femto cell may cover a relatively small geographic area (e.g., a home) and may allow restricted access by UEs 120 having association with the femto cell (e.g., UEs 120 in a closed subscriber group (CSG)). A base station 110 for a macro cell may be referred to as a macro base station. A base station 110 for a pico cell may be referred to as a pico base station. A base station 110 for a femto cell may be referred to as a femto base station or an in-home base station. In the example shown in FIG. 1, the BS 110a may be a macro base station for a macro cell 102a, the BS 110b may be a pico base station for a pico cell 102b, and the BS 110c may be a femto base station for a femto cell 102c. A base station may support one or multiple (e.g., three) cells.

In some aspects, the term "base station" (e.g., the base station 110) or "network entity" may refer to an aggregated base station, a disaggregated base station, an integrated access and backhaul (IAB) node, a relay node, and/or one or more components thereof. For example, in some aspects, "base station" or "network entity" may refer to a central unit (CU), a distributed unit (DU), a radio unit (RU), a Near-Real Time (Near-RT) RAN Intelligent Controller (RIC), or a Non-Real Time (Non-RT) RIC, or a combination thereof. In some aspects, the term "base station" or "network entity" may refer to one device configured to perform one or more functions, such as those described herein in connection with the base station 110. In some aspects, the term "base station" or "network entity" may refer to a plurality of devices configured to perform the one or more functions. For example, in some distributed systems, each of a number of different devices (which may be located in the same geographic location or in different geographic locations) may be configured to perform at least a portion of a function, or to duplicate performance of at least a portion of the function, and the term "base station" or "network entity" may refer to any one or more of those different devices. In some aspects, the term "base station" or "network entity" may refer to one or more virtual base stations and/or one or more virtual base station functions. For example, in some aspects, two or more base station functions may be instantiated on a single device. In some aspects, the term "base station" or "network entity" may refer to one of the base station functions and not another. In this way, a single device may include more than one base station.

In some examples, a cell may not necessarily be stationary, and the geographic area of the cell may move according to the location of a base station 110 that is mobile (e.g., a mobile base station). In some examples, the base stations 110 may be interconnected to one another and/or to one or more other base stations 110 or network nodes (not shown) in the wireless network 100 through various types of backhaul interfaces, such as a direct physical connection or a virtual network, using any suitable transport network.

The wireless network 100 may include one or more relay stations. A relay station is an entity that can receive a transmission of data from an upstream station (e.g., a base station 110 or a UE 120) and send a transmission of the data to a downstream station (e.g., a UE 120 or a base station 110). A relay station may be a UE 120 that can relay transmissions for other UEs 120. In the example shown in FIG. 1, the BS 110d (e.g., a relay base station) may communicate with the BS 110a (e.g., a macro base station) and the UE 120d in order to facilitate communication between the BS 110a and the UE 120d. A base station 110 that relays communications may be referred to as a relay station, a relay base station, a relay, or the like.

The wireless network 100 may be a heterogeneous network that includes base stations 110 of different types, such as macro base stations, pico base stations, femto base stations, relay base stations, or the like. These different types of base stations 110 may have different transmit power levels, different coverage areas, and/or different impacts on interference in the wireless network 100. For example, macro base stations may have a high transmit power level (e.g., 5 to 40 watts) whereas pico base stations, femto base stations, and relay base stations may have lower transmit power levels (e.g., 0.1 to 2 watts).

A network controller 130 may couple to or communicate with a set of base stations 110 and may provide coordination and control for these base stations 110. The network controller 130 may communicate with the base stations 110 via a backhaul communication link. The base stations 110 may communicate with one another directly or indirectly via a wireless or wireline backhaul communication link.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, and/or any other suitable device that is configured to communicate via a wireless medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a base station, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120*a* and UE 120*e*) may communicate directly using one or more sidelink channels (e.g., without using a base station 110 as an intermediary to communicate with one another). For example, the UEs 120 may communicate using peer-to-peer (P2P) communications, device-to-device (D2D)

communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the base station 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, a transmitting node (e.g., UE 120 or a network entity, such as base station 110) may include a communication manager 140. As described in more detail elsewhere herein, the communication manager 140 may determine a set of geometry-specific parameters based at least in part on a symbol sequence length n and a target distribution; determine a sequence of K bits based at least in part on a plurality of information bits and a bit sequence length K that is geometry-specific; and map the K bits to a sequence of n symbols using arithmetic coding (AC) based at least in part on the set of geometry-specific parameters; and transmit the sequence of n symbols to a receiving node.

Additionally, or alternatively, the communication manager 140 may perform one or more other operations described herein.

In some aspects, a receiving node (e.g., UE 120 or a network entity, such as base station 110) may include a communication manager 150. As described in more detail elsewhere herein, the communication manager 150 may receive a plurality of decoded symbols from a transmitting node; determine a sequence of n symbols based at least in part on the plurality of decoded symbols and a symbol sequence length n; determine a set of geometry-specific parameters based at least in part on the symbol sequence length n and a target distribution; and demap the sequence of n symbols to a sequence of K bits using arithmetic coding based at least in part on the set of geometry-specific parameters and a bit sequence length K. Additionally, or alternatively, the communication manager 150 may perform one or more other operations described herein.

As indicated above, FIG. 1 is provided as an example. Other examples may differ from what is described with regard to FIG. 1.

FIG. 2 is a diagram illustrating an example 200 of a base station 110 in communication with a UE 120 in a wireless network 100, in accordance with the present disclosure. The base station 110 may be equipped with a set of antennas 234a through 234t, such as T antennas (T≥1). The UE 120 may be equipped with a set of antennas 252a through 252r, such as R antennas (R≥1).

At the base station 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The base station 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmitting (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the base station 110 and/or other base stations 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the base station 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the base station 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 3-21).

At the base station 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The base station 110 may include a communication unit 244 and may communicate with the network controller 130 via the communication unit 244. The base station 110 may include a scheduler 246 to schedule one or more UEs 120 for downlink and/or uplink communications. In some examples, the modem 232 of the base station 110 may include a modulator and a demodulator. In some examples, the base station 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 3-21).

The controller/processor 240 of the base station 110, the controller/processor 280 of the UE 120, and/or any other component(s) of FIG. 2 may perform one or more techniques associated with AC and geometry-specific parameters, as described in more detail elsewhere herein. In some aspects, the transmitting node and/or the receiving node described herein is the base station 110, is included in the base station 110, or includes one or more components of the base station 110 shown in FIG. 2. In some aspects, the transmitting node and/or the receiving node described herein is the UE 120, is included in the UE 120, or includes one or more components of the UE 120 shown in FIG. 2. For example, the controller/processor 240 of the base station 110, the controller/processor 280 of the UE 120, and/or any other component(s) of FIG. 2 may perform or direct operations of, for example, process 1800 of FIG. 18, process 1900 of FIG. 19, and/or other processes as described herein. The memory 242 and the memory 282 may store data and program codes for the base station 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 1800 of FIG. 18, process 1900 of FIG. 19, and/or other processes as described herein. In some examples, executing instructions may include running the instructions, converting the instructions, compiling the instructions, and/or interpreting the instructions, among other examples.

In some aspects, a transmitting node (e.g., UE 120 or a network entity, such as base station 110) includes means for determining a set of geometry-specific parameters based at least in part on a symbol sequence length n and a target distribution; means for determining a sequence of K bits based at least in part on a plurality of information bits and a bit sequence length K that is geometry-specific; means for mapping the sequence of K bits to a sequence of n symbols using arithmetic coding based at least in part on the set of geometry-specific parameters; and/or means for transmitting the sequence of n symbols to a receiving node. In some aspects, the means for the transmitting node to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the transmitting node to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, a receiving node (e.g., UE 120 or a network entity, such as base station 110) includes means for receiving a plurality of decoded symbols from a transmitting node; means for determining a sequence of n symbols based at least in part on the plurality of decoded symbols and a symbol sequence length n; means for determining a set of geometry-specific parameters based at least in part on the symbol sequence length n and a target distribution; and/or means for demapping the sequence of n symbols to a sequence of K bits using arithmetic coding based at least in part on the set of geometry-specific parameters and a bit sequence length K. In some aspects, the means for the receiving node to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the receiving node to perform operations described herein may include, for example, one or more of communication manager 140, antenna 252, modem 254, MIMO detector 256, receive processor 258, transmit processor 264, TX MIMO processor 266, controller/processor 280, or memory 282.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Distribution Matching

In a wireless network, a transmitting node may encode information according to a certain forward-error-correction (FEC) coding scheme to improve transmission reliability. The transmitting node may then modulate the encoded information according to a certain modulation scheme for transmission. A modulation scheme may have a certain constellation with certain constellation points, which may also be referred to as modulation symbols. A transmission using a modulation scheme may carry information represented by modulation symbols from a certain set of constellation points defined for the modulation scheme.

Traditional signal constellations, such as amplitude shift keying (ASK) and quadrature amplitude modulation (QAM), are characterized by constellation points with equal distance and each constellation point is transmitted with the same probability. Unfortunately, such constellations result in a gap to the Shannon limit. To close this gap and to increase the spectral efficiency, constellation shaping may be applied. For an additive white Gaussian noise (AWGN) channel, constellation shaping may offer gains (termed shaping gain)

up to 1.53 decibel (dB) in signal-to-noise ratio (SNR) by utilizing Gaussian shaped constellations.

A favorable performance with data rate close to the channel capacity may be achieved by a constellation with a Gaussian-like distribution. Geometric constellation shaping (GCS) and probabilistic amplitude shaping (PAS) are particular examples to provide non-uniform distribution of constellation using QAM. For GCS, each constellation point may be used with equal probability, while the location of the constellation points has an unequal distance and is arranged to mimic the capacity-achieving distribution. For PAS, or more generally, probabilistic constellation shaping (PCS), a constellation may be used, e.g., ASK or QAM, with constellation points having equal distance, and different probabilities may be assigned to different constellation points.

Distribution matching (DM) may be applied to a sequence of k uniformly distributed bits into a sequence of n symbols with a target or desired probability distribution. Here, the symbols may be from an alphabet. When a DM is used for constellation shaping, e.g., for PAS, the symbol alphabet may be related to the modulation scheme. For instance, for 16-QAM, the symbol alphabet may be $\{1, 3\}$, and for 64-QAM, the symbol alphabet may be $\{1, 3, 5, 7\}$. A composition may be an ordered tuple, counting the occurrences of each symbol in a symbol alphabet. For example, for the 16-QAM case, if the symbol sequences are of length 10, then (2, 8) may be an example of a composition, with 2 occurrences of is and 8 occurrences of 3 s. Constant composition distribution matching (CCDM) is a particular example of a DM. A particular characteristic of CCDM may be that all output symbol sequences have the same (e.g., identical) composition.

Fixed-to-fixed DM schemes may be used at transmitting nodes prior to encoding and at receiving nodes prior to decoding. A transmitting node may include an amplitude shaper, which may use fixed-to-fixed DM, and a receiving node may include an amplitude deshaper, which may use fixed-to-fixed distribution dematching. Fixed-to-fixed DM schemes may provide various benefits for wireless communication systems. Fixed-to-fixed DM schemes may be associated with fewer variations on data segmentation at a transmitting node, and fewer processing tasks to handle at a receiving node, both of which may result in increased energy efficiency at the transmitting node and/or the receiving node.

Existing fixed-to-fixed DM designs suffer from various issues. For example, CCDM may use a single composition and may suffer from a relatively large rate loss at small-to-medium sequence lengths. Multiset partition DM (MPDM) may need to predetermine a relatively large amount of information for composition selection, which may result in a relatively large storage complexity. Further, traditional sphere shaping (SS) also suffers from relatively high computational complexity.

Communications Using Multiple Composition DM Based on AC and Geometry-Specific Parameters In various aspects of techniques and apparatuses described herein, a transmitting node (e.g., a UE or a base station) may determine a set of geometry-specific parameters based at least in part on a symbol sequence length n and a target distribution. Geometry-specific parameters may be associated with a certain geometry, such as a generalized rectangle or an orthosimplex. A simplex may be a generalization of a triangle or a tetrahedron to arbitrary dimensions, and an orthosimplex may be a simplex having orthogonal segments. The transmitting node may determine K bits based at least in part on a plurality of information bits and a bit sequence length K that is geometry-specific. The transmitting node may map the K bits to a sequence of n symbols using AC based at least in part on the set of geometry-specific parameters. The transmitting node may transmit, via a transceiver of the transmitting node, the sequence of n symbols to a receiving node. The receiving node may receive, via a transceiver of the receiving node, a plurality of decoded symbols from the transmitting node. The plurality of decoded symbols may correspond to the sequence of n symbols transmitted by the transmitting node. The receiving node may determine n symbols based at least in part on the plurality of decoded symbols and a symbol sequence length n. The receiving node may determine a set of geometry-specific parameters based at least in part on the symbol sequence length n and a target distribution. The receiving node may demap the n symbols to a sequence of K bits using AC based at least in part on the set of geometry-specific parameters, and a bit sequence length K.

In some aspects, a fixed-to-fixed DM scheme, as described herein, may be designed to be based at least in part on generalized rectangles and/or orthosimplices (orthosimplexes). Further, compositions may be efficiently enumerated and cumulative distributions may be computed to perform DM based at least in part on AC, while keeping a rate loss as small as possible. Further, the fixed-to-fixed DM scheme may be based at least in part on multiple compositions, instead of a single composition as used by CCDM, which may keep the rate loss relatively small.

In some aspects, the fixed-to-fixed DM scheme, as described herein, may be based at least in part on the multiple compositions as opposed to a single composition, which may improve a rate loss for small-to-medium sequence lengths. The fixed-to-fixed DM scheme may store a relatively small amount of information for composition selection, which may result in a reduced storage complexity and/or a reduced computational complexity. The fixed-to-fixed DM scheme may result in less variations on data segmentation at the transmitting node, and may result in fewer processing tasks at the receiving node. The fixed-to-fixed DM scheme may efficiently enumerate compositions and compute cumulative distributions to perform DM based at least in part on AC, while keeping the rate loss as small as possible.

FIG. 3 is a diagram illustrating an example 300 associated with AC and geometry-specific parameters, in accordance with the present disclosure. As shown in FIG. 3, example 300 includes communication between a transmitting node (e.g., UE 120 or a network entity, such as base station 110) and a receiving node (e.g., UE 120 or a network entity, such as base station 110). In some aspects, the UE and the base station may be included in a wireless network, such as wireless network 100.

In some aspects, the transmitting node may be a UE and the receiving node may be a base station. In some aspects, the transmitting node may be a base station and the receiving node may be a UE. In some aspects, the transmitting node may be a first base station and the receiving node may be a second base station. In some aspects, the transmitting node may be a first UE and the receiving node may be a second UE.

Transmitting Node Operations

As shown by reference number 302, the transmitting node may perform transmitting node operations. For example, the transmitting node may determine a set of geometry-specific parameters based at least in part on a symbol sequence length n and a target distribution. The transmitting node may determine a sequence of K bits based at least in part on a plurality of information bits and a bit sequence length K that is geometry-specific. The transmitting node may map the sequence of K bits to a sequence of n symbols using AC based at least in part on the set of geometry-specific parameters.

In some aspects, the transmitting node may determine a plurality of compositions associated with a continuous region of a geometry. The transmitting node may map the sequence of K bits to a sequence of n symbols based at least in part on the plurality of compositions associated with the continuous region of the geometry. The geometry may be a generalized rectangle or an orthosimplex. Alternatively, the geometry may be associated with another type of geometric shape, such as a circle, square, ellipse, triangle, trapezoid, pentagon, hexagon, octagon, and so on. The transmitting node may select, based at least in part on the sequence of K bits, a composition from the plurality of compositions. The composition may be selected based at least in part on a probability distribution of the plurality of compositions. The probability distribution of the plurality of compositions may be based at least in part on the geometry-specific parameters. The transmitting node may encode, based at least in part on the composition selected from the plurality of compositions, the sequence of K bits into the sequence of n symbols, where the composition of the n symbols may be the composition selected, using AC based at least in part on the set of geometry-specific parameters.

For example, the composition of the mapped sequence of n symbols may be the $\mathcal{A}$-selected composition. For instance, for length n=4 and alphabet $\mathcal{A}=\{1, 3\}$, and original compositions (2, 2), (4, 0) and (0, 4). If, e.g., (2, 2) is the selected composition, then the mapping may generate a symbol sequence having this composition. e.g., (1, 3, 1, 3) with two 1s and two 3s.

In some aspects, the set of geometry-specific parameters may be associated with a generalized rectangle and the geometry may correspond to the generalized rectangle, and the set of geometry-specific parameters may indicate a center associated with the generalized rectangle and corners associated with the generalized rectangle. In some aspects, the transmitting node may determine the generalized rectangle associated with the set of geometry-specific parameters based at least in part on the symbol sequence length n and the target distribution.

In some aspects, the transmitting node may determine a set of reflecting rectangles based at least in part on the generalized rectangle. Generally speaking, a reflecting rectangle may be a generalized rectangle. The transmitting node may determine, based at least in part on the set of reflecting rectangles and the generalized rectangle, approximate multinomial coefficients corresponding to the plurality of compositions associated with the generalized rectangle. Here, the generalized rectangle may be a special generalized rectangle that may be referred to as an approximating rectangle, which may be used to approximate the multinomial coefficients of the plurality of compositions associated with that generalized rectangle. Generally speaking, an approximating rectangle may be a generalized rectangle (similar to the reflecting rectangle). In other words, the approximation of the multinomial coefficients may be based at least in part on both the set of reflecting rectangles and the generalized rectangle (or approximating rectangle). The transmitting node may determine, based at least in part on the approximate multinomial coefficients, the probability distribution associated with the generalized rectangle. The transmitting node may determine the bit sequence length K based at least in part on the probability distribution of the plurality of compositions associated with the generalized rectangle. The transmitting node may compute a cumulative distribution corresponding to the probability distribution associated with the plurality of compositions, where the plurality of compositions may be associated with the generalized rectangle. The transmitting node may select the composition from the plurality of compositions based at least in part on the computation of the cumulative distribution. In other words, the computation of the cumulative distribution may be used to determine the composition. The sequence of Kbits may be mapped to the sequence of n symbols based at least in part on the computation of the cumulative distribution, a rescaling associated with the sequence of K bits, and an encoder based at least in part on adaptive AC encoding.

As a simplified example, for a rectangle case, and after specifying the corners of the rectangle, three compositions (1, 2), (0, 3) and (3, 0) may result, meaning that symbol sequences of length 3 may be considered over an alphabet, say $\{a, b\}$, such that the symbol sequences may be (a, b, b), (b, a, b), (b, b, a), (a, a, a) and (b, b, b). These three compositions may be ordered as (0, 3)<(1, 2)<(3, 0). A probability distribution may be over $\{(0, 3), (1, 2), (3, 0)\}$, with probability 0.3, 0.5, 0.2, respectively. Then, if x is in an interval [0, 0.3), the composition (0, 3) may be selected. If x is in an interval [0.3, 0.8), then (1, 2) may be selected. If x is in an interval [0.8, 1), then (3, 0) may be selected. A computation of the cumulative distribution may be used (e.g., 0.3+0.5=0.8 and 0.3+0.5+0.2=1). This computation may be used in determining a composition, such that the K bits input may be mapped (using AC) to a symbol sequence having that composition. Also, a simple region (of compositions) may be preferred due to the need to efficiently enumerate the compositions, and to select one of the compositions based at least in part on computing the cumulative distribution and based at least in part on x.

In some aspects, the set of geometry-specific parameters may be associated with an orthosimplex and the geometry may correspond to the orthosimplex, and the set of geometry-specific parameters may indicate corners associated with the orthosimplex, and a slope vector and intercept of a function associated with the orthosimplex. In some aspects, the transmitting node may determine an orthosimplex associated with the set of geometry-specific parameters based at least in part on the symbol sequence length n and the target distribution.

In some aspects, the transmitting node may determine an approximating function based at least in part on the set of geometry-specific parameters associated with the orthosimplex. The transmitting node may determine an approximating measure using the approximating function. The transmitting node may determine, based at least in part on the approximating function and the approximating measure, approximate multinomial coefficients corresponding to the plurality of compositions associated with the orthosimplex. The transmitting node may determine the probability distribution of the plurality of compositions associated with the orthosimplex based at least in part on the approximate multinomial coefficients. The transmitting node may determine the bit sequence length K based at least in part on the probability distribution of the plurality of compositions associated with the orthosimplex. In some aspects, the transmitting node may compute a cumulative distribution corresponding to the probability distribution associated with the plurality of compositions, wherein the plurality of compositions may be associated with the orthosimplex. The transmitting node may select the composition from the plurality of compositions based at least in part on the computation of the cumulative distribution.

In some aspects, an input of the sequence of K bits may be interpreted as a dyadic number x in [0, 1). A mapping of the sequence of K bits may involve selecting a composition from a plurality of compositions (associated with a geometry-specific region of compositions), rescaling x to x', and encoding x'. The composition may be selected from the plurality of compositions based at least in part on the sequence of K bits. The plurality of compositions may be geometry-specific, e.g., a region in which a composition is selected may depends on whether the geometry corresponds to the generalized rectangle or the orthosimplex, as well as corresponding boundaries. In some aspects, when selecting the composition, the computation of the cumulative distribution as well as the rescaling of x may be involved.

In some aspects, when determining the plurality of compositions (or collection of compositions), the plurality of compositions may be a simple 'continuous' region, which may correspond to either the generalized rectangle or the orthosimplex. Since the plurality of compositions may form a simple region and every composition inside the region may be considered, few geometric-specific parameters may be characterized, e.g., corners, etc., to specify the compositions to be considered.

In some aspects, the composition may be selected from the plurality of compositions. The selection may depend on the probability distribution over the compositions and the input of the sequence of K bits (interpreted as the dyadic number x in [0,1).). The probability distribution may also depend on the geometry-specific parameters.

In some aspects, after selecting the composition, x may be rescaled into x'. When encoding the input of the sequence of K bits, the scaled x (x') and the selected composition may be used for AC encoding. Further, the bit length K may also be geometry-specific.

The transmitting node operations, with respect to generalized rectangles, are further described with respect to FIGS. 5 and 7. The transmitting node operations, with respect to orthosimplices, are further described with respect to FIGS. 13 and 15.

The transmitting node operations and the receiving node operations, with respect to generalized rectangles, are further described in FIGS. 4-10. The transmitting node operations and the receiving node operations, with respect to orthosimplices, are further described in FIGS. 11-17.

As shown by reference number 304, the transmitting node may transmit the sequence of n symbols to the receiving node. The receiving node may receive a plurality of decoded symbols from the transmitting node, where the plurality of decoded symbols may correspond to the sequence of n symbols transmitted to the receiving node. In some aspects, the symbol sequence length n may satisfy one or more statistical properties.

In some aspects, one key statistical property may be that, when the input K bits are independent and uniform over {0, 1}, the mapped sequence of n symbols may satisfy the following property: an ensemble average (where randomness may be over the input K bits) of the composition of the sequence of n symbols may be equal to the target composition.

Receiving Node Operations

As shown by reference number 306, the receiving node may perform receiving node operations. For example, the receiving node may determine a sequence of n symbols based at least in part on the plurality of decoded symbols and a symbol sequence length n. The receiving node may determine a set of geometry-specific parameters based at least in part on the symbol sequence length n and a target distribution. The receiving node may demap the sequence of n symbols to a sequence of K bits using AC based at least in part on the set of geometry-specific parameters and a bit sequence length K. In some aspects, the K bits may be associated with an estimate of transmitted information bits transmitted by the transmitting node.

In some aspects, to demap the sequence of n symbols to the sequence of K bits, the receiving node may determine a plurality of compositions associated with a continuous region of a geometry. The receiving node may determine a composition of the sequence of n symbols. The probability distribution of the plurality of compositions may be based at least in part on the geometry-specific parameters. The receiving node may decode, based at least in part on the composition selected from the plurality of compositions, the sequence of n symbols using AC based at least in part on the set of geometry-specific parameters and the bit sequence length K to obtain the sequence of K bits.

In some aspects, the set of geometry-specific parameters may be associated with a generalized rectangle and the geometry may correspond to the generalized rectangle, and the set of geometry-specific parameters may indicate a center associated with the generalized rectangle and corners associated with the generalized rectangle. In some aspects, the receiving node may determine the generalized rectangle associated with the set of geometry-specific parameters based at least in part on the symbol sequence length n and the target distribution.

In some aspects, the receiving node may determine a set of reflecting rectangles based at least in part on the generalized rectangle. The receiving node may determine, based at least in part on the set of reflecting rectangles and the generalized rectangle, approximate multinomial coefficients corresponding to the plurality of compositions associated with the generalized rectangle. The receiving node may determine, based at least in part on the approximate multinomial coefficients, the probability distribution of the plurality of compositions associated with the generalized rectangle. The receiving node may determine the bit sequence length K based at least in part on the probability distribution associated with the generalized rectangle. In some aspects, the receiving node may select a composition, from the plurality of compositions, of the sequence of n symbols. The sequence of n symbols may be demapped to the sequence of K bits based at least in part on a decoder based at least in part on adaptive AC decoding, a computation of a cumulative distribution corresponding to the probability distribution associated with the plurality of compositions, and a rescaling of an output of decoded K bits from the decoder.

In some aspects, the set of geometry-specific parameters may be associated with an orthosimplex and the geometry may correspond to the orthosimplex, and the set of geometry-specific parameters may indicate corners associated with the orthosimplex, and a slope vector and intercept of a function associated with the orthosimplex. In some aspects, the receiving node may determine the orthosimplex associated with the set of geometry-specific parameters based at least in part on the symbol sequence length n and the target distribution.

In some aspects, the receiving node may determine an approximating function based at least in part on the set of geometry-specific parameters associated with the orthosimplex. The receiving node may determine an approximating measure using the approximating function. The receiving node may determine, based at least in part on the approximating function and the approximating measure, approximate multinomial coefficients corresponding to the plurality of compositions associated with the orthosimplex. The receiving node may determine the probability distribution of the plurality of compositions associated with the orthosimplex based at least in part on the approximate multinomial coefficients. The receiving node may determine the bit sequence length K based at least in part on the probability distribution associated with the orthosimplex. In some aspects, the receiving node may select a composition, from the plurality of compositions, of the sequence of n symbols. The sequence of n symbols may be demapped to the sequence of K bits based at least in part on a decoder based at least in part on adaptive AC decoding, a computation of a cumulative distribution corresponding to the probability distribution associated with the plurality of compositions, and a rescaling of an output of decoded K bits from the decoder.

In some aspects, the demapping of the sequence of n symbols to the sequence of K bits may involve selecting, based at least in part on the sequence of n symbols, the composition from the plurality of compositions. The selection may involve counting occurrences of each symbol over the alphabet. Further, the demapping may involve decoding, based at least in part on the composition, the sequence of n symbols using AC based at least in part on the set of geometry-specific parameters and the bit sequence length K to obtain the sequence of K bits.

As indicated above, FIG. 3 is provided as an example. Other examples may differ from what is described with regard to FIG. 3.

The receiving node operations, with respect to generalized rectangles, are further described with respect to FIGS. 6 and 7. The receiving node operations, with respect to orthosimplices, are further described with respect to FIGS. 14 and 15.

The transmitting node operations and the receiving node operations, with respect to generalized rectangles, are further described in FIGS. 4-10. The transmitting node operations and the receiving node operations, with respect to orthosimplices, are further described in FIGS. 11-17.

Sequences, Compositions, and Target Composition

In some aspects, a sequence of length n over $\mathcal{A} = \{a_1, a_2, \ldots, a_m\}$ is an ordered n-tuple, each element of which takes values in alphabet $\mathcal{A}$. Both $\mathcal{A}$ and n are parameters but may be regarded as being given and fixed. A composition of length m over $[n] = \{0, 1, \ldots, n\}$ is an ordered m-tuple, all elements of which sum up to n. Given a sequence s of length n over $\mathcal{A}$, the composition of s is an ordered m-tuple $\vec{k}(s) = (k_1, k_2, \ldots, k_m)$, where for each i, $k_i$ is the number of occurrences of $a_i \in \mathcal{A}$ in the sequence s.

In a target composition, $\vec{q} = (q_1, q_2, \ldots, q_m)$ is an ordered m-tuple such that $q_1 \geq q_2 \geq \ldots q_m \geq 0$ and $q_1 + q_2 + \ldots + q_m = 1$, where $\vec{q}$ is referred to as a target distribution over alphabet A (e.g., a Maxwell-Boltzmann distribution), and where $\vec{q}$ is regarded as being given and is fixed throughout. Further, $$\vec{k}^* = (k_1^*, k_2^*, \ldots, k_m^*) = (nq_1, nq_2, \ldots, nq_m),$$

i.e., $$k_i^* = nq_i$$

for each i, where $\hat{k}^*$ is referred to as the target composition. Typically, a quantization procedure may be performed on n $\vec{q}$ to obtain $$(k_1^*, k_2^*, \ldots, k_m^*).$$

Consequently, $$2k_i^*$$

may be assumed to be an odd integer for each $i \geq 2$.

Rectangle-Shape Regions

In some aspects, with respect to generalized rectangle-shape regions, given a positive integer m, J may be a nonempty subset of $[m] = \{1, 2, \ldots, m\}$ with cardinality denoted by $|J|$. Further, $\vec{a}$ and $\vec{b}$ may be m-tuples such that $a_j < b_j$ for each $j \in J$. A generalized rectangle $P = P(J, \vec{a}, \vec{b})$ may be of the form of a product of intervals, e.g., $$P = \prod_{j \in J} [a_j, b_j] = \{\vec{x} \in \mathbb{R}^{|J|} \mid a_j \leq x_j \leq b_j, \forall j \in J\}.$$

FIG. 4 is a diagram illustrating an example 400 associated with a generalized rectangle-shaped region, in accordance with the present disclosure.

As shown in FIG. 4, a generalized rectangle-shaped region may be defined based at least in part on: $P = P(J, \vec{a}, \vec{b})$, which may be of the form of a product of intervals. In this example, m=3 and J={1, 2}. Further, in this example, the generalized rectangle-shaped region may be defined based at least in part on $a_1$ and $b_1$ in an $x_1$ dimension, and $a_2$ and $b_2$ in an $x_2$ dimension.

As indicated above, FIG. 4 is provided as an example. Other examples may differ from what is described with regard to FIG. 4.

Transmitting Node Using Generalized Rectangles

FIG. 5 is a diagram illustrating an example 500 associated with a distribution matcher used in a fixed-to-fixed DM scheme based at least in part on generalized rectangles, in accordance with the present disclosure.

In some aspects, a transmitting node may include a distribution matcher. The distribution matcher may include a transmitting or transmitter (Tx) buffer, an AC preprocessor, and an AC mapper.

In some aspects, input parameters of the AC preprocessor may include a symbol sequence length n, and a target distribution q over alphabet $\mathcal{A}$ of size m. In some aspects, outputs of the AC preprocessor may include a bit sequence length K, a center $\vec{p}$ and corners of $$\Pi_{i=2}^m [\underline{k}_i, \bar{k}_i],$$

and a normalizing constant Z. In other words, the outputs of the AC preprocessor may include an ordered m-tuple $\vec{p}$, an ordered m-tuple $\bar{k}$, an ordered m-tuple $\underline{k}$, a positive real number Z, and a positive integer K. With respect to the AC preprocessor, an output K may then be used by the Tx buffer to take a same number of information bits and to send the same number of information bits to the AC mapper, and other outputs may then be used by the AC mapper to perform a bit-to-symbol mapping.

In some aspects, input parameters to the AC mapper may include a sequence of K information bits from the Tx buffer. The input parameters to the AC mapper may further include the center $\vec{p}$ and corners of $$\Pi_{i=2}^{m}[\underline{k}_i, \overline{k}_i],$$

and the normalizing constant Z. In other words, the input parameters to the AC mapper may further include parameters $\vec{p}$, $\overline{k}$, $\underline{k}$ and Z from the AC preprocessor. In some aspects outputs of the AC mapper may include a sequence of n symbols over the alphabet $\mathcal{A}$, where an n-length symbol sequence has on average $k_i^*$ symbols of $a_i$ for each i. Further, with respect to the AC mapper, the AC mapper may implement a three-step scheme to perform the bit-to-symbol mapping. The AC mapper may utilize a DM scheme that is based at least in part on AC, and may be associated with a relatively low computational complexity.

As indicated above, FIG. 5 is provided as an example. Other examples may differ from what is described with regard to FIG. 5.

Receiving Node Using Generalized Rectangles

FIG. 6 is a diagram illustrating an example 600 associated with a distribution dematcher used in a fixed-to-fixed DM scheme based at least in part on generalized rectangles, in accordance with the present disclosure.

In some aspects, a receiving node may include a distribution dematcher. The distribution dematcher may include a receiving or receiver (Rx) buffer, an AC postprocessor, and an AC demapper.

In some aspects, input parameters of the AC postprocessor may include a symbol sequence length n, and a target distribution $\vec{q}$ over alphabet $\mathcal{A}$ of size m. In some aspects, outputs of the AC postprocessor may include a bit sequence length K. The outputs of the AC postprocessor may further include center $\vec{p}$ and corners of $$\prod_{i=2}^{m}[\underline{k}_i, \overline{k}_i],$$

and a normalizing constant Z. In other words, the outputs of the AC postprocessor may further include an ordered m-tuple $\vec{p}$, an ordered m-tuple $\overline{k}$, an ordered m-tuple $\underline{k}$, a positive real number Z, and a positive integer K. With respect to the AC postprocessor, an output n may then be used by the Rx buffer to take a same number of symbols and to send the symbols to the AC demapper, and other outputs may then be used by the AC demapper to perform a symbol-to-bit mapping.

In some aspects, input parameters to the AC demapper may include a sequence of n symbols from the Rx buffer and a bit sequence length K. The input parameters to the AC demapper may further include the center p and corners of $$\prod_{i=2}^{m}[\underline{k}_i, \overline{k}_i],$$

and the normalizing constant Z. In other words, the input parameters to the AC demapper may further include parameters $\vec{p}$, $\overline{k}$, $\underline{k}$ and Z from the AC postprocessor. In some aspects, outputs of the AC demapper may include a sequence of K bits, which may constitute estimates of the transmitted information bits. Further, with respect to the AC demapper, the AC demapper may implement a three-step scheme to perform the symbol-to-bit mapping. The AC demapper may utilize a DM scheme that is based at least in part on AC, and may be associated with a relatively low computational complexity.

As indicated above, FIG. 6 is provided as an example. Other examples may differ from what is described with regard to FIG. 6.

Fixed-to-Fixed DM Using Generalized Rectangles

FIG. 7 is a diagram illustrating an example 700 associated with a distribution matcher and a distribution dematcher used in a fixed-to-fixed DM scheme based at least in part on generalized rectangles, in accordance with the present disclosure.

In some aspects, for a fixed-to-fixed DM scheme using generalized rectangles, a transmitting node may include a distribution matcher (as shown in FIG. 5). The transmitting node may perform a first step at an AC preprocessor of the distribution matcher, a second step at a Tx buffer of the distribution matcher, and a third step at an AC mapper of the distribution matcher.

In some aspects, a receiving node may include a distribution dematcher (as shown in FIG. 6). The receiving node may perform a first step at an AC postprocessor of the distribution dematcher, a second step at an Rx buffer of the distribution dematcher, and a third step at an AC demapper of the distribution dematcher.

In some aspects, with respect to the first step performed at the transmitting node and the receiving node, the transmitting node and the receiving node may determine (e.g., via the AC preprocessor and the AC postprocessor, respectively) an approximating rectangle (e.g., a center and corners of the approximating rectangle), based at least in part on input parameters. The transmitting node and the receiving node may determine a specific set of reflecting rectangles based at least in part on the approximating rectangle. The transmitting node and the receiving node may approximate multinomial coefficients corresponding to a collection of compositions specified by the approximating rectangle by an exponential of an affine function.

In some aspects, with respect to the first step performed at the transmitting node and the receiving node, the transmitting node and the receiving node may determine a probability distribution of the plurality of compositions associated with the approximating rectangle based at least in part on an approximation. The transmitting node and the receiving node may determine a bit sequence length based at least in part on the probability distribution.

In some aspects, with respect to the second step performed by the transmitting node, the transmitting node may take K bits from the Tx buffer and provide the K bits to the AC mapper.

In some aspects, with respect to the third step performed at the transmitting node, the transmitting node may develop (e.g., via the AC mapper) a bit-to-symbol mapping based at least in part on a three-step scheme. A first two steps of the three-step scheme may involve a computation scheme of a cumulative distribution corresponding to the probability distribution (as determined in the first step). The third step of the three-step scheme may involve a standard CCDM encoder based at least in part on an adaptive AC encoding algorithm.

In some aspects, with respect to the second step performed by the receiving node, the receiving node may take n symbols from the Rx buffer and provide the n symbols to the AC demapper In some aspects, with respect to the third step performed at the receiving node, the receiving node may develop (e.g., via the AC demapper) a symbol-to-bit mapping based at least in part on a three-step scheme. A first step of the three-step scheme may involve a standard CCDM decoder based at least in part on an adaptive AC decoding algorithm. The last two steps of the three-step scheme may involve the computation scheme of the cumulative distribution corresponding to the probability distribution (as determined in the first step).

As indicated above, FIG. 7 is provided as an example. Other examples may differ from what is described with regard to FIG. 7.

Composition Selection

In some aspects, with respect to the first step performed by the transmitting node and the receiving node (as shown in FIG. 7, a region for selecting compositions may be a generalized rectangle in $\mathbb{R}^{m-1}$ with m being the alphabet size. The generalized rectangle may be formed by taking a convex hull of a union of an approximating rectangle and $2^{m-1}-1$ reflecting rectangles. Coordinates for constructing the generalized rectangles may form a subset J of {1, 2, . . . , m} with cardinality m−1. As a result, specifying values of a composition along J may determine that composition. With respect to conditions on a choice of region and a choice of coordinates, for any composition specified by the approximating rectangle, a corresponding multinomial coefficient may satisfy $$\binom{n}{R_I(\vec{k})} \geq \binom{n}{\vec{k}},$$

a reflection condition, where $$\left(R_I(\vec{k})\right)_i = \begin{cases} k_i & i \in I \\ 2k_i^* - k_i & i \notin I \end{cases},$$

and where I ranges over any subset of J.

Approximating Rectangle

In some aspects, during the composition selection, the transmitting node may determine the approximating rectangle, e.g., a center and corners of the approximating rectangle, based at least in part on input parameters. The center and corners of the approximating rectangle may be geometry-specific parameters. The transmitting node may determine the approximating rectangle associated with the geometry-specific parameters based at least in part on a symbol sequence length n and a target distribution.

In some aspects, with respect to the approximating rectangle, J={2, 3, . . . , m}=[m]\{1} may be taken as the choice of coordinates, and $\underline{k}$ and $\overline{k}$ may be compositions of length mover [n] such that $\underline{k}_i < \overline{k}_i$ and that $$\overline{k}_i < k_i^*$$

for each i∈ J. The approximating rectangle A may be defined as $$A = A(J, \underline{k}, \overline{k}) = \prod\nolimits_{i=2}^m [\underline{k}_i, \overline{k}_i],$$

where $\vec{k}^*$ may be the target composition. Further, the notation $\vec{k} \in A$ means the (m−1)-tuple of $\vec{k}$ along coordinates in J is in A, and determining the approximating rectangle may amount to determining its corners.

In some aspects, with respect to the approximating rectangle and a determination of $\overline{k}$, for each i∈ J, $\overline{k}_i = k_i^* - \frac{1}{2}$, and since $$2k_i^*$$

is odd, $\overline{k}_i$ is an integer. Further, $\overline{k}_1$ may be obtained by subtracting from n the sum of all $\overline{k}_i$ over J.

FIG. 8 is a diagram illustrating an example 800 associated with performing operations associated with generalized rectangles, in accordance with the present disclosure. As shown in FIG. 8, $\overline{k}$ may be determined for an approximating rectangle. The approximating rectangle A may be defined as $$A = A(J, \underline{k}, \overline{k}) = \prod\nolimits_{i=2}^m [\underline{k}_i, \overline{k}_i],$$

where $\vec{k}^*$ is the target composition, and $\underline{k}$ and $\overline{k}$ may be compositions of length m over [n]. Further, $\overline{k}_i = k_i^* - \frac{1}{2}$, and $\overline{k}_i$ is an integer, and $\overline{k}_1$ may be obtained by subtracting from n the sum of all $\overline{k}_i$ over J. In this example, m=4, and a point associated with ($\overline{k}_2$, $\overline{k}_3$, $\overline{k}_4$) may be defined. As indicated above, FIG. 8 is provided as an example. Other examples may differ from what is described with regard to FIG. 8.

In some aspects, with respect to the approximating rectangle and a determination of center $\vec{p}$, for a suitable design parameter C, an ordered m-tuple $\vec{p}$ with positive elements may first be determined by setting for each i≥2 that $\overline{k}_i - np_i = C$ $\sqrt{np_i}$. Each $p_i$ may then be rounded to a closest point in a lattice Z/2 so that $2np_i$ is an integer, and subtracting from 1 the sum of all $p_i$ over J determines $p_1$.

In some aspects, with respect to the approximating rectangle and a determination of $\underline{k}$, for each i≥2, $\underline{k}_i$ may be determined by $\overline{k}_i - np_i = np_i - \underline{k}_i$ (e.g., by setting $\underline{k}_i = 2np_i - \overline{k}_i$). Then, $\underline{k}_1$ may be obtained by subtracting from n the sum of all $\underline{k}_i$ over J.

FIG. 9 is a diagram illustrating an example 900 associated with performing operations associated with generalized rectangles, in accordance with the present disclosure. As shown in FIG. 9, for each i≥2, $\underline{k}_i$ may be determined by $\overline{k}_i - np_i = np_i - \underline{k}_i$, e.g., by setting $\underline{k}_i = 2np_i - \overline{k}_i$, and $\underline{k}_1$ may be obtained by subtracting from n the sum of all $\underline{k}_i$ over J. In this example, points associated with ($\overline{k}_2$, $\overline{k}_3$, $\overline{k}_4$), ($k_2^*$, $k_3^*$, $k_4^*$), $k_4^*$, $\overline{k}_4$, $np_4$, and $\underline{k}_4$ may be defined. As indicated above, FIG. 9 is provided as an example. Other examples may differ from what is described with regard to FIG. 9.

In some aspects, the design parameter C may result in a two-fold effect. First, the design parameter C may control a tradeoff between a multinomial coefficient approximation and a size of the approximating rectangle. Second, the design parameter C may determine whether a reflection condition is satisfied. A sufficient condition to check whether the reflection condition holds is that, for each i≥2, $$k_i^* \le k_1^* - \sum_{j=2}^{i-1} \eta_j,$$

where $\eta_j = 2\Delta_j + \frac{1}{2}$, and $\vec{\Delta} \in \mathbb{R}^m$ satisfies $\Delta_i = \bar{k}_i - np_i$ for i≥2 and $\Delta_1 = -\Delta_2 - \ldots - \Delta_m$. Further, for a short-to-medium sequence length n, a choice of C may be $C = \sqrt{\ln(3/2)/(2m)}$.

Reflecting Rectangles

In some aspects, during the composition selection, the transmitting node may determine a specific set of reflecting rectangles based at least in part on the approximating rectangle (or generalized rectangle).

In some aspect, with respect to the reflecting rectangles, I may be a nonempty subset of J. A reflecting rectangle R(I) may be defined as $R(I) = Hull(\{R_f(\vec{k}) | \vec{k} \in A\})$. Here, Hull(•) stands for taking a convex hull operation, and letting I range over all nonempty subsets of J determines $2^{m-1} - 1$ reflecting rectangles.

FIG. 10 is a diagram illustrating an example 1000 associated with performing operations associated with generalized rectangles, in accordance with the present disclosure. As shown in FIG. 10, reflecting rectangles may be defined. When I is a nonempty subset of J, the reflecting rectangle R(I) may be defined by $R(I) = Hull(\{R_f(\vec{k}) | \vec{k} \in A\})$, where Hull(•) stands for taking the convex hull operation, and letting I range over all nonempty subsets of J may determine $2^{m-1} - 1$ reflecting rectangles. As indicated above, FIG. 10 is provided as an example. Other examples may differ from what is described with regard to FIG. 10.

Approximation of Multinomial Coefficients

In some aspects, during the composition selection, the transmitting node may approximate multinomial coefficients corresponding to a collection of compositions specified by the approximating rectangle by an exponential of an affine function. The transmitting node may determine approximate multinomial coefficients corresponding to a plurality of compositions associated with the generalized rectangle based at least in part on the set of reflecting rectangles and the generalized rectangle.

In some aspects, with respect to an approximation of multinomial coefficients, for any composition in the approximating rectangle A, a corresponding multinomial coefficient may be approximated by:

$$\ln\binom{n}{\vec{k}} \ge C(n, \vec{p}) - \sum_{i=1}^{m} k_i \ln(p_i) - E(n, \vec{p}, \vec{\delta}),$$

where $\vec{k} \in A$ and $\vec{p}$ is the center of A. Further, $\vec{\delta} = (\vec{k} - n\vec{p})/n$ such that the sum of all its elements is zero. Functions C(n, $\vec{p}$) and E(n, $\vec{p}$, $\vec{\delta}$) may be respectively defined as:

$$C(n, \vec{p}) = \ln\frac{\sqrt{2\pi}}{e^m} + \frac{1}{2}\left(\ln(n) - \sum_{i=1}^{m} \ln(p_i n)\right)$$

$$E(n, \vec{p}, \vec{\delta}) = n\left(\sum_{i=2}^{m} \frac{(\delta_i)^2}{p_i} + \frac{\left(\sum_{i=2}^{m} \delta_i\right)^2}{p_1}\right) + \frac{1}{2}\sum_{i=2}^{m}\left(\frac{1}{p_i} - \frac{1}{p_1}\right)\delta_i.$$

Further, continuing lower bounding E(n, $\vec{p}$, $\vec{\delta}$) may provide:

$$\ln\binom{n}{\vec{k}} \ge C(n, \vec{p}, \vec{\Delta}) - \sum_{i=1}^{m} k_i \ln(p_i).$$

Here, a lower bound may be linear in each $k_i$, and $C(n, \vec{p}, \vec{\Delta}) = C(n, \vec{p}) - E(n, \vec{p}, \vec{\Delta})$ and $\vec{\Delta} \in \mathbb{R}^m$. $\mathbb{R}$ Probability Assignment In some aspects, during the probability assignment, the transmitting node may determine a probability distribution over the approximating rectangle based at least in part on the approximation of multinomial coefficients. The transmitting node may determine the probability distribution of the plurality of compositions associated with the generalized rectangle based at least in part on the approximate multinomial coefficients.

In some aspects, with respect to the first step performed by the transmitting node and the receiving node (as shown in FIG. 7), for any subset $I \subseteq J = \{2, 3, \ldots, m\}$, a reflecting operation $R_f(\bullet)$ may be defined by setting:

$$\left(R_f(\vec{k})\right)_i = \begin{cases} k_i & i \in I \\ 2k_i^* - k_i & i \notin I \end{cases},$$

where $R_f(\vec{k})$ is a composition of length m over [n]. Further, $\vec{k}$ may be a composition of length m over [n] and an index i ranges in J, and $(R_f(\vec{k}))_1$ may be obtained by subtracting the sum of all $(R_f(\vec{k}))_i$ over J from n.

In some aspects, with respect to the approximation of multinomial coefficient approximation, a function N(•) may be defined by setting:

$$\ln N(\vec{k}) = \ln N\left(R_f(\vec{k})\right) = C(n, \vec{p}, \vec{\Delta}) - \sum_{i=1}^{m} k_i \ln(p_i),$$

where $\vec{k} \in A$, and such that $\vec{k}$ and all $2^{m-1} - 1$ $R_f(\vec{k})$ receive the same approximation. Further, I ranges over all nonempty subsets of J, and a result may be subsequently used to define a probability distribution over the compositions in the approximating rectangle.

Probability Distribution over Compositions in Alphabet

In some aspects, with respect to the probability distribution over the compositions in A, a probability distribution p over the compositions in the approximating rectangle A may be defined by setting $$p(\vec{k}) = \frac{1}{Z} e^{-\sum_{i=2}^{m} k_i \ln\frac{p_i}{p_1}},$$

where $\vec{k} \in A$ and $p(\vec{k})$ is proportional to $N(\vec{k})$.

In some aspects, the probability distribution p may have the following equivalent form:

$$p(\vec{k}) = \frac{1}{Z} e^{-\sum_{i=2}^{m} k_i \ln\frac{p_i}{p_1}},$$

where, using this equation, the center $\vec{p}$ and Z may be used to evaluate $p(\vec{k})$ for a given $\vec{k}$.

In some aspects, the normalizing constant Z may be obtained by computing:

$$Z = \prod_{i=2}^{m} \frac{e^{-(\bar{k}_i+1)\ln\frac{p_i}{p_1}} - e^{-k_i\ln\frac{p_i}{p_1}}}{e^{-\ln\frac{p_i}{p_1}} - 1}.$$

Determination of K

In some aspects, during the probability assignment, the transmitting node may determine a bit sequence length K based at least in part on the probability distribution over the approximating rectangle. In other words, the transmitting node may determine the bit sequence length K based at least in part on the probability distribution associated with the generalized rectangle.

In some aspects, the bit sequence length K may be defined as:

$$K = m - 1 + \left\lfloor \log_2 \left( \sum_{\vec{k} \in A} N(\vec{k}) \right) \right\rfloor,$$

where $N(\vec{k})$ is the lower bound on the multinomial coefficient corresponding to the composition $\vec{k}$.

In some aspects, using the formula of N(•), the bit sequence length K may be written in a simplified form as:

$$\sum_{\vec{k} \in A} N(\vec{k}) = e^{C\left(n,\vec{p},\vec{\Delta}\right) - n\ln(p_1)} Z,$$

and then the bit sequence length K may be written as:

$$K = m - 1 + \left\lfloor \log_2(Z) + \left( C\left(n, \vec{p}, \vec{\Delta}\right) - n\ln(p_1) \right) \log_2(e) \right\rfloor,$$

which may be used for the computation of K. Further, the bit-to-symbol and symbol-to-bit mappings may guarantee the uniqueness of the mappings of any K bits.

Bit-to-Symbol Mapping Using AC

In some aspects, based at least in part on the composition selection and the probability assignment, the transmitting node may develop a distribution matcher. For example, in a three-step scheme, the transmitting node may perform a computation of a cumulative distribution corresponding to the probability distribution over the approximating rectangle. Further, in the three-step scheme, the transmitting node may implement an adaptive AC encoding algorithm using a standard CCDM encoder.

In some aspects, the transmitting node may map the sequence of K bits to a sequence of n symbols based at least in part on the computation of the cumulative distribution, a rescaling associated with the sequence of K bits and an encoder based at least in part on adaptive arithmetic coding encoding.

In some aspects, with respect to the second step performed by the transmitting node (as shown in FIG. 7), K bits may be taken from the Tx buffer and provided to the AC mapper.

In some aspects, with respect to the third step performed by the transmitting node (as shown in FIG. 7), with respect to an ordering of generalized rectangles, an order may be defined among the approximating rectangle A and all reflecting rectangles R(I) with I being a nonempty subset of J. Further, for any subset I⊆J, $\vec{b}$(I) may be the ordered (m−1)-tuple indexed by [m−1] defined by setting:

$$\left(\vec{b}(I)\right)_j = \begin{cases} 1 & \text{if } j+1 \in I \\ 0 & \text{if } j+1 \notin I' \end{cases}$$

where the notation $(\vec{b}(I))_{10}$ may be used to denote the decimal representation of $\vec{b}$(I). Further, for a {0, 1}-valued (m−1)-tuple $\vec{b}$, I($\vec{b}$) may be defined as I($\vec{b}$)={i∈J|b$_{i-1}$=1}. Then, for subsets I and I' of J, R(I)≤R(I') if and only if $(\vec{b}(I))_{10} \leq (\vec{b}(I'))_{10}$, where A=R(∅).

In some examples, with respect to an ordering of compositions, an order may be defined among compositions of length m over [n]. A lexicographical ordering along coordinates in may be used to order compositions. Further, $\vec{w}$ and $\vec{z}$ may be compositions of length m over [n], where $\vec{w}$> $\vec{z}$ if and only if for some i∈J, $w_i$>$z_i$ and $w_j$=$z_j$ for all j>i.

Cumulative Distribution Computation

In some aspects, the transmitting node may compute the cumulative distribution corresponding to the probability distribution associated with the plurality of compositions, where the plurality of compositions may be associated with the generalized rectangle.

In some aspects, with respect to a preparation for the cumulative distribution, a function $G_m$: $\mathbb{R}^m \to \mathbb{R}$ may be defined as:

$$G_m(\vec{z}) = \mathbb{1}_{\{\vec{z} \in A\}} \prod_{i=2}^{m} \frac{e^{-(\bar{k}_i+1)\ln\frac{p_i}{p_1}} - e^{-z_i\ln\frac{p_i}{p_1}}}{e^{-\ln\frac{p_i}{p_1}} - 1},$$

where a definition of $G_m$ may depend on $\vec{p}, \bar{k}$, and $\underline{k}$. Further, $\mathbb{1}$ stands for an indicator function and takes value 1 if $\vec{z} \in A$ and 0 otherwise. For each integer k ranging from m−1 down to 1, the function $G_k$: $\mathbb{R}^m \to \mathbb{R}$ may be recursively defined by setting $G_k(\vec{z}) = G_{k+1}(\vec{z}) - G_{k+1}(\vec{z} + \vec{e}_{k+1})$, where $\vec{e}_k$ corresponds to (0, . . . , 0, 1, 0, . . . , 0), and where "1" corresponds to an index of k+1. Further, $\vec{e}_{k+1}$ denotes the standard basis vector of $\mathbb{R}^m$ along coordinate k+1.

In some aspects, the computation of the cumulative distribution may use the following notation. For each k∈{2, 3, . . . , m}, the notation $(\vec{0}_{<k}, z_k, z_{>k})$ may denote an ordered (m−1)-tuple such that the following holds: $\vec{0}_{<k}$ denotes the ordered (k−2)-tuple, all elements of which are equal to 0, and $\vec{z}_{>k}$ denotes the ordered (m−k)-tuple ($z_{k+1}$, $z_{k+2}$, . . . , $z_m$). The (m−1)-tuple may specify a composition of length m over [n], with the last m−1 elements corresponding to ($\vec{0}_{<k}$, $z_k$, $\vec{z}_{>k}$). Further, this type of notation may be used as the argument of the functions $G_k$.

In some aspects, with respect to the computation for the cumulative distribution, based at least in part on the ordering of the compositions in A, the cumulative distribution of p evaluated at $\vec{z}$ may be defined as:

$$F(\vec{z}) = \sum_{\vec{w} \in A: \vec{w} \le \vec{z}} p(\vec{w}).$$

In some aspects, with respect to the computation for the cumulative distribution, a recursive procedure may be used that realizes an inclusion-exclusion principle in order to compute the cumulative distribution. Given $x \in [0, 1)$, the procedure may recursively find $\vec{z}^* \in A$ such that $x < F(\vec{z}^*)$ and $x \ge F(\vec{w})$ for all $\vec{w} < \vec{z}^*$, and output $\vec{z}^*$ and $F(\vec{z}^*)$. The recursive procedure may initialize $r_m = (1-x)Z$ and initialize $l=m$, and initialize $G^c=0$. For l ranging from m down to 2, the procedure may involve determining $z_l^* \in [\underline{k}_l, \overline{k}_l]$ such that $$G_l\left(\vec{0}_{<l}, z_l^* + 1, \vec{z}_{>l}^*\right) < r_l \le G_l\left(\vec{0}_{<l}, z_l^*, \vec{z}_{>l}^*\right),$$

which may adhere to a strict monotonicity of $G_l$ along coordinate l. Further, the procedure may involve computing $$r_{l-1} \text{ by } r_{l-1} = r_l - G_l\left(\vec{0}_{<l}, z_l^* + 1, \vec{z}_{>l}^*\right).$$

Further, the procedure may involve incrementing $$G^c \text{ by } G_l\left(\vec{0}_{<l}, z_l^* + 1, \vec{z}_{>l}^*\right).$$

The cumulative distribution evaluated at $\vec{z}^*$ may be determined by $F(\vec{z}^*)=1-G^c/Z$. Further, the computation of the cumulative distribution of p may be later used in both the bit-to-symbol mapping and the symbol-to-bit mapping.

In some aspects, with respect to the third step performed by the transmitting node (as shown in FIG. 7), the three-step scheme may be involved to perform the bit-to-symbol mapping. A first step in the three-step scheme may involve a cumulative distribution computation. A second step in the three-step scheme may involve a composition determination. A third step in the three-step scheme may involve a CCDM encoding.

In some aspects, with respect to the cumulative distribution computation in the three-step scheme associated with the bit-to-symbol mapping, input K bits may be viewed as the dyadic number $x \in [0, 1)$ with binary expansion 0. $x_1 x_2 \ldots x_K$. The scheme may determine $\vec{z}^*$ and $F(\vec{z}^*)$ such that $x < F(\vec{z}^*)$ and $x \ge F(\vec{w})$ for all $\vec{w} < \vec{z}^*$, and in particular, $x \in [F(\vec{z}^*)-p(\vec{z}^*), F(\vec{z}^*))$ may be implied, such that $p(\vec{z}^*)=G_0(\vec{z}^*)$.

In some aspects, with respect to the composition determination in the three-step scheme associated with the bit-to-symbol mapping, the scheme may determine the integer $i \in [2^{m-1}]=\{1, 2, \ldots, 2^{m-1}\}$ (e.g., by a bisection technique), such that $x \in [F^-, F^+)$, where:

$$F^- = F(\vec{z}^*) - \left(1 - (i-1)2^{1-m}\right)p(\vec{z}^*)$$
$$F^+ = F(\vec{z}^*) - \left(1 - i2^{1-m}\right)p(\vec{z}^*),$$

where $[F^-, F^+)$ is a subinterval of $[F(\vec{z}^*)-p(\vec{z}^*), F(\vec{z}^*))$. Then, $\vec{b}(i)$ may be the ordered $(m-1)$-tuple corresponding to the binary representation of $i-1$. Based at least in part on x, $F^-$, and $F^+$, the scheme may compute x' by setting $$x' = \frac{x - F^-}{F^+ - F^-}.$$

Further, with $I=I(\vec{b}(i))$, the scheme may select composition $R_I(\vec{z}^*)$ in the approximating or reflecting rectangle R(I).

In some aspects, with respect to the CCDM encoding in the three-step scheme associated with the bit-to-symbol mapping, based at least in part on x' and $R_I(\vec{z}^*)$, the scheme may perform standard CCDM encoding to generate the corresponding length-n symbol sequence. The composition of this length-n symbol sequence may be $R_I(\vec{z}^*)$.

Symbol-to-Bit Mapping Using AC

In some aspects, based at least in part on the composition selection and the probability assignment, the receiving node may develop a distribution dematcher. For example, in a three-step scheme, the receiving node may implement an adaptive AC decoding algorithm using a standard CCDM decoder. Further, in the three-step scheme, the receiving node may perform a computation of the cumulative distribution corresponding to the probability distribution over the approximating rectangle.

In some aspects, with respect to the second step performed by the receiving node (as shown in FIG. 7), n symbols may be taken from the Rx buffer and provided to the AC demapper.

In some aspects, with respect to the third step performed by the receiving node (as shown in FIG. 7), the three-step scheme may be used to perform the symbol-to-bit mapping. A first step in the three-step scheme may involve a CCDM decoding. A second step in the three-step scheme may involve a cumulative distribution computation. A third step in the three-step scheme may involve a final delivery of transmitted bits.

In some aspects, with respect to the CCDM decoding in the three-step scheme associated with the symbol-to-bit mapping, the scheme may first determine the composition $\vec{z}$ of the length-n symbol sequence (e.g., by counting the occurrences of each symbol). The scheme may then map the symbol sequence to the corresponding length-K bit sequence based on $\vec{z}$ by a standard CCDM decoder. These K decoded bits may then be viewed as the dyadic number $x' \in [0, 1)$ with binary expansion $$0.x_1' x_2' \ldots x_K'.$$

In some aspects, with respect to the cumulative distribution computation in the three-step scheme associated with the symbol-to-bit mapping, based at least in part on the composition $\vec{z}$, the scheme may determine the cumulative distribution evaluated at $\vec{z}$ by directly computing:

$$F(\vec{z}) = 1 - \frac{1}{Z}\sum_{l=2}^{m} G_l\left(\vec{0}_{<l}, z_l + 1, \vec{z}_{>l}\right),$$

where $G_l$ is dependent on $\vec{p}$, $\overline{k}$ and $\underline{k}$. Further, b may be the ordered (m−1)-tuple such that, for each $$i \in [m-1], \, b_i = 1 \text{ if } z_{i+1} > k_{i+1}^+ \text{ and } b_i = 0$$

otherwise. The scheme may then determine $F^-$ and $F^+$ by computing:

$$F^- = F(\vec{z}) - \left(1 - \left(i(\vec{b}) - 1\right)2^{1-m}\right)p(\vec{z})$$

$$F^+ = F(\vec{z}) - \left(1 - i(\vec{b})2^{1-m}\right)p(\vec{z}).$$

Further, $i(\vec{b})$ denotes the unique integer in $[2^{m-1}]=\{1, 2, \ldots, 2^{m-1}\}$ such that $\vec{b}$ corresponds to its binary representation of $i(\vec{b})-1$.

In some aspects, with respect to the final delivery of transmitted bits in the three-step scheme associated with the symbol-to-bit mapping, the scheme may compute $x=F^-+(F^+-F^-)x'$ and may take a first K bits of a binary expansion of x as an output bit sequence.

Simplices and Orthosimplices

In some aspects, with respect to a simplex, given integers m and n, the simplex S=S(m, n) may be defined as:

$$S(m, n) = \left\{\vec{x} \in \mathbb{R}^m \,\middle|\, \sum_{i=1}^{m} x_i = n, x_i \geq 0, \forall i\right\},$$

where S(m, n) consists of all compositions corresponding to length-n sequences over an alphabet of size m.

FIG. 11 is a diagram illustrating an example 1100 associated with a simplex, in accordance with the present disclosure.

As shown in FIG. 11, a simplex may be defined based at least in part on:

$$S(m, n) = \left\{\vec{x} \in \mathbb{R}^m \,\middle|\, \sum_{i=1}^{m} x_i = n, x_i \geq 0, \forall i\right\}.$$

In this example, where m=3, the simplex S(3, n)=$\{\vec{x} \in \mathbb{R}^3 | x_1+x_2+x_3=n, \ x_1\geq0, \ x_2\geq0, \ x_3\geq0\}$ may be defined.

As indicated above, FIG. 11 is provided as an example. Other examples may differ from what is described with regard to FIG. 11.

In some aspects, given a positive integer d, and vectors $\vec{c} \in \mathbb{R}^d$ and $\vec{\gamma} \in \mathbb{R}^d$, an orthosimplex $\Delta=\Delta_d(\vec{c}, \vec{\gamma})$ may be defined as:

$$\Delta_d(\vec{c}, \vec{\gamma}) = \left\{\vec{x} \in \mathbb{R}^d \,\middle|\, \sum_{i=1}^{d} \frac{x_i - c_i}{\gamma_i} \leq 1, x_i \geq c_i, \forall i\right\},$$

where each element of the vector $\vec{\gamma}$ may be assumed to take nonzero values only.

FIG. 12 is a diagram illustrating an example 1200 associated with an orthosimplex, in accordance with the present disclosure.

As shown in FIG. 12, an orthosimplex may be defined based at least in part on:

$$\Delta_d(\vec{c}, \vec{\gamma}) = \left\{\vec{x} \in \mathbb{R}^d \,\middle|\, \sum_{i=1}^{d} \frac{x_i - c_i}{\gamma_i} \leq 1, x_i \geq c_i, \forall i\right\}.$$

In this example, where d=2, the orthosimplex $\Delta_d(\vec{c}, \vec{\gamma})=\{\vec{x} \in \mathbb{R}^2 | (x_1-c_1)/\gamma_1+(x_2-c_2)/\gamma_2\leq1, \ x_1\geq c_1, \ x_2\geq c_2\}$ may be defined.

As indicated above, FIG. 12 is provided as an example. Other examples may differ from what is described with regard to FIG. 12.

Transmitting Node Using Orthosimplices

FIG. 13 is a diagram illustrating an example 1300 associated with a distribution matcher used in a fixed-to-fixed DM scheme based at least in part on orthosimplices, in accordance with the present disclosure.

In some aspects, a transmitting node may include a distribution matcher. The distribution matcher may include a Tx buffer, an AC preprocessor, and an AC mapper.

In some aspects, input parameters of the AC preprocessor may include a symbol sequence length n, and a target distribution $\vec{q}$ over alphabet A of size m. In some aspects, outputs of the AC preprocessor may include a bit sequence length K, corners of an orthosimplex $\Delta_d(\vec{c}, s^*\vec{\gamma})$, a slope vector $\vec{a}$ and intercept b of a function $f$, and a normalizing constant $\mu(\Delta)$. In other words, the outputs of the AC preprocessor may include a d-dimensional vector $\vec{c}$, a d-dimensional vector $\vec{\gamma}$, a real positive number s*, a d-dimensional vector a, a real number b, a positive real number $\mu(\Delta)$, and a positive integer K. With respect to the AC preprocessor, an output K may then be used by the Tx buffer to take a same number of information bits and to send the same number of information bits to the AC mapper, and other outputs may then be used by the AC mapper to perform a bit-to-symbol mapping.

In some aspects, input parameters to the AC mapper may include a sequence of K information bits from the Tx buffer. The input parameters to the AC mapper may further include the corners of the orthosimplex $\Delta_d(\vec{c}, s^*\vec{\gamma})$, the slope vector $\vec{a}$ and intercept b of the function $f$, and the normalizing constant $\mu(\Delta)$. In other words, the input parameters to the AC mapper may further include parameters $\vec{c}$, $\vec{\gamma}$, s*, $\vec{a}$, b and $\mu(\Delta)$ from the AC preprocessor. In some aspects, outputs of the AC mapper may include a sequence of n symbols over the alphabet A, where an n-length symbol sequence has on average $k_i^*$ symbols of $a_i$ for each i. Further, with respect to the AC mapper, the AC mapper may implement a two-step scheme to perform the bit-to-symbol mapping. The AC mapper may utilize a DM scheme that is based at least in part on AC, and may be associated with a relatively low computational complexity.

As indicated above, FIG. 13 is provided as an example. Other examples may differ from what is described with regard to FIG. 13.

The transmitting node operations, with respect to orthosimplices, are further described with respect to FIGS. 13 and 15.

Receiving Node Using Orthosimplices

FIG. 14 is a diagram illustrating an example 1400 associated with a distribution dematcher used in a fixed-to-fixed DM scheme based at least in part on orthosimplices, in accordance with the present disclosure.

In some aspects, a receiving node may include a distribution dematcher. The distribution dematcher may include an Rx buffer, an AC postprocessor, and an AC demapper.

In some aspects, input parameters of the AC postprocessor may include a symbol sequence length n, and a target distribution $\vec{q}$ over alphabet A of size m. In some aspects, outputs of the AC postprocessor may include a bit sequence length K. The outputs of the AC postprocessor may further include corners of an orthosimplex $\Delta_d(\vec{c},s^*\vec{\gamma})$, a slope vector $\vec{a}$ and intercept b of a function $f$, and $p(\Delta)$ and bit sequence length K. In other words, the outputs of the AC postprocessor may further include a d-dimensional vector $\vec{c}$, a d-dimensional vector $\vec{\gamma}$, a real positive number $s^*$, a d-dimensional vector $\vec{a}$, a real number b, a positive real number $\mu(\Delta)$, and positive integers K and n. With respect to the AC postprocessor, an output n may then be used by the Rx buffer to take a same number of symbols and to send the symbols to the AC demapper, and other outputs may then be used by the AC demapper to perform a symbol-to-bit mapping.

In some aspects, input parameters to the AC demapper may include a sequence of n symbols from the Rx buffer. The input parameters to the AC demapper may further include the corners of the orthosimplex $\Delta_d(\vec{c},s^*\vec{\gamma})$, the slope vector $\vec{a}$ and intercept b of the function $f$, and $\mu(\Delta)$ and bit sequence length K. In other words, the input parameters to the AC demapper may further include the d-dimensional vector $\vec{c}$, the d-dimensional vector $\vec{\gamma}$, the real positive number $s^*$, the d-dimensional vector $\vec{a}$, the real number b, the positive real number $\mu(\Delta)$, and the positive integers K and n. In some aspects, outputs of the AC demapper may include a sequence of K bits, which may constitute estimates of the transmitted information bits. Further, with respect to the AC demapper, the AC demapper may implement a two-step scheme to perform the symbol-to-bit mapping. The AC demapper may utilize a DM scheme that is based at least in part on AC, and may be associated with a relatively low computational complexity.

As indicated above, FIG. 14 is provided as an example. Other examples may differ from what is described with regard to FIG. 14.

The receiving node operations, with respect to orthosimplices, are further described with respect to FIGS. 14 and 15.

Fixed-to-Fixed DM Using Orthosimplices

FIG. 15 is a diagram illustrating an example 1500 associated with a distribution matcher and a distribution dematcher used in a fixed-to-fixed DM scheme based at least in part on orthosimplices, in accordance with the present disclosure.

In some aspects, for a fixed-to-fixed DM scheme using orthosimplices, a transmitting node may include a distribution matcher (as shown in FIG. 13). The transmitting node may perform a first step at an AC preprocessor of the distribution matcher, a second step at a TX buffer of the distribution matcher, and a third step at an AC mapper of the distribution matcher.

In some aspects, a receiving node may include a distribution dematcher (as shown in FIG. 14). The receiving node may perform a first step at an AC postprocessor of the distribution dematcher, a second step at a RX buffer of the distribution dematcher, and a third step at an AC demapper of the distribution dematcher.

In some aspects, with respect to the first step performed by the transmitting node and the receiving node, the transmitting node and the receiving node may determine an orthosimplex (e.g., by determining its approximating corner and varying corners), based at least in part on input parameters. The transmitting node and the receiving node may define an approximating (affine) function using the corners of the orthosimplex. The transmitting node and the receiving node may define an approximating measure using the approximating function and derive several related integral formulas.

In some aspects, with respect to the first step performed by the transmitting node and the receiving node, the transmitting node and the receiving node may approximate involved multinomial coefficients based at least in part on an exponential of the approximating (affine) function. The transmitting node and the receiving node may determine a probability distribution over the orthosimplex based at least in part on a multinomial approximation. The transmitting node and the receiving node may determine a bit sequence length based at least in part on the probability distribution.

In some aspects, with respect to the second step performed by the transmitting node, the transmitting node may take K bits from the Tx buffer and provide the K bits to the AC mapper.

In some aspects, with respect to the third step performed by the transmitting node, the transmitting node may develop (e.g., via the AC mapper) a bit-to-symbol mapping based at least in part on a two-step scheme. A first step of the two-step scheme may involve a computation scheme of a cumulative distribution corresponding to the probability distribution. The second step of the two-step scheme may involve a standard CCDM encoder based at least in part on an adaptive AC encoding algorithm.

In some aspects, with respect to the second step performed by the receiving node, the receiving node may take n symbols from the Rx buffer and provide the n symbols to the AC demapper In some aspects, with respect to the third step performed by the receiving node, the receiving node may develop (e.g., via the AC demapper) a symbol-to-bit mapping based at least in part on a two-step scheme. A first step of the two-step scheme may involve a standard CCDM decoder based at least in part on an adaptive AC decoding algorithm. A second step of the two-step scheme may involve a computation scheme of a cumulative distribution.

As indicated above, FIG. 15 is provided as an example. Other examples may differ from what is described with regard to FIG. 15.

Composition Selection

In some aspects, during the composition selection, the transmitting node may determine an orthosimplex, e.g., by determining an approximating corner and varying corners of the orthosimplex, based at least in part on input parameters.

In some aspects, with respect to the first step performed by the transmitting node and the receiving node (as shown in FIG. 15), a region for selecting compositions may be an orthosimplex in $\mathbb{R}^{m-1}$ with m being the alphabet size, where A may be used to denote such a generic orthosimplex. Coordinates for constructing the orthosimplex may form a subset J of $\{1, 2, \ldots, m\}$ with cardinality m−1. With d=m−1, a choice of the coordinates may be specified by the ordered tuple $(i_1, i_2, \ldots, i_d)$ such that $i_1 < i_2 < \ldots < i_d$. Consequently, specifying the values of a composition along J may determine that composition.

In some examples, by suitable selections of design parameters, the orthosimplex A may be such that for any $\vec{x} \in \Delta$, the sum along all coordinates is no larger than n. Further, any $\vec{k} \in \Delta$, all elements of which are integers, may be referred to as a composition, and the coordinate j may correspond to the choice $i_j$.

Orthosimplices

In some aspects, during the composition selection, the transmitting node may determine the orthosimplex by defining an approximating (affine) function using the corners of the orthosimplex. In some aspects, during the composition selection, the transmitting node may define an approximating measure using the approximating function, and the transmitting node may derive various related integral formulas. Geometry-specific parameters associated with the orthosimplex may include the corners associated with the orthosimplex, and a slope vector and intercept of a function associated with the orthosimplex.

In some aspects, with respect to affine functions over $\mathbb{R}^{m-1}$, with d=m−1, an affine function $f$ over $\mathbb{R}^{m-1}$ is of the form:

$$f(\vec{x}) = b - \sum_{i=1}^{d} a_i x_i,$$

where d=m−1. Further, vector $\vec{a} = (a_1, a_2, \ldots, a_d)$ may be termed a slope vector and b may be termed an intercept of the affine function $f$. In some aspects, with respect to a measure $\mu_f$ over an orthosimplex, A may be an orthosimplex in $\mathbb{R}^{m-1}$ and $f$ may be an affine function over $\mathbb{R}^{m-1}$. The measure $\mu = \mu_f$ (when there is no ambiguity) may be defined such that, for B⊆A, $$\mu(B) = \int_B e^{f(\vec{x})} d\vec{x},$$

holds. Further, the (total) measure evaluated at A may read:

$$\mu(\Delta) = \int_\Delta e^{f(\vec{x})} d\vec{x}.$$

In some aspects, with respect to special affine functions over an orthosimplex, $\Delta = \Delta_d(\vec{c}, \vec{\gamma})$ may be an orthosimplex. A vector $\vec{c} \in \Delta$ may be termed as an approximating corner of A. For each $i \in [d] = \{1, 2, \ldots, d\}$, $\vec{e}_i$ may be a standard basis vector along coordinate i. Further, the vector $\vec{v}_i$ may be defined as: $\vec{v}_i = \vec{c} + \gamma_i \vec{e}_i$. Then, each vector $\vec{v}_i \in \Delta$ may be termed as a varying corner of A.

In some aspects, with respect to approximating functions over an orthosimplex, an affine function f over an orthosimplex $\Delta = \Delta_d(\vec{c}, \vec{\gamma})$ may be considered. Further, $f_c = f(\vec{c})$ may be for the approximating corner $\vec{c}$ and $f_i = f(\vec{v}_i)$ for the varying corner $\vec{v}_i$, $i \in [d]$, where $f$ may be called an approximating function if for each $i \in [d]$, $f(\vec{v}_i) = f_1$ and $f_1 \neq f_c$ holds. Then, a slope vector and the intercept of $f$ may satisfy:

$$a_i = \frac{f_c - f_1}{\gamma_i}, \forall i \in [d]$$

$$b = f_c - \sum_{i=1}^{d} a_i c_i.$$

Further, when $\mu$ is specified by an approximating function, $\mu$ may be referred to as an approximating measure.

FIG. 16 is a diagram illustrating an example 1600 associated with performing operations associated with orthosimplices, in accordance with the present disclosure. As shown in FIG. 16, considering an affine function $f$ over an orthosimplex $\Delta = \Delta_d(\vec{c}, \vec{\gamma})$, $f_c = f(\vec{c})$ may be for approximating corner $\vec{c}$ and $f_i = f(\vec{v}_i)$ may be for varying corner $\vec{v}_i$, $i \in [d]$. In this example, the orthosimplex may be defined by $f(\vec{c}) = f_c$, $f(\vec{v}_1) = f_1$, $f(\vec{v}_2) = f_1$, and the function $f$ over A. As indicated above, FIG. 16 is provided as an example. Other examples may differ from what is described with regard to FIG. 16.

In some aspects, with respect to an integral formula for $\mu$ over an orthosimplex, $\Delta = \Delta_d(\vec{c}, \vec{\gamma})$ may be an orthosimplex and $f$ may be an approximating function over A. Further, $\mu$ may be the approximating measure over A specified by $f$, such that $\mu(\Delta) = I_d(f_c, f_1, \vec{c}, \vec{\gamma})$. Here, with $\text{vol}(\Delta_d(\vec{c}, \vec{\gamma}))$ denoting the d-dimensional volume of A, a formula for $I_d(f_c, f_1, \vec{c}, \vec{\gamma})$ may be:

$$I_d(f_c, f_1, \vec{c}, \vec{\gamma}) = \frac{d! \, vol(\Delta_d(\vec{c}, \vec{\gamma}))}{(f_c - f_1)^d} e^{f_c} P_{d-1}(f_c - f_1),$$

where $P_d: \mathbb{R} \to \mathbb{R}$ may be defined as $$P_d(\lambda) = 1 - e^{-\lambda} \sum_{k=0}^{d} \frac{\lambda^k}{k!}.$$

In some aspects, with respect to integral formulas for $\mu$ over a scaled or shifted orthosimplex, $s > 0$ and for the scaled orthosimplex $s\Delta$, a formula for $\mu(s\Delta)$ may be:

$$\mu(s\Delta) = \int_{s\Delta} e^{f(\vec{x})} d\vec{x} = e^{-(s-1)b} I_d(sf_c, sf_1, s\vec{c}, s\vec{\gamma}).$$

Further, $\vec{y} \in \mathbb{R}^d$ and for shifted orthosimplex $\vec{y}+\Delta$, a formula for $\mu(\vec{y}+\Delta)$ may be:

$$\mu(\vec{y} + \Delta) = \int_{\vec{y}+\Delta} e^{f(\vec{x})} d\vec{x} = e^{f(\vec{y})-b} I_d(f_c, f_1, \vec{c}, \vec{\gamma}).$$

In some aspects, with respect to integral formulas for $\mu$, $\Delta = \Delta_d(\vec{c}, \vec{\gamma})$ may be an orthosimplex and $f$ may be an approximating function over $\Delta$. Further, $\mu$ may be the approximating measure over $\Delta$ specified by $f$, $g: \mathbb{R}^d \to \mathbb{R}$ may be an affine function, $g_i = g(\vec{v}_i)$ for each $i \in [d]$, and $g_c = g(\vec{c})$, which may result in:

$$\frac{\int_\Delta g(\vec{x}) e^{f(\vec{x})} d\vec{x}}{\int_\Delta e^{f(\vec{x})} d\vec{x}} = g_c + \left( \frac{\sum_{i=1}^d g_i - dg_c}{f_c - f_1} \right) \frac{P_d(f_c - f_1)}{P_{d-1}(f_c - f_1)}.$$

In some aspects, for some $j \in [d]$, $g(\vec{x}) = x_j$ (e.g., $g$ is the coordinate function for coordinate $j$), which may result in:

$$\frac{\int_\Delta x_j e^{f(\vec{x})} d\vec{x}}{\int_\Delta e^{f(\vec{x})} d\vec{x}} = c_j + \left( \frac{\gamma_j}{f_c - f_1} \right) \frac{P_d(f_c - f_1)}{P_{d-1}(f_c - f_1)},$$

which may be used for determining the orthosimplex for composition selection.

In some aspects, with respect to a logarithm-concavity of multinomial coefficients, multinomial coefficients may be log-concave. A log-concavity of the (continuously interpolated) multinomial coefficients may follow from a log-convexity of a Gamma function. Further, with $\Gamma$ denoting the Gamma function, the logarithm of a multinomial coefficient may be defined as:

$$\ln \binom{n}{\vec{k}} = \ln \Gamma(n+1) - \sum_{i=1}^m \ln \Gamma(k_i + 1),$$

where Jensen's inequality may be used to show the log-convexity, for example, $$\Gamma(z)\Gamma''(z) \ge (\Gamma'(z))^2,$$

where $$\Gamma(z) = \int_0^\infty x^{z-1} e^{-x} dx.$$

In some aspects, with respect to a usefulness of the log-concavity, an approximating function $f$ over an orthosimplex $\Delta = \Delta_d(\vec{c}, \vec{\gamma})$ may be considered, where $f_c = f(\vec{c})$ and $f_1 = f(\vec{v}_i)$ for $\vec{v}_i$, $i \in [d]$. When the values of $f_c$ and $f_1$ satisfy the conditions that:

$$f_c = \ln \binom{n}{\vec{c}} \text{ and } f_1 = \ln \binom{n}{\vec{v}_1},$$

then for each $\vec{x} \in \Delta$, $$f(\vec{x}) \le \ln \binom{n}{\vec{x}}$$

may be true. Further, the approximating function $f$ may provide a lower bound due to log-concavity.

FIG. 17 is a diagram illustrating an example 1700 associated with performing operations associated with orthosimplices, in accordance with the present disclosure. As shown in FIG. 17, for an orthosimplex associated with a function $f$ over $\Delta$, a log multinomial surface may be associated with the orthosimplex. Multinomial coefficients may be log-concave, and a log-concavity of continuously interpolated multinomial coefficients may follow from a log-convexity of a Gamma function. As indicated above, FIG. 17 is provided as an example. Other examples may differ from what is described with regard to FIG. 17.

Approximating Function

In some aspects, with respect to the orthosimplex and the approximating function, the symbol sequence length n and the target composition $\vec{q}$ over an alphabet A may be given. Based at least in part on n and $\vec{q}$, an orthosimplex $\Delta$ and an approximating function $f$ may be determined.

In some aspects, for a determination of $\vec{c}$ and $f_c$, where $\vec{c}$ and $f_c$ are then fixed, for a suitable design constant C and for each $i \in [d]$, $c_i = k_i^* - C\sqrt{nq_i}$, where $\vec{k}^* = n\vec{q}$ is the target composition. Further, $f_c$ may be the value of (continuously interpolated) multinomial coefficient evaluated at $\vec{c}$, where $$f_c = \ln \binom{n}{\vec{c}}.$$

For a determination of $\gamma_1$ and $f_1$, where $\gamma_1$ and $f_1$ are then fixed, for the same constant C, $\gamma_1 = 2C\sqrt{nq_1}$. Then, $\vec{v}_1 = \vec{c} + \gamma_1 \vec{e}_1$ and $f_1$ may be the value of the (continuously interpolated) multinomial coefficient evaluated at $\vec{v}_1$, where $$f_1 = \ln \binom{n}{\vec{v}_1}.$$

Further, for a determination of $\gamma_i$ for $i \in [d]\setminus\{1\}$, where $\vec{\gamma}$ is then fixed, and with $\vec{v}_i = \vec{c} + \gamma_i \vec{e}_i$, $\gamma_i$ may be determined using $$\ln \binom{n}{\vec{v}_i} = f_1.$$

As a result, the approximating corner $\vec{c}$ and the varying corners $\vec{v}_i$ for $\Delta$ may be determined, and the slope vector $\vec{a}$ and the intercept b for $f$ may be determined.

In some aspects, with respect to the orthosimplex and the approximating function, an iterative step may be used to solve for a real-valued parameter s*, such that for each $j \in [d]$, the following may be held:

$$c_j + \left(\frac{\gamma_j}{f_c - f_1}\right)\frac{P_d(s^*(f_c - f_1))}{P_{d-1}(s^*(f_c - f_1))} = k_j^*.$$

Further, by linearity of $f$, this may be equivalent to fixing $\vec{c}$ while scaling the vector $\vec{\gamma}$ by s* (e.g., multiplying $\vec{\gamma}$ by s*) of the orthosimplex in order to make the above identity hold. Further, by selecting a suitable constant C in an initializing step and due to a monotonicity of a ratio $P_d/P_{d-1}$, an efficient and iterative procedure (e.g., by a bisection technique) may be implemented in order to select the parameter s*. Further, the probability assignment may reveal that the above identity guarantees that an averaged composition is equal to the target composition.

In some aspects, with respect to a determination of $\Delta$ and $f$, determined orthosimplex $\Delta$ may be $\Delta_d(\vec{c}, s^*\vec{\gamma})$ (e.g., the approximating corner $\vec{c}$) and the varying corners $$\vec{v}_i = \vec{c} + s^*\gamma_i\vec{e}_i$$

for each $i \in [d]$ may be present. Further, the slope vector d of the approximating function $f$ may be determined by $a_i = (f_c - f_1)/\gamma_i$ for each $i \in [d]$, and the intercept b of $f$ may be determined by $$b = f_c - \sum_{i=1}^{d} a_i c_i.$$

When $\mu$ is specified by an approximating function, then $\mu$ may be termed the approximating measure.

Probability Assignment

In some aspects, the transmitting node may approximate involved multinomial coefficients based at least in part on an exponential of the approximating (affine) function. The transmitting node may determine a probability distribution over the orthosimplex based at least in part on the multinomial approximation. The transmitting node may determine the bit sequence length K based at least in part on the probability distribution.

In some aspects, with respect to the first step performed by the transmitting node and the receiving node (as shown in FIG. 15), for a probability distribution p, the orthosimplex $\Delta$ and the approximating function $f$ determined according to the first step may be considered. Further, $\vec{k} \in \Delta$ may be such that each $k_i \in \mathbb{N}$, e.g., $\vec{k}$ uniquely may determine a composition of length m over [n]. Further, $C(\vec{k})$ may be defined as:

$$C(\vec{k}) = \prod_{i=1}^{d}[k_i, k_i + 1).$$

Further, with a slight abuse of notation, $\vec{k}$ may be referred to as a composition. With $\mu = \mu_f$, the probability distribution p over the collection of compositions in the orthosimplex $\Delta$ may be defined by setting $$p(\vec{k}) = \frac{\mu(C(\vec{k}) \cap \Delta)}{\mu(\Delta)},$$

where $p(\vec{k})$ is proportional to $\mu(C(\vec{k}) \cap \Delta)$. The distribution p may be used implicitly to respectively perform the bit-to-symbol and symbol-to-bit mapping (as later described with respect to the third step, as shown in FIG. 15).

In some aspects, with respect to the determination of the bit sequence length K, the bit sequence length K may be defined as $K = \lfloor \log_2(\mu(\Delta)) \rfloor$, where a derived formula for $I_d(f_c, f_1, \vec{c}, \vec{\gamma})$ may be used to calculate K.

Bit-to-Symbol Mapping Using AC

In some aspects, with respect to the second step performed by the transmitting node (as shown in FIG. 15), K bits may be taken from the Tx buffer and provided to the AC mapper.

In some aspects, based at least in part on the composition selection and the probability assignment, the transmitting node may develop a distribution matcher. For example, in a two-step scheme, the transmitting node may perform a computation of a cumulative distribution corresponding to the probability distribution over the orthosimplex. Further, in the two-step scheme, the transmitting node may implement an adaptive AC encoding algorithm using a standard CCDM encoder.

In some aspects, with respect to the third step performed by the transmitting node (as shown in FIG. 15), with respect to an ordering of compositions, an order may be defined among compositions of length m over [n]. A lexicographical ordering along coordinates in J may be used to order compositions. Further, $\vec{w}$ and $\vec{z}$ may be compositions of length m over [n]. Then, $\vec{w} > \vec{z}$ if and only if for some $i \in J$, $w_i \geq z_i$ and $w_j = z_j$ for all $j > i$ hold, where J is the set of selected coordinates.

In some aspects, the following notation may be used in the computation of the cumulative distribution. For each $k \in \{1, 2, \ldots, d\}$, the notation $(\vec{0}_{<k}, z_k, \vec{z}_{>k})$ may denote a vector of length d such that the following holds: $\vec{0}_{<k}$ denotes the vector of length $k-1$, all elements of which are equal to 0, and $\vec{z}_{>k}$ denotes the vector $(z_{k+1}, z_{k+2}, \ldots, z_d)$ of length $d-k$. When all elements are nonnegative with the corresponding sum no larger than n, the vector $(\vec{0}_{<k}, z_k, \vec{z}_{>k})$ may specify a composition of length m over [n], where $d = m-1$. Further, this type of notation (e.g., $\vec{z}_{>k}$) may be used as the argument of the functions $G_k$.

Cumulative Distribution Computation

In some aspects, with respect to a preparation for the cumulative distribution, an integral formula may be used for a shifted and scaled orthosimplex, where $\vec{y}$ may be a vector of length d. Given an orthosimplex $\Delta = \Delta_d(\vec{c}, s^*\vec{\gamma})$, the following may be defined:

$$\Delta_{\vec{y}} = \Delta \cap \{\vec{x} \in \mathbb{R}^d | x_t \geq y_t, \forall t\}.$$

Further, if $\vec{y} \in \Delta$, then $\Delta_{\vec{y}} = \vec{y} - q\vec{c} + q$, where q is defined as follows:

$$q = 1 - \sum_{i=1}^{d} \frac{y_i - c_i}{\gamma_i}.$$

Consequently, $\mu(\Delta) = \mu(\vec{y} - q\vec{c} + q\Delta)$, which may then be computed accordingly.

In some aspects, the function $G_d: \mathbb{R}^d \to \mathbb{R}$ may be defined as $G_d(z) = \mu(\Delta_{\vec{z}})$. Here, II stands for the indicator function and takes value 1 if $\vec{z} \in \Delta$ and 0 otherwise. For each integer k ranging from d−1 down to 0, the function $G_k: \mathbb{R}^d \to \mathbb{R}$ may be recursively defined by setting $G_k(\vec{z}) = G_{k+1}(\vec{z}) - G_{k+1}(\vec{z} + \vec{e}_{k+1})$, where $\vec{e}_k$ corresponds to $(0, \ldots, 0, 1, 0, \ldots, 0)$, and where "1" corresponds to an index of k+1. Further, $\vec{e}_{k+1}$ denotes the standard basis vector of $\mathbb{R}^d$ along coordinate k+1.

In some aspects, with respect to the cumulative distribution of p, based at least in part on the ordering of the compositions specified by $\Delta = \Delta_d(\vec{c}, s^* \vec{\gamma})$, the cumulative distribution of p evaluated at $\vec{z}$ may be defined as:

$$F(\vec{z}) = \sum_{\vec{w} \in \Delta: \vec{w} \le \vec{z}} p(\vec{w}).$$

In some aspects, with respect to the computation of the cumulative distribution of p, a recursive procedure may be used that realizes an inclusion-exclusion principle in order to compute the cumulative distribution. Given $x \in [0, 1)$, the procedure may recursively find $\vec{z}^* \in \Delta$ such that $x < F(\vec{z}^*)$ and $x \ge F(\vec{w})$ for all $\vec{w} < \vec{z}^*$, and output $\vec{z}^*$ and $F(\vec{z}^*)$. The procedure may initialize $r_d = (1-x)Z$ and initialize l=d, and initialize $G^c = 0$. For l ranging from d down to 1, the procedure may involve determining $z_l^* \in [c_l, c_l + s^* \gamma_l]$ such that $$G_l(\vec{0}_{<l}, z_l^* + 1, \vec{z}_{>l}^*) < r_l \le G_l(\vec{0}_{<l}, z_l^*, \vec{z}_{>l}^*),$$

which may adhere to a strict monotonicity of $G_l$ along coordinate l. Further, the procedure may involve computing $$r_{l-1} \text{ by } r_{l-1} = r_l - G_l(\vec{0}_{<l}, z_l^* + 1, \vec{z}_{>l}^*).$$

Further, the procedure may involve incrementing $$G^c \text{ by } G_l(\vec{0}_{<l}, z_l^* + 1, \vec{z}_{>l}^*).$$

The cumulative distribution evaluated at z* may be determined by $F(\vec{z}^*) = 1 - G^c/\mu(\Delta)$. Further, the computation of the cumulative distribution of p may be later used in both the bit-to-symbol mapping and the symbol-to-bit mapping.

In some aspects, with respect to the third step performed by the transmitting node (as shown in FIG. 15), the two-step scheme may be involved to perform the bit-to-symbol mapping. A first step in the two-step scheme may involve a cumulative distribution computation. A second step in the three-step scheme may involve a CCDM encoding.

In some aspects, with respect to the cumulative distribution computation in the two-step scheme associated with the bit-to-symbol mapping, input K bits may be viewed as the dyadic number $x \in [0, 1)$ with binary expansion $0. x_1 x_2 \ldots x_K$. By using the computation of the cumulative distribution, the scheme may determine $\vec{z}^*$ and $F(\vec{z}^*)$ such that $x < F(\vec{z}^*)$ and $x \ge F(\vec{w})$ for all $\vec{w} < \vec{z}^*$, and in particular, $x \in [F(\vec{z}^*) - p(\vec{z}^*), F(\vec{z}^*))$ may be implied, such that $p(\vec{z}^*) = G_0(\vec{z}^*)/\mu(\Delta)$. The scheme may then compute x' by setting $$x' = \frac{x - F(\vec{z}^*) + p(\vec{z}^*)}{p(\vec{z}^*)}.$$

In some aspects, with respect to the CCDM encoding in the two-step scheme associated with the bit-to-symbol mapping, based at least in part on x' and $\vec{z}^*$, the scheme may perform standard CCDM encoding to generate the corresponding length-n symbol sequence.

Symbol-to-Bit Mapping Using AC

In some aspects, based at least in part on the composition selection and the probability assignment, the receiving node may develop a distribution dematcher. For example, in a two-step scheme, the receiving node may implement an adaptive AC decoding algorithm using a standard CCDM decoder. Further, in the two-step scheme, the receiving node may perform a computation of the cumulative distribution corresponding to the probability distribution over the approximating rectangle.

In some aspects, with respect to the second step performed by the receiving node (as shown in FIG. 15), n symbols may be taken from the Rx buffer and provided to the AC demapper.

In some aspects, with respect to the third step performed by the receiving node (as shown in FIG. 15), a two-step scheme may be used to perform the symbol-to-bit mapping. A first step in the two-step scheme may involve a CCDM decoding. A second step in the two-step scheme may involve the cumulative distribution computation.

In some aspects, with respect to the CCDM decoding in the two-step scheme associated with the symbol-to-bit mapping, the scheme may first determine the composition z of the length-n symbol sequence (e.g., by counting the occurrences of each symbol). The scheme may then map the symbol sequence to the corresponding length-K bit sequence based at least in part on $\vec{z}$ by a standard CCDM decoder. These K decoded bits may then be viewed as the dyadic number $x' \in [0, 1)$ with binary expansion $$0. x_1' x_2' \ldots x_K'.$$

In some aspects, with respect to the cumulative distribution computation in the two-step scheme associated with the symbol-to-bit mapping, based at least in part on the composition $\vec{z}$, the scheme may determine the cumulative distribution evaluated at $\vec{z}$ by directly computing $$F(\vec{z}) = 1 - \frac{1}{\mu(\Delta)} \sum_{l=1}^{d} G_l\left(\vec{0}_{<l}, z_l + 1, \vec{z}_{>l}\right).$$

Moreover, the scheme may evaluate the probability mass associated to z by computing $$p(\vec{z}) = \frac{1}{\mu(\Delta)} G_0(\vec{z}).$$

The scheme may finally compute $x=F(\vec{z})-p(\vec{z})+p(\vec{z})x'$ and take the first K bits of the binary expansion of x as the output bit sequence. The K bits may be an output of an AC demapper of the receiving node.

Transmitting Node and Receiving Node Operations

FIG. 18 is a diagram illustrating an example process 1800 performed, for example, by a transmitting node, in accordance with the present disclosure. Example process 1800 is an example where the transmitting node (e.g., UE 120 or base station 110) performs operations associated with multiple composition distribution matching based at least in part on AC and geometry-specific parameters.

As shown in FIG. 18, in some aspects, process 1800 may include determining a set of geometry-specific parameters based at least in part on a symbol sequence length n and a target distribution (block 1810). For example, the transmitting node (e.g., using communication manager 140 and/or determination component 2008, depicted in FIG. 20) may determine a set of geometry-specific parameters based at least in part on a symbol sequence length n and a target distribution, as described above.

As further shown in FIG. 18, in some aspects, process 1800 may include determining a sequence of K bits based at least in part on a plurality of information bits and a bit sequence length K that is geometry-specific (block 1820). For example, the transmitting node (e.g., using communication manager 140 and/or determination component 2008, depicted in FIG. 20) may determine a sequence of K bits based at least in part on a plurality of information bits and a bit sequence length K that is geometry-specific, as described above.

As further shown in FIG. 18, in some aspects, process 1800 may include mapping the sequence of K bits to a sequence of n symbols using arithmetic coding based at least in part on the set of geometry-specific parameters, wherein mapping the sequence of K bits to a sequence of n symbols includes: determining a plurality of compositions associated with a continuous region of a geometry; selecting, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and encoding, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected (block 1830). For example, the transmitting node (e.g., using communication manager 140 and/or mapping component 2010, depicted in FIG. 20) may map the sequence of K bits to a sequence of n symbols using arithmetic coding based at least in part on the set of geometry-specific parameters, wherein, to map the sequence of K bits to a sequence of n symbols, includes to: determine a plurality of compositions associated with a continuous region of a geometry; select, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and encode, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected, as described above.

As further shown in FIG. 18, in some aspects, process 1800 may include transmitting the sequence of n symbols to a receiving node (block 1840). For example, the transmitting node (e.g., using communication manager 140 and/or transmission component 2004, depicted in FIG. 20) may transmit the sequence of n symbols to a receiving node, as described above.

Process 1800 may include additional aspects, such as any single aspect or any combination of aspects described below and/or in connection with one or more other processes described elsewhere herein.

In a first aspect, the set of geometry-specific parameters is associated with a generalized rectangle and the geometry corresponds to the generalized rectangle, and the set of geometry-specific parameters indicates a center associated with the generalized rectangle and corners associated with the generalized rectangle.

In a second aspect, alone or in combination with the first aspect, process 1800 includes determining the generalized rectangle associated with the set of geometry-specific parameters based at least in part on the symbol sequence length n and the target distribution.

In a third aspect, alone or in combination with one or more of the first and second aspects, process 1800 includes determining a set of reflecting rectangles based at least in part on the generalized rectangle; determining, based at least in part on the set of reflecting rectangles and the generalized rectangle, approximate multinomial coefficients corresponding to the plurality of compositions associated with the generalized rectangle; determining, based at least in part on the approximate multinomial coefficients, the probability distribution of the plurality of compositions associated with the generalized rectangle; and determining the bit sequence length K based at least in part on the probability distribution associated with the generalized rectangle.

In a fourth aspect, alone or in combination with one or more of the first through third aspects, process 1800 includes computing a cumulative distribution corresponding to the probability distribution associated with the plurality of compositions, wherein the plurality of compositions are associated with the generalized rectangle.

In a fifth aspect, alone or in combination with one or more of the first through fourth aspects, the sequence of K bits is mapped to the sequence of n symbols based at least in part on the computation of the cumulative distribution, a rescaling associated with the sequence of K bits and an encoder based at least in part on adaptive arithmetic coding encoding.

In a sixth aspect, alone or in combination with one or more of the first through fifth aspects, the set of geometry-specific parameters is associated with an orthosimplex and the geometry corresponds to the orthosimplex, and the set of geometry-specific parameters indicates corners associated with the orthosimplex, and a slope vector and intercept of a function associated with the orthosimplex.

In a seventh aspect, alone or in combination with one or more of the first through sixth aspects, process 1800 includes determining the orthosimplex associated with the set of geometry-specific parameters based at least in part on the symbol sequence length n and the target distribution.

In an eighth aspect, alone or in combination with one or more of the first through seventh aspects, process 1800 includes determining an approximating function based at least in part on the set of geometry-specific parameters associated with the orthosimplex; determining an approximating measure using the approximating function; determining, based at least in part on the approximating function and the approximating measure, approximate multinomial coefficients corresponding to the plurality of compositions associated with the orthosimplex; determining the probability distribution of the plurality of compositions associated with the orthosimplex based at least in part on the approximate multinomial coefficients; and determining the bit sequence length K based at least in part on the probability distribution associated with the orthosimplex.

In a ninth aspect, alone or in combination with one or more of the first through eighth aspects, process 1800 includes computing a cumulative distribution corresponding to the probability distribution associated with the plurality of compositions, wherein the plurality of compositions are associated with the orthosimplex.

In a tenth aspect, alone or in combination with one or more of the first through ninth aspects, the symbol sequence length n satisfies one or more statistical properties related to the target distribution.

Although FIG. 18 shows example blocks of process 1800, in some aspects, process 1800 may include additional blocks, fewer blocks, different blocks, or differently arranged blocks than those depicted in FIG. 18. Additionally, or alternatively, two or more of the blocks of process 1800 may be performed in parallel.

FIG. 19 is a diagram illustrating an example process 1900 performed, for example, by a receiving node, in accordance with the present disclosure. Example process 1900 is an example where the receiving node (e.g., UE 120 or base station 110) performs operations associated with multiple composition distribution matching based at least in part on AC and geometry-specific parameters.

As shown in FIG. 19, in some aspects, process 1900 may include receiving a plurality of decoded symbols from a transmitting node (block 1910). For example, the receiving node (e.g., using communication manager 150 and/or reception component 2102, depicted in FIG. 21) may receive a plurality of decoded symbols from a transmitting node, as described above.

As further shown in FIG. 19, in some aspects, process 1900 may include determining a sequence of n symbols based at least in part on the plurality of decoded symbols and a symbol sequence length n (block 1920). For example, the receiving node (e.g., using communication manager 150 and/or determination component 2108, depicted in FIG. 21)

may determine a sequence of n symbols based at least in part on the plurality of decoded symbols and a symbol sequence length n, as described above.

As further shown in FIG. 19, in some aspects, process 1900 may include determining a set of geometry-specific parameters based at least in part on the symbol sequence length n and a target distribution (block 1930). For example, the receiving node (e.g., using communication manager 150 and/or determination component 2108, depicted in FIG. 21) may determine a set of geometry-specific parameters based at least in part on the symbol sequence length n and a target distribution, as described above.

As further shown in FIG. 19, in some aspects, process 1900 may include demapping the sequence of n symbols to a sequence of K bits using arithmetic coding based at least in part on the set of geometry-specific parameters and a bit sequence length K, wherein, demapping the sequence of n symbols to the sequence of K bits includes: determining a plurality of compositions associated with a continuous region of a geometry; selecting a composition, from the plurality of compositions, of the sequence of n symbols; and decoding, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits (block 1940). For example, the receiving node (e.g., using communication manager 150 and/or demapping component 2110, depicted in FIG. 21) may demap the sequence of n symbols to a sequence of K bits using arithmetic coding based at least in part on the set of geometry-specific parameters and a bit sequence length K, wherein, to demap the sequence of n symbols to the sequence of K bits, includes to: determine a plurality of compositions associated with a continuous region of a geometry; select a composition, from the plurality of compositions, of the sequence of n symbols; and decode, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits, as described above.

Process 1900 may include additional aspects, such as any single aspect or any combination of aspects described below and/or in connection with one or more other processes described elsewhere herein.

In a first aspect, the set of geometry-specific parameters is associated with a generalized rectangle and the geometry corresponds to the generalized rectangle, and the set of geometry-specific parameters indicates a center associated with the generalized rectangle and corners associated with the generalized rectangle.

In a second aspect, alone or in combination with the first aspect, process 1900 includes determining the generalized rectangle associated with the set of geometry-specific parameters based at least in part on the symbol sequence length n and the target distribution.

In a third aspect, alone or in combination with one or more of the first and second aspects, process 1900 includes determining a set of reflecting rectangles based at least in part on the generalized rectangle; determining, based at least in part on the set of reflecting rectangles and the generalized rectangle, approximate multinomial coefficients corresponding to the plurality of compositions associated with the generalized rectangle; determining, based at least in part on the approximate multinomial coefficients, the probability distribution of the plurality of compositions associated with the generalized rectangle; and determining the bit sequence length K based at least in part on the probability distribution associated with the generalized rectangle.

In a fourth aspect, alone or in combination with one or more of the first through third aspects, process 1900 includes computing a cumulative distribution corresponding to the probability distribution associated with the plurality of compositions, wherein the plurality of compositions are associated with the generalized rectangle.

In a fifth aspect, alone or in combination with one or more of the first through fourth aspects, the sequence of n symbols is demapped to the sequence of K bits based at least in part on a decoder based at least in part on adaptive arithmetic coding decoding, the computation of the cumulative distribution, and a rescaling of an output of decoded K bits from the decoder.

In a sixth aspect, alone or in combination with one or more of the first through fifth aspects, the set of geometry-specific parameters is associated with an orthosimplex and the geometry corresponds to the orthosimplex, and the set of geometry-specific parameters indicates corners associated with the orthosimplex, and a slope vector and intercept of a function associated with the orthosimplex.

In a seventh aspect, alone or in combination with one or more of the first through sixth aspects, process 1900 includes determining the orthosimplex associated with the set of geometry-specific parameters based at least in part on the symbol sequence length n and the target distribution.

In an eighth aspect, alone or in combination with one or more of the first through seventh aspects, process 1900 includes determining an approximating function based at least in part on the set of geometry-specific parameters associated with the orthosimplex; determining an approximating measure using the approximating function; determining, based at least in part on the approximating function and the approximating measure, approximate multinomial coefficients corresponding to the plurality of compositions associated with the orthosimplex; determining the probability distribution of the plurality of compositions associated with the orthosimplex based at least in part on the approximate multinomial coefficients; and determining the bit sequence length K based at least in part on the probability distribution associated with the orthosimplex.

In a ninth aspect, alone or in combination with one or more of the first through eighth aspects, process 1900 includes computing a cumulative distribution corresponding to the probability distribution associated with the plurality of compositions, wherein the plurality of compositions are associated with the orthosimplex.

In a tenth aspect, alone or in combination with one or more of the first through ninth aspects, the K bits are associated with an estimate of transmitted information bits transmitted by the transmitting node.

Although FIG. 19 shows example blocks of process 1900, in some aspects, process 1900 may include additional blocks, fewer blocks, different blocks, or differently arranged blocks than those depicted in FIG. 19. Additionally, or alternatively, two or more of the blocks of process 1900 may be performed in parallel.

FIG. 20 is a diagram of an example apparatus 2000 for wireless communication. The apparatus 2000 may be a transmitting node, or a transmitting node may include the apparatus 2000. In some aspects, the apparatus 2000 includes a reception component 2002 and a transmission component 2004, which may be in communication with one another (for example, via one or more buses and/or one or more other components). As shown, the apparatus 2000 may communicate with another apparatus 2006 (such as a UE, a base station, or another wireless communication device) using the reception component 2002 and the transmission component 2004. As further shown, the apparatus 2000 may include the communication manager 140. The communication manager 140 may include one or more of a determination component 2008, or a mapping component 2010, among other examples.

In some aspects, the apparatus 2000 may be configured to perform one or more operations described herein in connection with FIGS. 5-17. Additionally, or alternatively, the apparatus 2000 may be configured to perform one or more processes described herein, such as process 1800 of FIG. 18. In some aspects, the apparatus 2000 and/or one or more components shown in FIG. 20 may include one or more components of the transmitting node described in connection with FIG. 2. Additionally, or alternatively, one or more components shown in FIG. 20 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 2002 may receive communications, such as reference signals, control information, data communications, or a combination thereof, from the apparatus 2006. The reception component 2002 may provide received communications to one or more other components of the apparatus 2000. In some aspects, the reception component 2002 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 2000. In some aspects, the reception component 2002 may include one or more antennas, a modem, a demodulator, a MIMO detector, a receive processor, a controller/processor, a memory, or a combination thereof, of the transmitting node described in connection with FIG. 2.

The transmission component 2004 may transmit communications, such as reference signals, control information, data communications, or a combination thereof, to the apparatus 2006. In some aspects, one or more other components of the apparatus 2000 may generate communications and may provide the generated communications to the transmission component 2004 for transmission to the apparatus 2006. In some aspects, the transmission component 2004 may perform signal processing on the generated communications (such as filtering, amplification, modulation, digital-to-analog conversion, multiplexing, interleaving, mapping, or encoding, among other examples), and may transmit the processed signals to the apparatus 2006. In some aspects, the transmission component 2004 may include one or more antennas, a modem, a modulator, a transmit MIMO processor, a transmit processor, a controller/processor, a memory, or a combination thereof, of the transmitting node described in connection with FIG. 2. In some aspects, the transmission component 2004 may be co-located with the reception component 2002 in a transceiver.

The determination component 2008 may determine a set of geometry-specific parameters based at least in part on a symbol sequence length n and a target distribution. The determination component 2008 may determine a sequence of K bits based at least in part on a plurality of information bits and a bit sequence length K that is geometry-specific. The mapping component 2010 may map the sequence of K bits to a sequence of n symbols using AC based at least in part on the set of geometry-specific parameters, wherein mapping the sequence of K bits to the sequence of n symbols further includes determining a plurality of compositions associated with a continuous region of a geometry; selecting, based at least in part on the sequence of K bits, a composition from the plurality of compositions, wherein the composition is selected based at least in part on a probability distribution of the plurality of compositions, and the probability distribution of the plurality of compositions is based at least in part on the geometry-specific parameters; and encoding, based at least in part on the composition selected from the plurality of compositions, the sequence of K bits into the sequence of n symbols using AC based at least in part on the set of geometry-specific parameters, wherein the composition of the sequence of n symbols corresponds to the composition selected. The transmission component 2004 may transmit the sequence of n symbols to a receiving node.

The number and arrangement of components shown in FIG. 20 are provided as an example. In practice, there may be additional components, fewer components, different components, or differently arranged components than those shown in FIG. 20. Furthermore, two or more components shown in FIG. 20 may be implemented within a single component, or a single component shown in FIG. 20 may be implemented as multiple, distributed components. Additionally, or alternatively, a set of (one or more) components shown in FIG. 20 may perform one or more functions described as being performed by another set of components shown in FIG. 20.

FIG. 21 is a diagram of an example apparatus 2100 for wireless communication. The apparatus 2100 may be a receiving node, or a receiving node may include the apparatus 2100. In some aspects, the apparatus 2100 includes a reception component 2102 and a transmission component 2104, which may be in communication with one another (for example, via one or more buses and/or one or more other components). As shown, the apparatus 2100 may communicate with another apparatus 2106 (such as a UE, a base station, or another wireless communication device) using the reception component 2102 and the transmission component 2104. As further shown, the apparatus 2100 may include the communication manager 150. The communication manager 150 may include one or more of a determination component 2108, or a demapping component 2110, among other examples.

In some aspects, the apparatus 2100 may be configured to perform one or more operations described herein in connection with FIGS. 5-17. Additionally, or alternatively, the apparatus 2100 may be configured to perform one or more processes described herein, such as process 1900 of FIG. 19. In some aspects, the apparatus 2100 and/or one or more components shown in FIG. 21 may include one or more components of the receiving node described in connection with FIG. 2. Additionally, or alternatively, one or more components shown in FIG. 21 may be implemented within one or more components described in connection with FIG.

2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 2102 may receive communications, such as reference signals, control information, data communications, or a combination thereof, from the apparatus 2106. The reception component 2102 may provide received communications to one or more other components of the apparatus 2100. In some aspects, the reception component 2102 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 2100. In some aspects, the reception component 2102 may include one or more antennas, a modem, a demodulator, a MIMO detector, a receive processor, a controller/processor, a memory, or a combination thereof, of the receiving node described in connection with FIG. 2.

The transmission component 2104 may transmit communications, such as reference signals, control information, data communications, or a combination thereof, to the apparatus 2106. In some aspects, one or more other components of the apparatus 2100 may generate communications and may provide the generated communications to the transmission component 2104 for transmission to the apparatus 2106. In some aspects, the transmission component 2104 may perform signal processing on the generated communications (such as filtering, amplification, modulation, digital-to-analog conversion, multiplexing, interleaving, mapping, or encoding, among other examples), and may transmit the processed signals to the apparatus 2106. In some aspects, the transmission component 2104 may include one or more antennas, a modem, a modulator, a transmit MIMO processor, a transmit processor, a controller/processor, a memory, or a combination thereof, of the receiving node described in connection with FIG. 2. In some aspects, the transmission component 2104 may be co-located with the reception component 2102 in a transceiver.

The reception component 2102 may receive a plurality of decoded symbols from a transmitting node. The determination component 2108 may determine a sequence of n symbols based at least in part on the plurality of decoded symbols and a symbol sequence length n. The determination component 2108 may determine a set of geometry-specific parameters based at least in part on the symbol sequence length n and a target distribution. The demapping component 2110 may demap the sequence of n symbols to a sequence of K bits using AC based at least in part on the set of geometry-specific parameters and a bit sequence length K, wherein demapping the sequence of n symbols to the sequence of K bits further includes determining a plurality of compositions associated with a continuous region of a geometry; selecting a composition, from the plurality of compositions, of the sequence of n symbols; and decoding, based at least in part on the composition of the sequence of n symbols and a probability distribution of the plurality of compositions where the probability distribution of the plurality of compositions is based at least in part on the geometry-specific parameters, the sequence of n symbols using AC and the bit sequence length K to obtain the sequence of K bits.

The number and arrangement of components shown in FIG. 21 are provided as an example. In practice, there may be additional components, fewer components, different components, or differently arranged components than those shown in FIG. 21. Furthermore, two or more components shown in FIG. 21 may be implemented within a single component, or a single component shown in FIG. 21 may be implemented as multiple, distributed components. Additionally, or alternatively, a set of (one or more) components shown in FIG. 21 may perform one or more functions described as being performed by another set of components shown in FIG. 21.

The following provides an overview of some Aspects of the present disclosure:

Aspect 1: A method of wireless communication performed by a transmitting node, comprising: determining a set of geometry-specific parameters based at least in part on a symbol sequence length n and a target distribution; determining a sequence of K bits based at least in part on a plurality of information bits and a bit sequence length K that is geometry-specific; mapping the sequence of K bits to a sequence of n symbols using arithmetic coding based at least in part on the set of geometry-specific parameters, wherein mapping the sequence of K bits to a sequence of n symbols includes: determining a plurality of compositions associated with a continuous region of a geometry; selecting, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and encoding, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected; and transmit the sequence of n symbols to a receiving node.

Aspect 2: The method of Aspect 1, wherein the set of geometry-specific parameters is associated with a generalized rectangle and the geometry corresponds to the generalized rectangle, and wherein the set of geometry-specific parameters indicates a center associated with the generalized rectangle and corners associated with the generalized rectangle.

Aspect 3: The method of Aspect 2, further comprising determining the generalized rectangle associated with the set of geometry-specific parameters based at least in part on the symbol sequence length n and the target distribution.

Aspect 4: The method of Aspect 3, further comprising: determining a set of reflecting rectangles based at least in part on the generalized rectangle; determining, based at least in part on the set of reflecting rectangles and the generalized rectangle, approximate multinomial coefficients corresponding to the plurality of compositions associated with the generalized rectangle; determining, based at least in part on the approximate multinomial coefficients, the probability distribution of the plurality of compositions associated with the generalized rectangle; and determining the bit sequence length K based at least in part on the probability distribution associated with the generalized rectangle.

Aspect 5: The method of Aspect 4, wherein selecting the composition from the plurality of compositions comprises computing a cumulative distribution corresponding to the probability distribution associated with the plurality of compositions, wherein the plurality of compositions are associated with the generalized rectangle.

Aspect 6: The method of Aspect 5, wherein the sequence of K bits is mapped to the sequence of n symbols based at least in part on the computation of the cumulative distribution, a rescaling associated with the sequence of K bits and an encoder based at least in part on adaptive arithmetic coding encoding.

Aspect 7: The method of any of Aspects 1 through 6, wherein the set of geometry-specific parameters is associated with an orthosimplex and the geometry corresponds to the orthosimplex, and wherein the set of geometry-specific parameters indicates corners associated with the orthosimplex, and a slope vector and intercept of a function associated with the orthosimplex.

Aspect 8: The method of Aspect 7, further comprising determining the orthosimplex associated with the set of geometry-specific parameters based at least in part on the symbol sequence length n and the target distribution.

Aspect 9: The method of Aspect 8, further comprising: determining an approximating function based at least in part on the set of geometry-specific parameters associated with the orthosimplex; determining an approximating measure using the approximating function; determining, based at least in part on the approximating function and the approximating measure, approximate multinomial coefficients corresponding to the plurality of compositions associated with the orthosimplex; determining the probability distribution of the plurality of compositions associated with the orthosimplex based at least in part on the approximate multinomial coefficients; and determining the bit sequence length K based at least in part on the probability distribution associated with the orthosimplex.

Aspect 10: The method of Aspect 9, wherein selecting the composition from the plurality of compositions comprises computing a cumulative distribution corresponding to the probability distribution associated with the plurality of compositions, wherein the plurality of compositions are associated with the orthosimplex.

Aspect 11: The method of any of Aspects 1 through 10, wherein the symbol sequence length n satisfies one or more statistical properties related to the target distribution.

Aspect 12: A method of wireless communication performed by a receiving node, comprising: receiving a plurality of decoded symbols from a transmitting node; determining a sequence of n symbols based at least in part on the plurality of decoded symbols and a symbol sequence length n; determining a set of geometry-specific parameters based at least in part on the symbol sequence length n and a target distribution; and demapping the sequence of n symbols to a sequence of K bits using arithmetic coding based at least in part on the set of geometry-specific parameters and a bit sequence length K, wherein demapping the sequence of n symbols to the sequence of K bits includes: determining a plurality of compositions associated with a continuous region of a geometry; selecting a composition, from the plurality of compositions, of the sequence of n symbols; and decoding, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits.

Aspect 13: The method of Aspect 12, wherein the set of geometry-specific parameters is associated with a generalized rectangle and the geometry corresponds to the generalized rectangle, and wherein the set of geometry-specific parameters indicates a center associated with the generalized rectangle and corners associated with the generalized rectangle.

Aspect 14: The method of Aspect 13, further comprising determining the generalized rectangle associated with the set of geometry-specific parameters based at least in part on the symbol sequence length n and the target distribution.

Aspect 15: The method of Aspect 14, further comprising: determining a set of reflecting rectangles based at least in part on the generalized rectangle; determining, based at least in part on the set of reflecting rectangles and the generalized rectangle, approximate multinomial coefficients corresponding to the plurality of compositions associated with the generalized rectangle; determining, based at least in part on the approximate multinomial coefficients, the probability distribution of the plurality of compositions associated with the generalized rectangle; and determining the bit sequence length K based at least in part on the probability distribution associated with the generalized rectangle.

Aspect 16: The method of Aspect 15, wherein decoding the sequence of n symbols to the sequence of K bits comprises computing a cumulative distribution corresponding to the probability distribution associated with the plurality of compositions, wherein the plurality of compositions are associated with the generalized rectangle.

Aspect 17: The method of Aspect 16, wherein the sequence of n symbols is demapped to the sequence of K bits based at least in part on a decoder based at least in part on adaptive arithmetic coding decoding, the computation of the cumulative distribution, and a rescaling of an output of decoded K bits from the decoder.

Aspect 18: The method of any of Aspects 12 through 17, wherein the set of geometry-specific parameters is associated with an orthosimplex and the geometry corresponds to the orthosimplex, and wherein the set of geometry-specific parameters indicates corners associated with the orthosimplex, and a slope vector and intercept of a function associated with the orthosimplex.

Aspect 19: The method of Aspect 18, further comprising determining the orthosimplex associated with the set of geometry-specific parameters based at least in part on the symbol sequence length n and the target distribution.

Aspect 20: The method of Aspect 19, further comprising: determining an approximating function based at least in part on the set of geometry-specific parameters associated with the orthosimplex; determining an approximating measure using the approximating function; determining, based at least in part on the approximating function and the approximating measure, approximate multinomial coefficients corresponding to the plurality of compositions associated with the orthosimplex; determining the probability distribution of the plurality of compositions associated with the orthosimplex based at least in part on the approximate multinomial coefficients; and determining the bit sequence length K based at least in part on the probability distribution associated with the orthosimplex.

Aspect 21: The method of Aspect 20, wherein decoding the sequence of n symbols to the sequence of K bits comprises computing a cumulative distribution corresponding to the probability distribution associated with the plurality of compositions, wherein the plurality of compositions are associated with the orthosimplex.

Aspect 22: The method of any of Aspects 12 through 21, wherein the K bits are associated with an estimate of transmitted information bits transmitted by the transmitting node.

Aspect 23: An apparatus for wireless communication at a device, comprising a processor; memory coupled with the processor; and instructions stored in the memory and executable by the processor to cause the apparatus to perform the method of one or more of Aspects 1-11.

Aspect 24: A device for wireless communication, comprising a memory and one or more processors coupled to the memory, the one or more processors configured to perform the method of one or more of Aspects 1-11.

Aspect 25: An apparatus for wireless communication, comprising at least one means for performing the method of one or more of Aspects 1-11.

Aspect 26: A non-transitory computer-readable medium storing code for wireless communication, the code comprising instructions executable by a processor to perform the method of one or more of Aspects 1-11.

Aspect 27: A non-transitory computer-readable medium storing a set of instructions for wireless communication, the set of instructions comprising one or more instructions that, when executed by one or more processors of a device, cause the device to perform the method of one or more of Aspects 1-11.

Aspect 28: An apparatus for wireless communication at a device, comprising a processor; memory coupled with the processor; and instructions stored in the memory and executable by the processor to cause the apparatus to perform the method of one or more of Aspects 12-22.

Aspect 29: A device for wireless communication, comprising a memory and one or more processors coupled to the memory, the one or more processors configured to perform the method of one or more of Aspects 12-22.

Aspect 30: An apparatus for wireless communication, comprising at least one means for performing the method of one or more of Aspects 12-22.

Aspect 31: A non-transitory computer-readable medium storing code for wireless communication, the code comprising instructions executable by a processor to perform the method of one or more of Aspects 12-22.

Aspect 32: A non-transitory computer-readable medium storing a set of instructions for wireless communication, the set of instructions comprising one or more instructions that, when executed by one or more processors of a device, cause the device to perform the method of one or more of Aspects 12-22.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method of wireless communication performed by a transmitting node, comprising:
   determining a set of geometry-specific parameters based at least in part on a symbol sequence length n and a target distribution;
   determining a sequence of K bits based at least in part on a plurality of information bits and a bit sequence length K that is geometry-specific;
   mapping the sequence of K bits to a sequence of n symbols using arithmetic coding based at least in part on the set of geometry-specific parameters, wherein mapping the sequence of K bits to a sequence of n symbols further comprises:
      determining a plurality of compositions associated with a continuous region of a geometry;

selecting, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and
   encoding, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected; and
   transmitting the sequence of n symbols to a receiving node.

2. The method of claim 1, wherein the set of geometry-specific parameters is associated with a generalized rectangle and the geometry corresponds to the generalized rectangle, and wherein the set of geometry-specific parameters indicates a center associated with the generalized rectangle and corners associated with the generalized rectangle.

3. The method of claim 2, further comprising determining the generalized rectangle associated with the set of geometry-specific parameters based at least in part on the symbol sequence length n and the target distribution.

4. The method of claim 3, further comprising:
   determining a set of reflecting rectangles based at least in part on the generalized rectangle;
   determining, based at least in part on the set of reflecting rectangles and the generalized rectangle, approximate multinomial coefficients corresponding to the plurality of compositions associated with the generalized rectangle;
   determining, based at least in part on the approximate multinomial coefficients, the probability distribution of the plurality of compositions associated with the generalized rectangle; and
   determining the bit sequence length K based at least in part on the probability distribution associated with the generalized rectangle.

5. The method of claim 4, wherein selecting the composition from the plurality of compositions further comprises:
   computing a cumulative distribution corresponding to the probability distribution associated with the plurality of compositions, wherein the plurality of compositions are associated with the generalized rectangle.

6. The method of claim 5, wherein the sequence of K bits is mapped to the sequence of n symbols based at least in part on the computation of the cumulative distribution, a rescaling associated with the sequence of K bits and an encoder based at least in part on adaptive arithmetic coding encoding.

7. The method of claim 1, wherein the set of geometry-specific parameters is associated with an orthosimplex and the geometry corresponds to the orthosimplex, and wherein the set of geometry-specific parameters indicates corners associated with the orthosimplex, and a slope vector and intercept of a function associated with the orthosimplex.

8. The method of claim 7, further comprising determining the orthosimplex associated with the set of geometry-specific parameters based at least in part on the symbol sequence length n and the target distribution.

9. The method of claim 8, further comprising:

determining an approximating function based at least in part on the set of geometry-specific parameters associated with the orthosimplex;

determining an approximating measure using the approximating function;

determining, based at least in part on the approximating function and the approximating measure, approximate multinomial coefficients corresponding to the plurality of compositions associated with the orthosimplex;

determining the probability distribution of the plurality of compositions associated with the orthosimplex based at least in part on the approximate multinomial coefficients; and determining the bit sequence length K based at least in part on the probability distribution associated with the orthosimplex.

10. The method of claim 9, wherein selecting the composition from the plurality of compositions further comprises:

computing a cumulative distribution corresponding to the probability distribution associated with the plurality of compositions, wherein the plurality of compositions are associated with the orthosimplex.

11. The method of claim 1, wherein the symbol sequence length n satisfies one or more statistical properties related to the target distribution.

12. A method of wireless communication performed by a receiving node, comprising:

receiving a plurality of decoded symbols from a transmitting node;

determining a sequence of n symbols based at least in part on the plurality of decoded symbols and a symbol sequence length n;

determining a set of geometry-specific parameters based at least in part on the symbol sequence length n and a target distribution; and demapping the sequence of n symbols to a sequence of K bits using arithmetic coding based at least in part on the set of geometry-specific parameters and a bit sequence length K, wherein demapping the sequence of n symbols to the sequence of K bits further comprises:

determining a plurality of compositions associated with a continuous region of a geometry;

selecting a composition, from the plurality of compositions, of the sequence of n symbols; and decoding, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits.

13. The method of claim 12, wherein the set of geometry-specific parameters is associated with a generalized rectangle and the geometry corresponds to the generalized rectangle, and wherein the set of geometry-specific parameters indicates a center associated with the generalized rectangle and corners associated with the generalized rectangle.

14. The method of claim 13, further comprising determining the generalized rectangle associated with the set of geometry-specific parameters based at least in part on the symbol sequence length n and the target distribution.

15. The method of claim 14, further comprising:

determining a set of reflecting rectangles based at least in part on the generalized rectangle;

determining, based at least in part on the set of reflecting rectangles and the generalized rectangle, approximate multinomial coefficients corresponding to the plurality of compositions associated with the generalized rectangle;

determining, based at least in part on the approximate multinomial coefficients, the probability distribution of the plurality of compositions associated with the generalized rectangle; and determining the bit sequence length K based at least in part on the probability distribution associated with the generalized rectangle.

16. The method of claim 15, wherein decoding the sequence of n symbols to the sequence of K bits further comprises:

computing a cumulative distribution corresponding to the probability distribution associated with the plurality of compositions, wherein the plurality of compositions are associated with the generalized rectangle.

17. The method of claim 16, wherein the sequence of n symbols is demapped to the sequence of K bits based at least in part on a decoder based at least in part on adaptive arithmetic coding decoding, the computation of the cumulative distribution, and a rescaling of an output of decoded K bits from the decoder.

18. The method of claim 12, wherein the set of geometry-specific parameters is associated with an orthosimplex and the geometry corresponds to the orthosimplex, and wherein the set of geometry-specific parameters indicates corners associated with the orthosimplex, and a slope vector and intercept of a function associated with the orthosimplex.

19. The method of claim 18, further comprising determining the orthosimplex associated with the set of geometry-specific parameters based at least in part on the symbol sequence length n and the target distribution.

20. The method of claim 19, further comprising:

determining an approximating function based at least in part on the set of geometry-specific parameters associated with the orthosimplex;

determining an approximating measure using the approximating function;

determining, based at least in part on the approximating function and the approximating measure, approximate multinomial coefficients corresponding to the plurality of compositions associated with the orthosimplex;

determining the probability distribution of the plurality of compositions associated with the orthosimplex based at least in part on the approximate multinomial coefficients; and determining the bit sequence length K based at least in part on the probability distribution associated with the orthosimplex.

21. The method of claim 20, wherein decoding the sequence of n symbols to the sequence of K bits further comprises:

computing a cumulative distribution corresponding to the probability distribution associated with the plurality of compositions, wherein the plurality of compositions are associated with the orthosimplex.

22. The method of claim 12, wherein the K bits are associated with an estimate of transmitted information bits transmitted by the transmitting node.

23. An apparatus for wireless communication at a transmitting node, comprising:

a memory; and one or more processors, coupled to the memory, configured to:

determine a set of geometry-specific parameters based at least in part on a symbol sequence length n and a target distribution;

determine a sequence of K bits based at least in part on a plurality of information bits and a bit sequence length K that is geometry-specific;

map the sequence of K bits to a sequence of n symbols using arithmetic coding based at least in part on the set of geometry-specific parameters, wherein the one or more processors, to map the sequence of K bits to the sequence of n symbols, are further configured to:

determine a plurality of compositions associated with a continuous region of a geometry;

select, based at least in part on the sequence of K bits, a composition from the plurality of compositions, wherein the composition is selected based at least in part on a probability distribution of the plurality of compositions, and wherein the probability distribution of the plurality of compositions is based at least in part on the geometry-specific parameters; and encode, based at least in part on the composition selected from the plurality of compositions, the sequence of K bits into the sequence of n symbols using arithmetic coding based at least in part on the set of geometry-specific parameters, wherein the composition of the sequence of n symbols corresponds to the composition selected; and transmit the sequence of n symbols to a receiving node.

24. The apparatus of claim 23, wherein:

the set of geometry-specific parameters is associated with a generalized rectangle and the geometry corresponds to the generalized rectangle, and the set of geometry-specific parameters indicates a center associated with the generalized rectangle and corners associated with the generalized rectangle; or the set of geometry-specific parameters is associated with an orthosimplex and the geometry corresponds to the orthosimplex, and the set of geometry-specific parameters indicates corners associated with the orthosimplex and a slope vector and intercept of a function associated with the orthosimplex.

25. The apparatus of claim 24, wherein the one or more processors are further configured to:

determine a set of reflecting rectangles based at least in part on the generalized rectangle;

determine, based at least in part on the set of reflecting rectangles and the generalized rectangle, approximate multinomial coefficients corresponding to the plurality of compositions associated with the generalized rectangle;

determine, based at least in part on the approximate multinomial coefficients, the probability distribution of the plurality of compositions associated with the generalized rectangle; and determine the bit sequence length K based at least in part on the probability distribution associated with the generalized rectangle.

26. The apparatus of claim 24, wherein the one or more processors are further configured to:

determine an approximating function based at least in part on the set of geometry-specific parameters associated with the orthosimplex;

determine an approximating measure using the approximating function;

determine, based at least in part on the approximating function and the approximating measure, approximate multinomial coefficients corresponding to the plurality of compositions associated with the orthosimplex;

determine the probability distribution of the plurality of compositions associated with the orthosimplex based at least in part on the approximate multinomial coefficients; and determine the bit sequence length K based at least in part on the probability distribution associated with the orthosimplex.

27. An apparatus for wireless communication at a receiving node, comprising:

a memory; and one or more processors, coupled to the memory, configured to:

receive a plurality of decoded symbols from a transmitting node;

determine a sequence of n symbols based at least in part on the plurality of decoded symbols and a symbol sequence length n;

determine a set of geometry-specific parameters based at least in part on the symbol sequence length n and a target distribution; and demap the sequence of n symbols to a sequence of K bits using arithmetic coding based at least in part on the set of geometry-specific parameters and a bit sequence length K, wherein the one or more processors, to demap the sequence of n symbols to the sequence of K bits, are further configured to:

determine a plurality of compositions associated with a continuous region of a geometry;

select a composition, from the plurality of compositions, of the sequence of n symbols; and decode, based at least in part on the composition of the sequence of n symbols and a probability distribution of the plurality of compositions where the probability distribution of the plurality of compositions is based at least in part on the geometry-specific parameters, the sequence of n symbols using arithmetic coding and the bit sequence length K to obtain the sequence of K bits.

28. The apparatus of claim 27, wherein:

the set of geometry-specific parameters is associated with a generalized rectangle and the geometry corresponds to the generalized rectangle, and the set of geometry-specific parameters indicates a center associated with the generalized rectangle and corners associated with the generalized rectangle; or the set of geometry-specific parameters is associated with an orthosimplex and the geometry corresponds to the orthosimplex, and the set of geometry-specific parameters indicates corners associated with the orthosimplex, and a slope vector and intercept of a function associated with the orthosimplex.

29. The apparatus of claim 28, wherein the one or more processors are further configured to:

determine a set of reflecting rectangles based at least in part on the generalized rectangle;

determine, based at least in part on the set of reflecting rectangles and the generalized rectangle, approximate multinomial coefficients corresponding to the plurality of compositions associated with the generalized rectangle;

determine, based at least in part on the approximate multinomial coefficients, the probability distribution of the plurality of compositions associated with the generalized rectangle; and determine the bit sequence length K based at least in part on the probability distribution associated with the generalized rectangle.

30. The apparatus of claim 28, wherein the one or more processors are further configured to:

determine an approximating function based at least in part on the set of geometry-specific parameters associated with the orthosimplex;

determine an approximating measure using the approximating function;

determine, based at least in part on the approximating function and the approximating measure, approximate multinomial coefficients corresponding to the plurality of compositions associated with the orthosimplex;

determine the probability distribution of the plurality of compositions associated with the orthosimplex based at least in part on the approximate multinomial coefficients; and determine the bit sequence length K based at least in part on the probability distribution.

* * * * *